US010863370B2

(12) United States Patent
Barsoum et al.

(10) Patent No.: US 10,863,370 B2
(45) Date of Patent: *Dec. 8, 2020

(54) TRANSMITTERS INCORPORATING UNIFORM AND NON-UNIFORM CONSTELLATIONS AND ADAPTIVE SELECTION

(71) Applicant: Constellation Designs, LLC, Anaheim, CA (US)

(72) Inventors: Maged F. Barsoum, San Jose, CA (US); Christopher R. Jones, Pacific Palisades, CA (US)

(73) Assignee: Constellation Designs, LLC, Anaheim, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/729,226

(22) Filed: Dec. 27, 2019

(65) Prior Publication Data

US 2020/0145850 A1    May 7, 2020

Related U.S. Application Data

(63) Continuation of application No. 16/206,991, filed on Nov. 30, 2018, now Pat. No. 10,567,980, which is a (Continued)

(51) Int. Cl.
*H04L 5/12* (2006.01)
*H04W 24/02* (2009.01)
(Continued)

(52) U.S. Cl.
CPC ......... *H04W 24/02* (2013.01); *H03M 13/255* (2013.01); *H03M 13/6325* (2013.01);
(Continued)

(58) Field of Classification Search
CPC ...... H04W 24/02; H04B 15/00; H04L 1/0003; H04L 1/0009; H04L 27/3405;
(Continued)

(56) References Cited

U.S. PATENT DOCUMENTS 5,289,501 A    2/1994  Seshadri et al.
5,862,179 A    1/1999  Goldstein et al.
(Continued)

FOREIGN PATENT DOCUMENTS

CA    2695799 C    10/2016
CN    100471191 C    3/2009
(Continued)

OTHER PUBLICATIONS

Wang et al, "Shaping Gain for AWGN Channel by Non-Uniform Constellation in LDPC-Coded System", 11th IEEE Singapore International Conference on Communication Systems, 2008, ICCS 2008, Conference: Nov. 19-21, 2008, pp. 1302-1306.
(Continued)

*Primary Examiner* — Tesfaldet Bocure
(74) *Attorney, Agent, or Firm* — KPPB LLP

(57) ABSTRACT

Communication systems are described that use unequally spaced constellations that have increased capacity compared to conventional constellations operating within a similar SNR band. One embodiment is a digital communications system including a transmitter transmitting signals via a communication channel, the transmitter including a coder capable of receiving user bits and outputting encoded bits at a rate, a mapper capable of mapping encoded bits to symbols in a constellation, and a modulator capable of generating a modulated signal for transmission via the communication channel using symbols generated by the mapper, wherein the constellation is unequally spaced and characterizable by assignment of locations and labels of constellation points to
(Continued)

maximize parallel decode capacity of the constellation at a given signal-to-noise ratio so that the constellation provides a given capacity at a reduced signal-to-noise ratio compared to a uniform constellation that maximizes the minimum distance between constellation points of the uniform constellation.

134 Claims, 43 Drawing Sheets

Related U.S. Application Data continuation of application No. 15/682,475, filed on Aug. 21, 2017, now Pat. No. 10,149,179, which is a continuation of application No. 15/200,800, filed on Jul. 1, 2016, now Pat. No. 9,743,292, which is a continuation of application No. 14/491,731, filed on Sep. 19, 2014, now Pat. No. 9,385,832, which is a continuation of application No. 13/618,630, filed on Sep. 14, 2012, now Pat. No. 8,842,761, which is a continuation of application No. 13/118,921, filed on May 31, 2011, now Pat. No. 8,270,511, which is a continuation of application No. 12/156,989, filed on Jun. 5, 2008, now Pat. No. 7,978,777.

(60) Provisional application No. 60/933,319, filed on Jun. 5, 2007.

(51) Int. Cl.
   *H04L 1/00* (2006.01)
   *H04L 27/34* (2006.01)
   *H04B 17/336* (2015.01)
   *H03M 13/25* (2006.01)
   *H03M 13/00* (2006.01)
   *H04L 27/38* (2006.01)
   *H04B 15/00* (2006.01)
   *H04L 27/36* (2006.01)

(52) U.S. Cl.
   CPC ........... *H04B 15/00* (2013.01); *H04B 17/336* (2015.01); *H04L 1/0003* (2013.01); *H04L 1/0009* (2013.01); *H04L 27/3405* (2013.01); *H04L 27/3483* (2013.01); *H04L 27/3809* (2013.01)

(58) Field of Classification Search
   CPC .............. H04L 27/3483; H04L 1/0071; H03M 13/255; H03M 13/1165
   USPC ................ 375/261, 295, 316, 329, 332, 358
   See application file for complete search history.

(56) References Cited

U.S. PATENT DOCUMENTS

| | | | |
|---|---|---|---|
| 6,084,915 A | 7/2000 | Williams et al. | |
| 6,115,415 A | 9/2000 | Goldstein et al. | |
| 6,157,678 A | 12/2000 | Wei | |
| 6,603,801 B1 | 8/2003 | Andren et al. | |
| 6,606,355 B1 | 8/2003 | Wei | |
| 6,611,554 B1 | 8/2003 | Chouly et al. | |
| 6,665,831 B1 | 12/2003 | Yoshida et al. | |
| 7,123,663 B2 | 10/2006 | De et al. | |
| 7,212,582 B2 | 5/2007 | Zhang et al. | |
| 7,215,713 B2 * | 5/2007 | Walker | H04B 7/18513 |
| | | | 267/246 |
| 7,245,666 B1 | 7/2007 | Gardner et al. | |
| 7,359,426 B2 | 4/2008 | Ojard | |
| 7,376,203 B2 | 5/2008 | Brunel et al. | |
| 7,539,261 B2 | 5/2009 | Lu et al. | |
| 7,599,420 B2 | 10/2009 | Forenza et al. | |
| 7,620,067 B2 | 11/2009 | Niu et al. | |
| 7,660,368 B2 * | 2/2010 | Ling | H04L 1/0045 |
| | | | 341/143 |
| 7,907,641 B2 | 3/2011 | Sun et al. | |
| 7,908,541 B2 | 3/2011 | Kyung et al. | |
| 7,978,777 B2 | 7/2011 | Barsoum et al. | |
| 8,031,793 B2 | 10/2011 | Ionescu et al. | |
| 8,102,947 B2 | 1/2012 | Eroz et al. | |
| 8,111,770 B1 | 2/2012 | Moon et al. | |
| 8,160,121 B2 | 4/2012 | Forenza et al. | |
| 8,171,383 B2 | 5/2012 | Landau et al. | |
| 8,199,847 B2 | 6/2012 | Lee et al. | |
| 8,265,175 B2 | 9/2012 | Barsoum et al. | |
| 8,270,511 B2 | 9/2012 | Barsoum et al. | |
| 8,428,162 B2 | 4/2013 | Forenza et al. | |
| 8,483,145 B2 | 7/2013 | Astely | |
| 8,675,754 B1 * | 3/2014 | Yonge, III | H04L 5/12 |
| | | | 375/261 |
| 8,842,761 B2 | 9/2014 | Barsoum et al. | |
| 9,191,148 B2 | 11/2015 | Barsoum | |
| 9,385,832 B2 | 7/2016 | Barsoum et al. | |
| 9,743,290 B2 | 8/2017 | Barsoum et al. | |
| 9,743,292 B2 | 8/2017 | Barsoum et al. | |
| 9,887,870 B2 | 2/2018 | Barsoum et al. | |
| 9,967,127 B1 | 5/2018 | Sun et al. | |
| 10,149,179 B2 | 12/2018 | Barsoum et al. | |
| 10,524,139 B2 | 12/2019 | Barsoum et al. | |
| 10,530,629 B2 | 1/2020 | Barsoum et al. | |
| 2002/0044597 A1 | 4/2002 | Shively | |
| 2002/0106010 A1 | 8/2002 | Jones | |
| 2003/0231715 A1 | 12/2003 | Shoemake | |
| 2004/0022179 A1 | 2/2004 | Giannakis et al. | |
| 2004/0066738 A1 | 4/2004 | Stopler | |
| 2004/0161050 A1 | 8/2004 | Larsson et al. | |
| 2004/0258177 A1 | 12/2004 | Shen et al. | |
| 2005/0089068 A1 | 4/2005 | Sun et al. | |
| 2005/0111581 A1 * | 5/2005 | Walker | H04B 7/18513 |
| | | | 375/308 |
| 2005/0141627 A1 | 6/2005 | Walker et al. | |
| 2005/0143004 A1 | 6/2005 | Dibiaso et al. | |
| 2005/0169400 A1 | 8/2005 | Chouly et al. | |
| 2005/0180531 A1 | 8/2005 | Wellig et al. | |
| 2005/0207507 A1 | 9/2005 | Mitsutani | |
| 2005/0268206 A1 * | 12/2005 | Tran | H03M 13/1117 |
| | | | 714/758 |
| 2005/0276343 A1 | 12/2005 | Jones | |
| 2005/0286409 A1 | 12/2005 | Yoon et al. | |
| 2006/0045169 A1 | 3/2006 | Kim | |
| 2006/0085720 A1 * | 4/2006 | Tran | H03M 13/1117 |
| | | | 714/758 |
| 2006/0144843 A1 | 7/2006 | Vandal et al. | |
| 2006/0155843 A1 | 7/2006 | Glass et al. | |
| 2006/0165190 A1 * | 7/2006 | Tamaki | H04L 1/0003 |
| | | | 375/262 |
| 2006/0276145 A1 | 12/2006 | Walker et al. | |
| 2007/0022179 A1 | 1/2007 | Kim et al. | |
| 2007/0025283 A1 | 2/2007 | Koslov et al. | |
| 2007/0054614 A1 | 3/2007 | Walker et al. | |
| 2007/0104293 A1 | 5/2007 | Hiatt, Jr. et al. | |
| 2007/0116161 A1 | 5/2007 | Tokoro et al. | |
| 2007/0147530 A1 | 6/2007 | Li | |
| 2007/0195868 A1 | 8/2007 | Walker et al. | |
| 2007/0211822 A1 * | 9/2007 | Olesen | H04B 7/0697 |
| | | | 375/299 |
| 2007/0280147 A1 | 12/2007 | Catreux-erceg et al. | |
| 2008/0200114 A1 | 8/2008 | Eberlein et al. | |
| 2009/0097582 A1 | 4/2009 | Barsoum et al. | |
| 2009/0161786 A1 | 6/2009 | Nakagawa et al. | |
| 2010/0077275 A1 | 3/2010 | Yu et al. | |
| 2010/0195743 A1 | 8/2010 | Barsoum et al. | |
| 2010/0303174 A1 | 12/2010 | Oh et al. | |
| 2011/0090948 A1 | 4/2011 | Zhou et al. | |
| 2011/0228869 A1 | 9/2011 | Barsoum et al. | |
| 2011/0305300 A1 | 12/2011 | Ko | |
| 2012/0147983 A1 | 6/2012 | Barsoum et al. | |
| 2013/0083862 A1 | 4/2013 | Barsoum et al. | |
| 2013/0170571 A1 | 7/2013 | Barsoum et al. | |
| 2014/0314177 A1 | 10/2014 | Choi et al. | |

(56) References Cited

U.S. PATENT DOCUMENTS

| | | |
|---|---|---|
| 2015/0236812 A1 | 8/2015 | Barsoum et al. |
| 2016/0204967 A1 | 7/2016 | Choi et al. |
| 2016/0309342 A1 | 10/2016 | Barsoum et al. |
| 2016/0316382 A1 | 10/2016 | Barsoum et al. |
| 2017/0374564 A1 | 12/2017 | Barsoum et al. |
| 2017/0374565 A1 | 12/2017 | Barsoum et al. |
| 2018/0102933 A1 | 4/2018 | Schneider et al. |
| 2018/0191548 A1 | 7/2018 | Barsoum et al. |
| 2019/0116509 A1 | 4/2019 | Barsoum et al. |
| 2019/0342772 A1 | 11/2019 | Barsoum et al. |

FOREIGN PATENT DOCUMENTS

| | | |
|---|---|---|
| CN | 100584011 C | 1/2010 |
| CN | 100589469 C | 2/2010 |
| CN | 101133558 B | 10/2010 |
| CN | 101322322 B | 11/2013 |
| CN | 102017445 B | 5/2014 |
| CN | 103501193 B | 4/2017 |
| EP | 1578021 A1 | 9/2005 |
| EP | 1971098 A1 | 9/2008 |
| EP | 1670168 B1 | 7/2010 |
| EP | 2153561 B1 | 1/2019 |
| EP | 3518485 A1 | 7/2019 |
| ES | 2712914 T3 | 5/2019 |
| HK | 40011480 A | 7/2020 |
| JP | 09130438 A | 5/1997 |
| JP | 2003229835 | 8/2003 |
| JP | 2005269258 A | 9/2005 |
| JP | 4554610 B2 | 7/2010 |
| JP | 2010538502 A | 12/2010 |
| JP | 4920977 B2 | 2/2012 |
| JP | 5129323 B2 | 11/2012 |
| JP | 5513377 B2 | 6/2014 |
| KR | 100630177 B1 | 9/2006 |
| KR | 100634250 B1 | 10/2006 |
| KR | 100723018 B1 | 5/2007 |
| KR | 101282522 B1 | 7/2013 |
| KR | 101346423 B1 | 1/2014 |
| KR | 101507782 B1 | 3/2015 |
| RU | 2428796 C2 | 9/2011 |
| RU | 2491742 C2 | 8/2013 |
| TR | 201905158 T4 | 5/2019 |
| WO | 9832257 | 7/1998 |
| WO | 2007074524 A1 | 7/2007 |
| WO | 2008151308 A1 | 12/2008 |
| WO | 2010078472 A1 | 7/2010 |

OTHER PUBLICATIONS

Wu et al., "Non-uniform and Large Distance Constellation Design for Hierarchical Modulation", 2010 IEEE International Conference on Communications (ICC), Conference: May 23-27, 2010, 5 pgs.

Xie et al., "Bit-Interleaved LDPC-Coded Modulation with Iterative Demapping and Decoding", IEEE 69th Vehicular Technology Conference, Barcelona, Spain, Date of Conference Apr. 26-29, 2009, 5 pgs.

Xie et al., "On the Channel Capacity and Iterative Demapping of Generalized 4PAM over AWGN Channel", 11th IEEE Singapore International Conference on Communication Systems, 2008. ICCS 2008. Dec. 2008, pp. 860-863.

Yang et al., "A Novel BICM-ID System Approaching Shannon-Limit at High Spectrum Efficiency", IEICE Trans. Commun., vol. E94-B, No. 3, Mar. 2011, pp. 793-795.

Yuan et al., "Robust Hierarchical Broadcasting for AWGN and Flat Rayleigh Fading Channels using Multilevel Codes", Proceedings of IEEE Fifth International Symposium on Communication Theory & Applications, ISCTA'99, Ambleside, UK, 1999, S. 3 pgs.

Zesong et al., "Shaping Gain by Non-Uniform QAM Constellation with Binary Turbo Coded Modulation", Personal, Indoor and Mobile Radio Communications, IEEE, vol. 2. pp. 1863-1867, Sep. 7, 2003.

Zhang et al., "A New Constellation Shaping Method and Its Performance Evaluation in BICM-ID", IEEE 70th Vehicular Technology Conference Fall (VTC 2009-Fall). Conference: Sep. 20-23, 2009, 5 pgs.

Zheng et al., "Shaping Gain of LDPC Coded-QAM Transmitting Systems with Non-Uniform Constellation", IEEE, pp. 6-9, 2007.

Fragouli et al., "Turbo Codes with Non-Uniform Constellations", IEEE Int. Conf. Commun., Jun. 2001, pp. 70-73.

Kschischang et al., "Optimal Nonuniform Signaling for Gaussian Channels", IEEE, pp. 913-929, 1993.

Goff et al., "Channel capacity of bit-interleaved coded modulation schemes using 8-ary signal constellations", Electronics Letters, vol. 38, Issue 4, Feb. 14, 2002, pp. 187-188.

Goff et al., "Signal Constellations for Bit-Interleaved Coded Modulation", IEEE Transactions on Information Theory, vol. 49, Issue 1, Jan. 2003, pp. 307-313.

Hamkins et al., "Asymptotically Dense Spherical Codes—Part I: Wrapped Spherical Codes", IEEE Transactions on Information Theory, Nov. 1997, vol. 43, No. 6, pp. 1774-1785.

Hamkins et al., "Asymptotically Dense Spherical Codes—Part II: Laminated Spherical Codes", IEEE Transactions on Information Theory, Nov. 1997, vol. 43, No. 6, pp. 1786-1798.

Hossain et al., "BICM Transmission using Non-Uniform QAM Constellations: Performance Analysis and Design", IEEE International Conference on Communications (ICC), 2010, Conference: May 23-27, 2010, 7 pgs.

Hossain et al., "Constellation and Interleaver Design for BICM", Global Telecommunications Conference (GLOBECOM 2011), 2011 IEEE, Conference: Dec. 5-9, 2011, 7 pgs.

Hossain et al., "Towards Fully Optimized BICM Transceivers", Arxiv.org, Dec. 8, 2010, 31 pgs.

Isaka et al., "Error performance analysis of multilevel coded asymmetric 8-PSK modulation with multistage decoding and unequal error protection", 1998 IEEE International Symposium on Cambridge, MA, USA Aug. 16-21, Aug. 16, 1998 p. 210.

Jo et al., "An Advanced Hierarchical Modulation with Rotated Constellation", The 12th International Conference on Advanced Communication Technology (ICACT), 2010, Conference: Feb. 7-10, 2010, pp. 515-518.

Kayhan et al., "Joint Signal-Labeling Optimization for Pragmatic Capacity under Peak-Power Constraint", Global Telecommunications Conference (GLOBECOM 2010), 2010 IEEE, Conference Dec. 6-10, 2010, Miami, FL, USA, 6 pgs.

Khandani et al., "Application of Shaping Technique to Multi-level Turbo-coded Modulation", 2002, 5 pgs.

Khandani et al., "Application of Shaping Technique to Multi-level Turbo-coded Modulation", University of Waterloo, Department of Electrical and Computer Engineering, Waterloo, Ontario, Canada, Technical Report UW-E&CE#02-07, May 30, 2002, 24 pgs.

Khoo et al., "Bit Interleaved Coded Modulation with Iterative Decoding Using Constellation Shaping", IEEE Transactions on Communications, Oct. 2006, 5 pgs.

Lee et al., "Hierarchical Constellation Based Adaptive Relay Scheme in Multi-Hop Networks", IEEE Communication Letters, vol. 11, No. 3, Mar. 2007, pp. 225-227.

Liolis et al., "Amplitude Phase Shift Keying Constellation Design and its Applications to Satellite Digital Video Broadcasting", Retrieved from: http://www.dtic.upf.edu/~aguillen/home_upf/Publications_files/apsk_chapter.pdf, Jun. 1, 2009, 28 pgs.

Liu et al., "APSK Constellation with Gray Mapping", IEEE Communications Letters, vol. 15, Issue 12, Dec. 2011, pp. 127-1273, Date of Publication Oct. 31, 2011.

Loghin et al., "Non-Uniform Constellations for ATSC 3.0", IEEE Transactions on Broadcasting, vol. 62, No. 1, Mar. 2016, pp. 197-203.

Long Duan et al., "Approaching the AWGN Channel Capacity without Active Shaping", Proceedings of the International Symposium on Information Theory, pp. 374, 1997.

Ma et al., "Coded Modulation Using Superimposed Binary Codes", IEEE Transactions of Information Theory, vol. 50, No. 12, Dec. 2004, pp. 3331-3343.

(56) References Cited

OTHER PUBLICATIONS

Makowski, "On the Optimality of Uniform Pulse Amplitude Modulation", IEEE Transactions on information Theory, Dec. 2006, vol. 52, No. 12, pp. 5546-5549.
Martinez et al., "Bit-Interleaved Coded Modulation in the Wideband Regime", Retrieved from: https://arxiv.org/pdf/0710.4046.pdf, Draft, Oct. 22, 2007, 23 pgs.
Martinez et al., "Coding and Modulation for the Additive Exponential Noise Channel", IEEE International Symposium on Information Theory, 2008. ISIT 2008, Conference: Jul. 6-11, 2008, 5 pgs.
Meric et al., "Generic Approach for Hierarchical Modulation Performance Analysis: Application to DVB-SH and DVB-S2", Retrieved from: https://arxiv.org/abs/1103.1742, Submitted Mar. 9, 2011, Draft Mar. 10, 2011, 17 pgs.
Mheich et al., "Constellation Shaping for Broadcast Channels in Practical Situations", 19th European Signal Processing Conference (EUSIPCO 2011), Barcelona, Spain, Aug. 29-Sep. 2, 2011, pp. 96-100.
Milovanovic et al., "Simple Optimization Method of One-Dimensional M-PAM Constellations for the AWGN Channels", 4th International Conference on Telecommunications in Modern Satellite, Cable and Broadcasting Services, Oct. 13-15, 1999, 4 pgs.
Moore et al., "Pairwise optimization of modulation constellations for non-uniform sources Modulation", Can. J. Elect. Computer Eng. vol. 34, pp. 167-177, 2009.
Muhammad, Nabil Sven, "Coding and Modulation for Spectral Efficient Transmission", University of Stuttgart. Aug. 25, 2010 (http://dx.doi.org/10.18419/opus-2676).
Muhammad et al., "Joint Optimization of Signal Constellation and Bit Labeling for Bit-Interleaved Coded Modulation with Iterative Decoding", IEEE Communications Letters, Sep. 2005, vol. 9, No. 9, pp. 775-777.
Ngo et al., "A New Iterative Decoder for Turbo Codes on the Nonlinear Channel with Non-uniform 16QAM Modulation", Turbo Coding 2006, Apr. 3-7, 2006, Munich, 7 pgs.
Ngo et al., "Performance of non-uniform 16QAM modulation over linear and nonlinear channels", Electronics Letters, vol. 42, Issue 9, Apr. 27, 2006, 2 pgs.
Otnes et al., "Adaptive Data Rate using ARQ and Nonuniform Constellations", Vehicular Technology Conference pp. 1211-1215, 2001.
Raphaeli et al., "An Improved Pragmatic Turbo Encoding Scheme for High Spectral Efficiency Using Constellation Shaping", IEEE International Conference on Communications, ICC 2003, Conference May 11-15, 2003, Anchorage, AK, USA, 6 pgs.
Raphaeli et al., "Constellation Shaping for Pragmatic Turbo-Coded Modulation with High Spectral Efficiency", IEEE Transactions on Communications, Mar. 2004, vol. 52, No. 3, pp. 341-345.
Ruotsalainen et al., "On the construction of the higher dimensional constellations", ISIT 2000, Lausanne, Switzerland, Jun. 30-Jul. 5, 2002, p. 490.
Sawaya, "Performance optimization for capacity-approaching channel coding schemes", XP055604929 Ph.D. report, ENST Paris, France Mar. 31, 2002.
Sawaya et al., "Multilevel coded modulations based on asymmetric constellations", Proceedings of the 2001 IEEE International Symposium on Information Theory New York, NY: IEEE, US, Jun. 24, 2001 pp. 281-281.
Schreckenach et al., "Signal Shaping Using Non-Unique Symbol Mappings", Proceedings of the 43rd Annual Allerton Conference on Communication, Control and Computing, Sep. 2005, 10 pgs.
Shannon et al., "A Mathematical Theory of Communication", The Bell System Technical Journal, vol. 27, Jul., Oct. 1948, 379-423, 623-656.
Shen et al., "On the Design of Modern Multilevel Coded Modulation for Unequal Error Protection", IEEE International Conference on Communications, 2008. ICC '08., Conference: May 19-23, 2008, 6 pgs.
Sommer et al., "Signal Shaping by Non-Uniform QAM for AWGN Channels and Applications Using Turbo Coding", ITG Conference on Source and Channel Coding, Jan. 2000, pp. 81-86.
Souto et al., "Iterative Detection and Channel Estimation for WCDMA Systems Employing Non-Uniform QAM Constellations", IST Mobile and Wireless Communications Summit, Jun. 2006, 6 pgs.
Souto et al., "Iterative Turbo Multipath Interference Cancellation for WCDMA System with Non-Uniform Modulation", IEEE, 2005, 5 pgs.
Souto et al., "Non-Uniform Constellations for Broadcasting and Multicasting Services in WCDMA Systems", Retrieved from: http://www.eurasip.org/Proceedings/Ext/IST05/papers/424.pdf, Jun. 19-23, 2005, 5 pgs.
Stierstorfer et al., "Asymptotically Optimal Mappings for BICM with M-PAM and M¬¬2QAM", Retrieved from: http://www.lit.lnt.de/papers/elet_set_part_cst_2009.pdf, Draft, Jul. 13, 2009, 6 pgs.
Stierstorfer et al., "Optimizing BICM with convolutional codes for transmission over the AWGN channel", Int. Zurich Seminar on Communications (IZS), Mar. 3-5, 2010, 5 pgs.
Sun et al., "Approaching Capacity by Equiprobable Signaling on the Gaussian Channel", IEEE Transactions on Information Theory, Sep. 1993, vol. 39, No. 5, pp. 1714-1716.
Theodorakopoulos et al., "Comparison of Uniform and Non-uniform M-QAM Schemes for Mobile Video Applications", Proceedings of the 2005 Systems Communications, 2005, Conference: Aug. 14-17, 2005, 6 pgs.
Tran et al., "Signal Mappings of 8-Ary Constellations for BICM-ID Systems Over a Rayleigh Fading Channel", Canadian Conference on Electrical and Computer Engineering, 2004, pp. 1809-1813.
Ungerboeck et al., "Channel Coding with Multilevel/Phase Signals", IEEE Transactions on Information Theory, Jan. 1982, vol. IT-28, No. 1, pp. 55-67.
Valles et al., "Constellation Design for Improved Iterative LDPC Decoding", Aerospace Conference, 2008 IEEE, Conference: Mar. 1-8, 2008, Big Sky, MT, USA, DOI: 10.1109/AERO.2008.4526371, 7 pgs.
Vitthaladevuni et al., "A Recursive Algorithm for the Exact BER Computation of Generalized Hierarchical QAM Constellations", IEEE Transactions on Information Theory, vol. 49, No. 1, Jan. 14, 2003, pp. 297-307.
Von Deetzen et al., "On Code Design for Unequal Error Protection Multilevel Coding", 7th International ITG Conference on Source and Channel Coding (SCC), 2008, Conference: Jan. 14-16, 2008, 4 pgs.
European Supplementary Search Report for Application No. EP 08795885, International Filing Date Jun. 5, 2008, Search Completed Apr. 1, 2014, 8 pgs.
Extended European Search Report for European Application No. 18212572.4, Search completed May 27, 2019, dated Jun. 6, 2019, 13 Pgs.
International Preliminary Report on Patentability for International Application No. PCT/US/2008/065994, Report Completed Jun. 18, 2009, Report dated Jun. 30, 2009, 4 pgs.
International Preliminary Report on Patentability for International Application No. PCT/US2009/069881, Report dated Jan. 7, 2011, Report dated Jan. 14, 2011, 11 pgs.
International Search Report for International Application No. PCT/US 09/69881, date completed Apr. 12, 2010, dated May 3, 2010, 2 pgs.
International Search Report for International Application No. PCT/US2008/065994, Report completed Oct. 3, 2008, dated Oct. 22, 2008, 2 pgs.
Written Opinion for International Application No. PCT/US2008/065994, completed Oct. 3, 2008, dated Oct. 22, 2008, 5 pgs.
Written Opinion of the International Searching Authority for International Application No. PCT/US 09/69881, date completed Apr. 13, 2010, dated May 3, 2010, 10 pgs.
"ETSI EN 302 307 V1.1.1, European Standard (Telecommunications series), Digital Video Braodcasting (DVB); Second generation framing structure,", channel coding and modulation systems for Broadcasting, Interactive Services, News Gathering and other broad-

(56) References Cited

OTHER PUBLICATIONS band satellite applications, Mar. 2005, Retrieved from: http://www.etsi.org/deliver/etsi_en/302300_302399/302307/01.01.01_60/en_302307v010101p.pdf.

U.S. Appl. No. 13/618,630, "Notice of Allowance Received", dated May 15, 2014, 10 pgs.

Agrell et al., "Gray Coding for Multilevel Constellations in Gaussian Noise", To appear in IEEE Transactions on Information Theory, vol. 53, Issue 1, Jan. 2007, Published Dec. 26, 2006, 14 pgs.

Agrell et al., "On optimal constellations for BICM at low SNR", Information Theory Workshop, 2009. ITW 2009. IEEE, Conference: Oct. 11-16, 2009, 6 pgs.

Agrell et al., "On the BICM Capacity", ArXiv.org, Dec. 8, 2010, 53 pgs.

Agrell et al., "On the Optimality of the Binary Reflected Gray Code", IEEE Transactions on Information Theory, Dec. 2004, vol. 50, No. 12, pp. 3170-3182.

Agrell et al., "Optimal Signal Sets and Binary Labelings for BICM at low SNR", To Appear in IEEE Transactions on Information Theory, vol. 57, Issue 10, Oct. 2011, Published Oct. 6, 2011, 24 pgs.

Alvarado et al., "On the BICM Capacity—Part I: Binary Labelings, Arbitrary Input Distributions, and First-Order Asymptotics", Arxiv.org, Jan. 25, 2010, 45 pgs.

Alvarado et al., "On the capacity of BICM with QAM constellations (Invited Paper)", Retrieved from: http://publications.lib.chalmers.se/records/fulltext/local_92655.pdf, IWCMC'09, Jun. 21-24, 2009, Leipzig, Germany, 8 pgs.

Arafa et al., "Non-Uniform Signal Constellation for Iteratively Decoded Bit Interleaved Coded Modulation (BICM-ID) with Convolution and LDPC Codes", 2011 International Conference on Innovations in Information Technology, Conference: Apr. 25-27, 2011, pp. 23-28.

Barsoum, "On Constellation Design and Iterative Codes", University of California, Los Angeles, Dissertation, 2008, 119 pgs.

Barsoum et al., "Constellation Design via Capacity maximization", IEEE International Symposium on Information Theory, Jun. 24, 2007, pp. 1821-1825.

Batshon et al., "Iterative Polar Quantization-Based Modulation to Achieve Channel Capacity in Ultrahigh-Speed Optical Communication Systems", IEEE Photonics Journal, vol. 2, No. 4, pp. 593-599 Aug. 2010.

Betts et al., "Performance of Nonuniform Constellations on the Gaussian Channel", IEEE Transactions on Information Theory, Sep. 1994, vol. 40, No. 5, pp. 1633-1638.

Chen et al., "Increasing achievable information rates via geometric shaping", arXiv.org, e-Print Archive, Physics, arXiv:1804.08850v1, Apr. 24, 2018.

Choi et al., "Channel Capacity Enhancement Scheme for Satellite Communication System", 2007 6th International Conference on Information, Communications & Signal Processing, Conference: Dec. 10-13, 2007, 4 pgs.

Choi et al., "Satellite-DMB applied to the 8PSK hierarchical modulation", Digest of Technical Papers. International Conference on Consumer Electronics, 2007. ICCE 2007, Conference: Jan. 10-14, 2007, 2 pgs.

Conway et al., "A Fast Encoding Method for Lattice Codes and Quantizers", IEEE Transactions on Information Theory, Nov. 1983, vol. IT-29, No. 6, pp. 820-824.

De Gaudenzi et al., "Performance Analysis of Turbo-Coded APSK Modultions Over Nonlinear Satellite Channels", IEEE Transactions of Wireless Communications, Sep. 2006, vol. 5, No. 5, pp. 2396-2407.

De Gaudenzi et al., "APSK Coded Modulation Schemes for Nonlinear Satellite Channels with High Power and Spectral Efficiency", American Institute of Aeronautics and Astronautics Paper AIAA, 2002-1861, 2002, Retrieved from: http://www.dtic.upf.edu/~aguillen/home_upf/Publications_files/aiaa2001.pdf.

De Gaudenzi et al., "Performance Analysis of Turbo-Coded APSK Modulations over Nonlinear Satellite Channels", IEEE Transactions on Wireless Communications, vol. 5, No. 9, Sep. 6, 2006,1536-1276,12 pgs.

De Gaudenzi et al., "Turbo-Coded APSK Modulations Design for Satellite Broadband Communications", International Journal of Satellite Communications and Networking, vol. 24, No. 4, Jul. 1, 2006, pp. 261-281.

Fabregas et al., "Bit-Interleaved Coded Modulation", Foundations and Trends® in Communications and Information Theory: vol. 5: No. 1-2, pp. 1-153. http://dx.doi.org/10.1561/0100000019 , Published: Nov. 30, 2008.

Fabregas et al., "Bit-Interleaved Coded Modulation with Shaping", IEEE Information Theory Workshop (ITW), 2010, Conference: Aug. 30-Sep. 3, 2010, 6 pgs.

Fabregas et al., "Error Probability of Bit-Interleaved Coded Modulation using the Gaussian Approximation", 2004 Conference on Information Sciences and Systems, Princeton University, Mar. 17-19, 2004, 7 pgs.

Fabregas et al., "Impact of Signal Constellation Expansion on the Achievable Diversity of Pragmatic Bit-interleaved Space-Time Codes", IEEE Transactions on Wireless Communications, vol. 5, Issue 8, Aug. 2006, 15 pgs.

Farid, et al., "Design of Non-Uniform Capacity-Approaching Signaling for Optical Wireless Intensity Channels", IEEE International Symposium on Information Theory, 2008, Conference: Jul. 6-11, 2008, pp. 2327-2331.

Farid et al., "Channel Capacity and Non-Uniform Signalling for Free-Space Optical Intensity Channels", IEEE Journal on Selected Areas in Communications, vol. 27, No. 9, Dec. 2009, 12 pgs.

Forney, et al., "Multidimensional Constellations—Part II: Voronoi Constellations", IEEE Journal on Selected Areas in Communications, Aug. 1989, vol. 7, No. 6, pp. 941-958.

Forney, Jr. et al., "Efficient Modulation for Band-Limited Channels", IEEE Journal on Selected Areas in Communications, Sep. 1984, vol. SAC-2, No. 5, pp. 632-647.

Forney, Jr. et al., "Multidimensional Constellations—Part I: Introduction, Figures of Merit, and Generalized Cross Constellations", IEEE Journal on Selected Areas in Communication, Aug. 1989, vol. 7, No. 6, pp. 877-892.

Foschini et al., "Optimization of Two-Dimensional Signal Constellations in the Presence of Gaussian Noise", IEEE Transactions on Communications, Jan. 1974, vol. Com-22, No. 1, pp. 28-38.

Fragouli et al., "Serially Concatenated Coding for Broadcasting S-UMTS Applications", IEEE 7th Int. Symp. on Spread-Spectrum Tech. & Appl., Prague, Czech Republic, Sep. 2-5, 2002, pp. 697-701.

De Gaudenzi et al., "A New Coded Digital Modulation Scheme for Nonlinear Satellite Channels, with High Power-and Spectral-Efficiency", European Space Agency, STR-242, Jul. 2001, 60 pgs.

De Gaudenzi et al., "Analysis and Design of an All-Digital Demodulator for Trellis Coded 16-QAM Transmission over a Nonlinear Satellite Channel", IEEE Transactions on Communications, vol. 43, Nos. 2, 3, 4, Feb., Mar., Apr. 1995, pp. 659-668.

In re Gilbert P. Hyatt, United States Court of Appeals Federal Circuit, 708 F.2d 712, Jun. 6, 1983.

"Final draft ETSI EN 300 744 V1.4.1", European Standard (Telecommunication series), Digital Video Broadcasting (DVB); Framing structure, channel coding and modulation for digital terrestrial television, European Telecommunications Standards Institute, European Broadcasting Union, Aug. 2000.

"Final draft ETSI EN 300 744 V1.5.1", European Standard (Telecommunication series), Digital Video Broadcasting (DVB); Framing structure, channel coding and modulation for digital terrestrial television, European Telecommunications Standards Institute, European Broadcasting Union, Jun. 2004.

"Frame Structure Channel Coding and Modulation for a Second Generation Digital Terrestrial Television Broadcasting System (DVB-T2)", Digital Video Broadcasting, DVB Document A122, Jun. 2008, 158 pgs.

\* cited by examiner

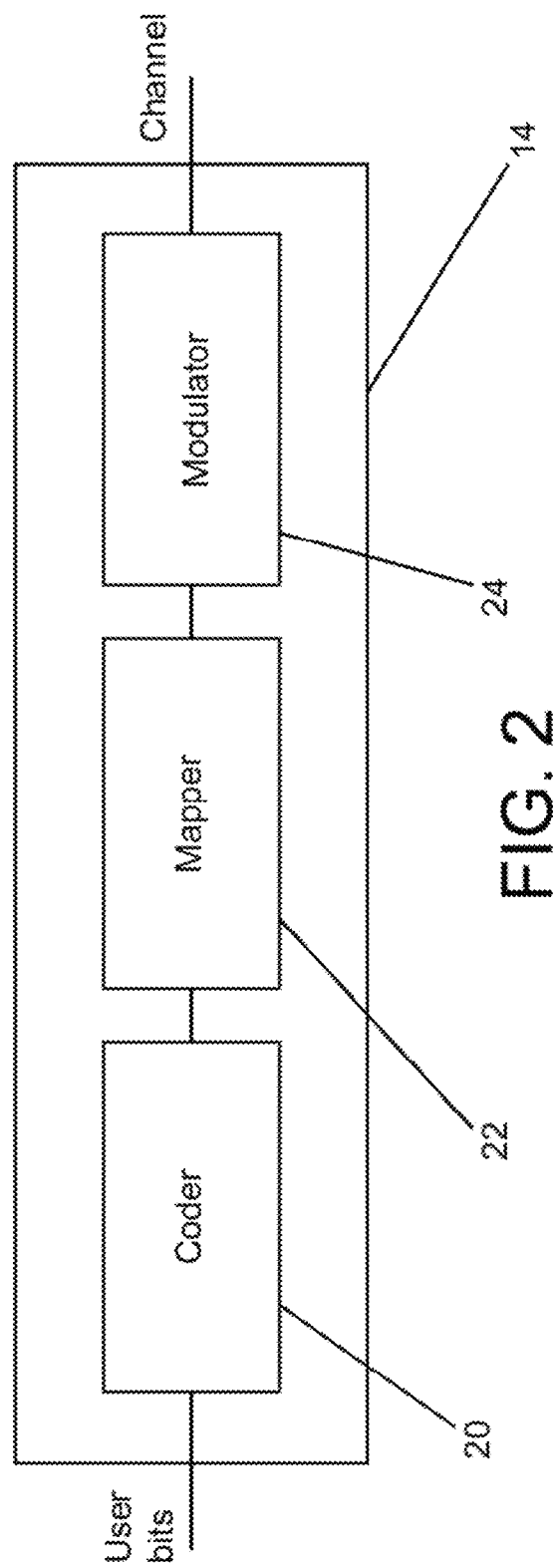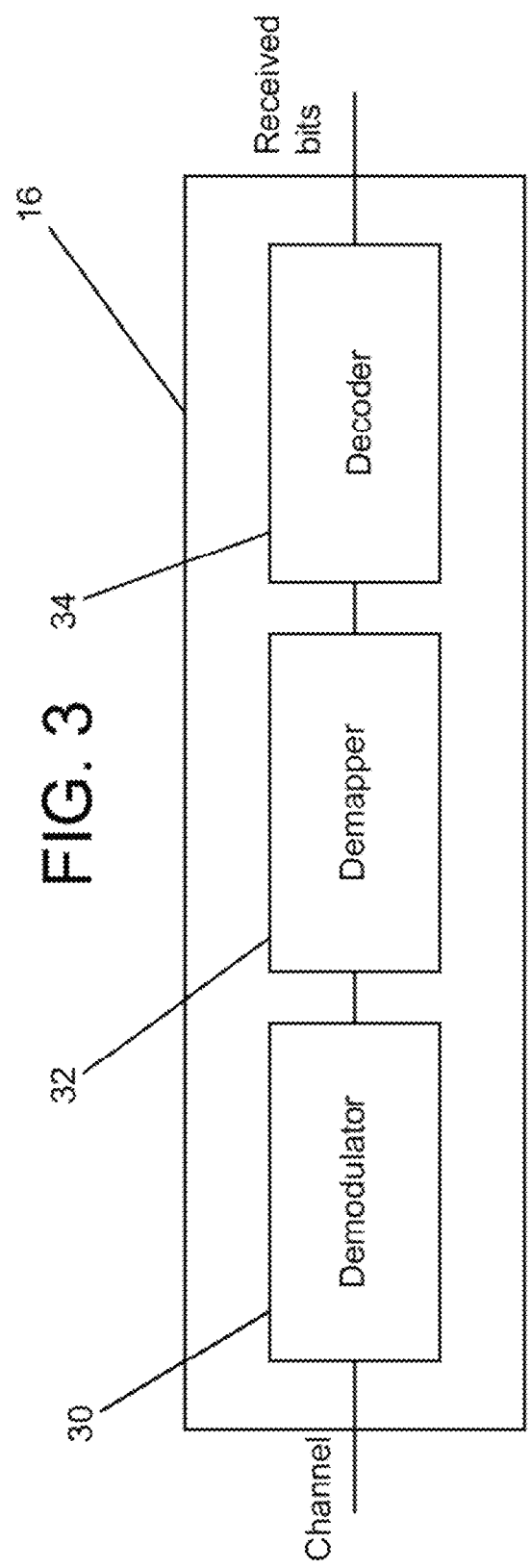

PAM-4 constellations optimized for joint capacity at different rates

| (bps) | 0.50 | 0.75 | 1.00 | 1.25 | 1.50 |
|---|---|---|---|---|---|
| (SNR) | 0.03 | 2.71 | 5.00 | 7.15 | 9.24 |
| $x_0$ | -1.41 | -1.41 | -1.40 | -1.37 | -1.36 |
| $x_1$ | 0.00 | 0.00 | -0.20 | -0.33 | -0.39 |
| $x_2$ | 0.00 | 0.00 | 0.20 | 0.33 | 0.39 |
| $x_3$ | 1.41 | 1.41 | 1.40 | 1.37 | 1.36 |

FIG. 11a

PAM-4 constellations optimized for parallel decoding capacity at different

| (bps)  | 0.50  | 0.75  | 1.00  | 1.25  | 1.50  |
|--------|-------|-------|-------|-------|-------|
| (SNR)  | 0.19  | 3.11  | 5.26  | 7.22  | 9.25  |
| $x_0$  | -1.00 | -1.30 | -1.36 | -1.37 | -1.36 |
| $x_1$  | -1.00 | -0.56 | -0.39 | -0.33 | -0.39 |
| $x_2$  | 1.00  | 1.30  | 1.36  | 0.33  | 1.36  |
| $x_3$  | 1.00  | 0.56  | 0.39  | 1.37  | 0.39  |

FIG. 11b

PAM-8 constellations optimized for joint capacity at different rates

| (bps) | 0.5 | 1.0 | 1.5 | 2.0 | 2.5 |
|---|---|---|---|---|---|
| (SNR) | 0.00 | 4.82 | 8.66 | 12.26 | 15.93 |
| $x_0$ | -1.81 | -1.76 | -1.70 | -1.66 | -1.60 |
| $x_1$ | -0.50 | -0.55 | -0.84 | -0.97 | -1.03 |
| $x_2$ | -0.50 | -0.55 | -0.63 | -0.53 | -0.58 |
| $x_3$ | -0.50 | -0.55 | -0.00 | -0.17 | -0.19 |
| $x_4$ | 0.50 | 0.55 | 0.00 | 0.17 | 0.19 |
| $x_5$ | 0.50 | 0.55 | 0.63 | 0.53 | 0.58 |
| $x_6$ | 0.50 | 0.55 | 0.84 | 0.97 | 1.03 |
| $x_7$ | 1.81 | 1.76 | 1.70 | 1.66 | 1.60 |

FIG. 13a

PAM-8 constellations optimized for parallel decoding capacity at different

| (bps) | 0.5 | 1.0 | 1.5 | 2.0 | 2.5 |
|---|---|---|---|---|---|
| (SNR) | 0.19 | 5.27 | 9.00 | 12.42 | 15.93 |
| $x_0$ | -1.00 | -1.36 | -1.72 | -1.64 | -1.60 |
| $x_1$ | -1.00 | -1.36 | -0.81 | -0.97 | -1.03 |
| $x_2$ | -1.00 | -0.39 | 1.72 | 1.64 | -0.19 |
| $x_3$ | -1.00 | -0.39 | -0.62 | -0.58 | -0.58 |
| $x_4$ | 1.00 | 1.36 | 0.62 | 0.58 | 1.60 |
| $x_5$ | 1.00 | 1.36 | 0.02 | 0.15 | 1.03 |
| $x_6$ | 1.00 | 0.39 | 0.81 | 0.97 | 0.19 |
| $x_7$ | 1.00 | 0.39 | -0.02 | -0.15 | 0.58 |

FIG. 13b

PAM-16 constellations optimized for joint capacity at different rates

| (bps) | 1.5 | 2.0 | 2.5 | 3.0 | 3.5 |
|---|---|---|---|---|---|
| (SNR) | 8.52 | 11.94 | 15.25 | 18.60 | 22.12 |
| $x_0$ | -2.02 | -1.96 | -1.91 | -1.85 | -1.76 |
| $x_1$ | -1.16 | -1.33 | -1.40 | -1.42 | -1.42 |
| $x_2$ | -1.16 | -1.10 | -1.05 | -1.10 | -1.15 |
| $x_3$ | -0.90 | -0.69 | -0.82 | -0.84 | -0.90 |
| $x_4$ | -0.34 | -0.69 | -0.60 | -0.62 | -0.68 |
| $x_5$ | -0.34 | -0.40 | -0.43 | -0.43 | -0.47 |
| $x_6$ | -0.34 | -0.17 | -0.24 | -0.26 | -0.28 |
| $x_7$ | -0.34 | -0.17 | -0.09 | -0.08 | -0.09 |
| $x_8$ | 0.34 | 0.17 | 0.09 | 0.08 | 0.09 |
| $x_9$ | 0.34 | 0.17 | 0.24 | 0.26 | 0.28 |
| $x_{10}$ | 0.34 | 0.40 | 0.43 | 0.43 | 0.47 |
| $x_{11}$ | 0.34 | 0.69 | 0.60 | 0.62 | 0.68 |
| $x_{12}$ | 0.90 | 0.69 | 0.82 | 0.84 | 0.90 |
| $x_{13}$ | 1.16 | 1.10 | 1.05 | 1.10 | 1.15 |
| $x_{14}$ | 1.16 | 1.33 | 1.40 | 1.42 | 1.42 |
| $x_{15}$ | 2.02 | 1.96 | 1.91 | 1.85 | 1.76 |

FIG. 15a

PAM-16 constellations optimized for parallel decoding capacity at different

| (bps) | 1.5 | 2.0 | 2.5 | 3.0 | 3.5 |
|---|---|---|---|---|---|
| (SNR) | 9.00 | 12.25 | 15.42 | 18.72 | 22.13 |
| $x_0$ | -1.72 | -1.98 | -1.89 | -1.84 | -1.75 |
| $x_1$ | -1.72 | -1.29 | -1.36 | -1.42 | -1.42 |
| $x_2$ | -0.81 | 1.94 | 1.89 | 1.84 | 1.75 |
| $x_3$ | -0.81 | -1.17 | -1.14 | -1.11 | -1.15 |
| $x_4$ | 1.72 | -0.38 | -0.35 | -0.40 | -0.47 |
| $x_5$ | 1.72 | -0.65 | -0.70 | -0.65 | -0.68 |
| $x_6$ | -0.62 | -0.38 | -0.34 | -0.29 | -0.28 |
| $x_7$ | -0.62 | -0.68 | -0.76 | -0.83 | -0.90 |
| $x_8$ | 0.62 | 1.09 | 1.13 | 1.11 | 1.15 |
| $x_9$ | 0.62 | 0.76 | 0.76 | 0.84 | 0.90 |
| $x_{10}$ | 0.02 | 1.26 | 1.35 | 1.42 | 1.42 |
| $x_{11}$ | 0.02 | 0.76 | 0.70 | 0.65 | 0.68 |
| $x_{12}$ | 0.81 | 0.06 | 0.00 | 0.05 | 0.09 |
| $x_{13}$ | 0.81 | 0.29 | 0.34 | 0.29 | 0.28 |
| $x_{14}$ | -0.02 | 0.06 | 0.00 | -0.05 | -0.09 |
| $x_{15}$ | -0.02 | 0.29 | 0.35 | 0.40 | 0.47 |

FIG. 15b

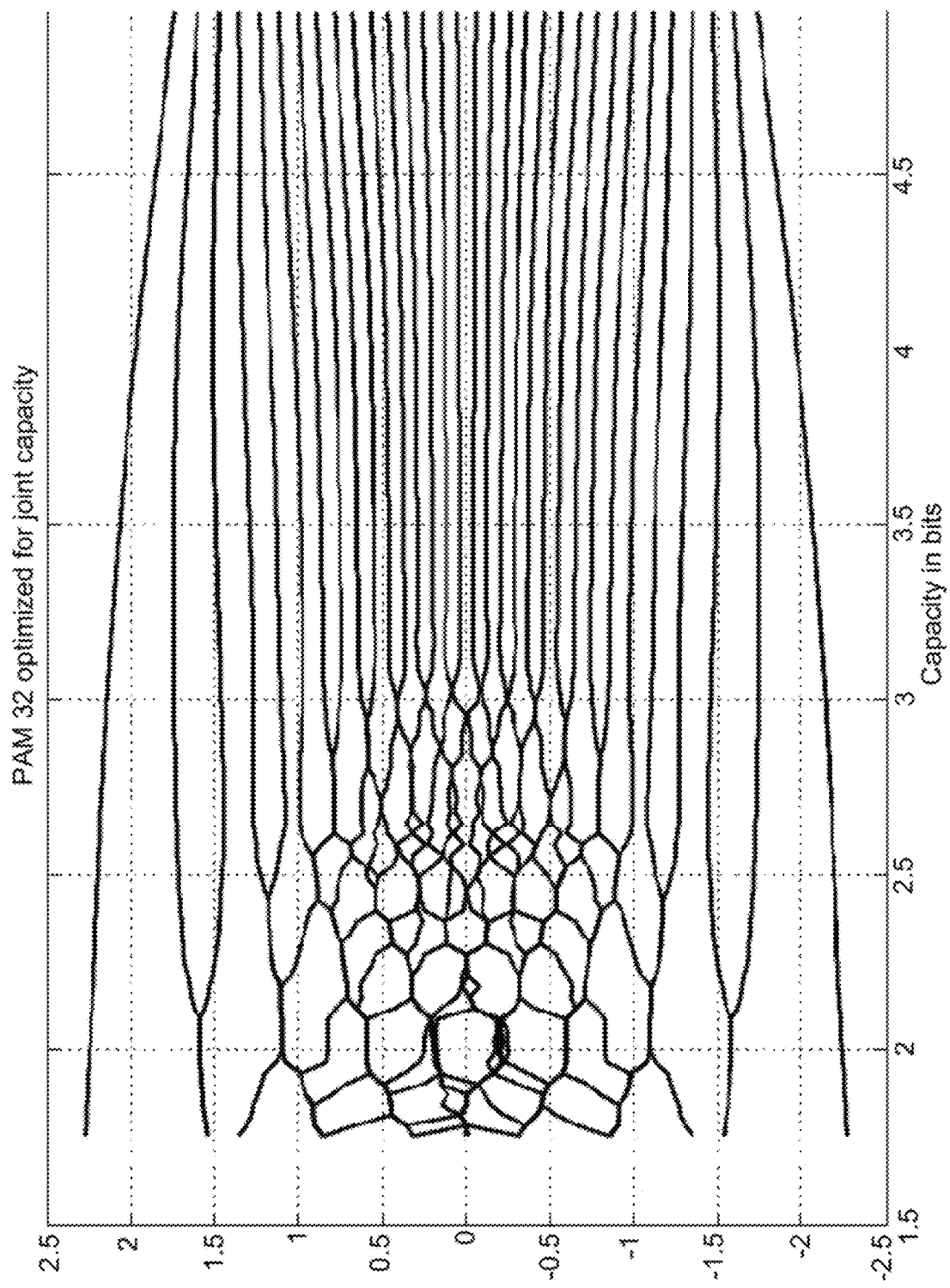

PAM-32 constellations optimized for joint capacity at different rates

| (bps)   | 2.0   | 2.5   | 3.0   | 3.5   | 4.0   | 4.5   |
|---------|-------|-------|-------|-------|-------|-------|
| (SNR)   | 11.83 | 15.05 | 18.23 | 21.42 | 24.69 | 28.19 |
| $x_0$    | -2.25 | -2.19 | -2.14 | -2.07 | -1.97 | -1.85 |
| $x_1$    | -1.58 | -1.71 | -1.74 | -1.74 | -1.72 | -1.66 |
| $x_2$    | -1.58 | -1.46 | -1.46 | -1.49 | -1.51 | -1.50 |
| $x_3$    | -1.10 | -1.23 | -1.27 | -1.29 | -1.33 | -1.35 |
| $x_4$    | -1.10 | -1.13 | -1.11 | -1.13 | -1.17 | -1.21 |
| $x_5$    | -1.10 | -0.90 | -0.98 | -0.99 | -1.02 | -1.08 |
| $x_6$    | -0.83 | -0.90 | -0.85 | -0.87 | -0.90 | -0.95 |
| $x_7$    | -0.60 | -0.75 | -0.75 | -0.76 | -0.78 | -0.84 |
| $x_8$    | -0.60 | -0.58 | -0.63 | -0.65 | -0.67 | -0.73 |
| $x_9$    | -0.60 | -0.58 | -0.57 | -0.56 | -0.57 | -0.62 |
| $x_{10}$ | -0.60 | -0.49 | -0.42 | -0.46 | -0.48 | -0.52 |
| $x_{11}$ | -0.24 | -0.29 | -0.40 | -0.38 | -0.39 | -0.42 |
| $x_{12}$ | -0.21 | -0.28 | -0.24 | -0.29 | -0.30 | -0.32 |
| $x_{13}$ | -0.20 | -0.28 | -0.24 | -0.21 | -0.21 | -0.23 |
| $x_{14}$ | -0.20 | -0.09 | -0.09 | -0.12 | -0.13 | -0.14 |
| $x_{15}$ | -0.16 | -0.00 | -0.07 | -0.04 | -0.04 | -0.05 |
| $x_{16}$ | 0.16  | 0.00  | 0.07  | 0.04  | 0.04  | 0.05  |
| $x_{17}$ | 0.19  | 0.09  | 0.09  | 0.12  | 0.13  | 0.14  |
| $x_{18}$ | 0.21  | 0.28  | 0.24  | 0.21  | 0.21  | 0.23  |
| $x_{19}$ | 0.22  | 0.28  | 0.24  | 0.29  | 0.30  | 0.32  |
| $x_{20}$ | 0.23  | 0.28  | 0.41  | 0.38  | 0.39  | 0.42  |
| $x_{21}$ | 0.60  | 0.49  | 0.42  | 0.46  | 0.48  | 0.52  |
| $x_{22}$ | 0.60  | 0.58  | 0.57  | 0.56  | 0.57  | 0.62  |
| $x_{23}$ | 0.60  | 0.58  | 0.62  | 0.65  | 0.67  | 0.73  |
| $x_{24}$ | 0.60  | 0.75  | 0.75  | 0.76  | 0.78  | 0.84  |
| $x_{25}$ | 0.83  | 0.90  | 0.85  | 0.87  | 0.90  | 0.95  |
| $x_{26}$ | 1.10  | 0.90  | 0.98  | 0.99  | 1.02  | 1.08  |
| $x_{27}$ | 1.10  | 1.13  | 1.11  | 1.13  | 1.17  | 1.21  |
| $x_{28}$ | 1.10  | 1.23  | 1.27  | 1.29  | 1.33  | 1.35  |
| $x_{29}$ | 1.58  | 1.46  | 1.46  | 1.49  | 1.51  | 1.50  |
| $x_{30}$ | 1.58  | 1.71  | 1.74  | 1.74  | 1.72  | 1.66  |
| $x_{31}$ | 2.25  | 2.19  | 2.14  | 2.07  | 1.97  | 1.85  |

FIG. 17a

PAM-32 constellations optimized for parallel decoding capacity at different

| (bps) | 2.0 | 2.5 | 3.0 | 3.5 | 4.0 | 4.5 |
|---|---|---|---|---|---|---|
| (SNR) | 12.21 | 15.27 | 18.42 | 21.52 | 24.79 | 28.20 |
| $x_0$ | -2.25 | -2.16 | -2.14 | -2.05 | -1.97 | -1.85 |
| $x_1$ | -1.52 | -1.64 | -1.75 | -1.74 | -1.72 | -1.66 |
| $x_2$ | 2.30 | 2.19 | -1.31 | 2.05 | 1.97 | -1.35 |
| $x_3$ | -1.39 | -1.48 | -1.43 | -1.49 | -1.51 | -1.49 |
| $x_4$ | 1.56 | 1.54 | 2.14 | -0.96 | -1.03 | 1.85 |
| $x_5$ | -1.31 | -1.23 | 1.75 | -1.15 | -1.17 | 1.66 |
| $x_6$ | 1.67 | 1.65 | -1.07 | -0.91 | -0.90 | -1.21 |
| $x_7$ | -1.31 | -1.24 | -1.04 | -1.28 | -1.33 | -1.08 |
| $x_8$ | -0.48 | -0.43 | -0.36 | -0.17 | -0.17 | -0.42 |
| $x_9$ | -0.72 | -0.76 | -0.36 | -0.34 | -0.31 | -0.52 |
| $x_{10}$ | -0.48 | -0.43 | -0.62 | -0.17 | -0.15 | -0.73 |
| $x_{11}$ | -0.73 | -0.76 | -0.62 | -0.34 | -0.35 | -0.62 |
| $x_{12}$ | -0.48 | -0.42 | -0.29 | -0.71 | -0.67 | -0.33 |
| $x_{13}$ | -0.76 | -0.86 | -0.29 | -0.52 | -0.55 | -0.23 |
| $x_{14}$ | -0.48 | -0.42 | -0.77 | -0.72 | -0.77 | -0.84 |
| $x_{15}$ | -0.76 | -0.86 | -0.77 | -0.52 | -0.48 | -0.96 |
| $x_{16}$ | 0.87 | 0.98 | 1.07 | 1.49 | 1.51 | 1.21 |
| $x_{17}$ | 0.66 | 0.63 | 1.04 | 1.28 | 1.33 | 1.08 |
| $x_{18}$ | 0.87 | 0.98 | 0.77 | 1.74 | 1.72 | 0.84 |
| $x_{19}$ | 0.66 | 0.63 | 0.77 | 1.15 | 1.17 | 0.96 |
| $x_{20}$ | 1.07 | 1.13 | 1.31 | 0.72 | 0.77 | 1.35 |
| $x_{21}$ | 0.66 | 0.59 | 1.43 | 0.91 | 0.90 | 1.49 |
| $x_{22}$ | 1.05 | 1.10 | 0.62 | 0.71 | 0.67 | 0.73 |
| $x_{23}$ | 0.66 | 0.60 | 0.62 | 0.96 | 1.03 | 0.62 |
| $x_{24}$ | -0.01 | -0.08 | 0.02 | 0.00 | 0.01 | 0.05 |
| $x_{25}$ | 0.17 | 0.25 | 0.02 | 0.17 | 0.15 | 0.14 |
| $x_{26}$ | -0.01 | -0.08 | 0.29 | 0.00 | -0.01 | 0.33 |
| $x_{27}$ | 0.17 | 0.25 | 0.29 | 0.17 | 0.17 | 0.23 |
| $x_{28}$ | -0.01 | -0.08 | -0.02 | 0.52 | 0.48 | -0.05 |
| $x_{29}$ | 0.17 | 0.25 | -0.02 | 0.34 | 0.35 | -0.14 |
| $x_{30}$ | -0.01 | -0.08 | 0.36 | 0.52 | 0.55 | 0.42 |
| $x_{31}$ | 0.17 | 0.25 | 0.36 | 0.34 | 0.31 | 0.52 |

FIG. 17b

TRANSMITTERS INCORPORATING UNIFORM AND NON-UNIFORM CONSTELLATIONS AND ADAPTIVE SELECTION

RELATED APPLICATIONS

This application is a continuation of application Ser. No. 16/206,991 filed Nov. 30, 2018 and issued on Feb. 18, 2020 as U.S. Pat. No. 10,567,980, which application is a continuation of application Ser. No. 15/682,475 filed Aug. 21, 2017 and issued on Dec. 4, 2018 as U.S. Pat. No. 10,149,179, which application is a continuation of application Ser. No. 15/200,800 filed Jul. 1, 2016 and issued on Aug. 22, 2017 as U.S. Pat. No. 9,743,292, which application is a continuation of application Ser. No. 14/491,731 filed Sep. 19, 2014 and issued on Jul. 5, 2016 as U.S. Pat. No. 9,385,832, which application is a continuation of application Ser. No. 13/618,630 filed Sep. 14, 2012 and issued on Sep. 23, 2014 as U.S. Pat. No. 8,842,761, which application is a continuation of application Ser. No. 13/118,921 filed May 31, 2011 and issued on Sep. 18, 2012 as U.S. Pat. No. 8,270,511, which application is a continuation of application Ser. No. 12/156,989 filed Jun. 5, 2008 and issued on Jul. 12, 2011 as U.S. Pat. No. 7,978,777, which application claimed priority to U.S. Provisional Application 60/933,319 filed Jun. 5, 2007, the disclosures of which are incorporated herein by reference.

STATEMENT OF FEDERALLY SPONSORED RESEARCH

This invention was made with Government support under contract NAS7-03001 awarded by NASA. The Government has certain rights in this invention.

BACKGROUND

The present invention generally relates to bandwidth and/or power efficient digital transmission systems and more specifically to the use of unequally spaced constellations having increased capacity.

The term "constellation" is used to describe the possible symbols that can be transmitted by a typical digital communication system. A receiver attempts to detect the symbols that were transmitted by mapping a received signal to the constellation. The minimum distance ($d_{min}$) between constellation points is indicative of the capacity of a constellation at high signal-to-noise ratios (SNRs). Therefore, constellations used in many communication systems are designed to maximize $d_{min}$. Increasing the dimensionality of a constellation allows larger minimum distance for constant constellation energy per dimension. Therefore, a number of multi-dimensional constellations with good minimum distance properties have been designed.

Communication systems have a theoretical maximum capacity, which is known as the Shannon limit. Many communication systems attempt to use codes to increase the capacity of a communication channel. Significant coding gains have been achieved using coding techniques such as turbo codes and LDPC codes. The coding gains achievable using any coding technique are limited by the constellation of the communication system. The Shannon limit can be thought of as being based upon a theoretical constellation known as a Gaussian distribution, which is an infinite constellation where symbols at the center of the constellation are transmitted more frequently than symbols at the edge of the constellation. Practical constellations are finite and transmit symbols with equal likelihoods, and therefore have capacities that are less than the Gaussian capacity. The capacity of a constellation is thought to represent a limit on the gains that can be achieved using coding when using that constellation.

Prior attempts have been made to develop unequally spaced constellations. For example, a system has been proposed that uses unequally spaced constellations that are optimized to minimize the error rate of an uncoded system. Another proposed system uses a constellation with equiprobable but unequally spaced symbols in an attempts to mimic a Gaussian distribution.

Other approaches increases the dimensionality of a constellation or select a new symbol to be transmitted taking into consideration previously transmitted symbols. However, these constellation were still designed based on a minimum distance criteria.

SUMMARY OF THE INVENTION

Systems and methods are described for constructing a modulation such that the constrained capacity between a transmitter and a receiver approaches the Gaussian channel capacity limit first described by Shannon [ref Shannon 1948]. Traditional communications systems employ modulations that leave a significant gap to Shannon Gaussian capacity. The modulations of the present invention reduce, and in some cases, nearly eliminate this gap. The invention does not require specially designed coding mechanisms that tend to transmit some points of a modulation more frequently than others but rather provides a method for locating points (in a one or multiple dimensional space) in order to maximize capacity between the input and output of a bit or symbol mapper and demapper respectively. Practical application of the method allows systems to transmit data at a given rate for less power or to transmit data at a higher rate for the same amount of power.

One embodiment of the invention includes a transmitter configured to transmit signals to a receiver via a communication channel, wherein the transmitter, includes a coder configured to receive user bits and output encoded bits at an expanded output encoded bit rate, a mapper configured to map encoded bits to symbols in a symbol constellation, a modulator configured to generate a signal for transmission via the communication channel using symbols generated by the mapper. In addition, the receiver includes a demodulator configured to demodulate the received signal via the communication channel, a demapper configured to estimate likelihoods from the demodulated signal, a decoder that is configured to estimate decoded bits from the likelihoods generated by the demapper. Furthermore, the symbol constellation is a capacity optimized geometrically spaced symbol constellation that provides a given capacity at a reduced signal-to-noise ratio compared to a signal constellation that maximizes $d_{min}$.

A further embodiment of the invention includes encoding the bits of user information using a coding scheme, mapping the encoded bits of user information to a symbol constellation, wherein the symbol constellation is a capacity optimized geometrically spaced symbol constellation that provides a given capacity at a reduced signal-to-noise ratio compared to a signal constellation that maximizes $d_{min}$, modulating the symbols in accordance with a modulation scheme, transmitting the modulated signal via the communication channel, receiving a modulated signal, demodulating the modulated signal in accordance with the modulation scheme, demapping the demodulated signal using the geometrically shaped signal constellation to produce likelihoods, and decoding the likelihoods to obtain an estimate of the decoded bits.

Another embodiment of the invention includes selecting an appropriate constellation size and a desired capacity per dimension, estimating an initial SNR at which the system is likely to operate, and iteratively optimizing the location of the points of the constellation to maximize a capacity measure until a predetermined improvement in the SNR performance of the constellation relative to a constellation that maximizes $d_{min}$ has been achieved.

A still further embodiment of the invention includes selecting an appropriate constellation size and a desired capacity per dimension, estimating an initial SNR at which the system is likely to operate, and iteratively optimizing the location of the points of the constellation to maximize a capacity measure until a predetermined improvement in the SNR performance of the constellation relative to a constellation that maximizes $d_{min}$ has been achieved.

Still another embodiment of the invention includes selecting an appropriate constellation size and a desired SNR, and optimizing the location of the points of the constellation to maximize a capacity measure of the constellation.

A yet further embodiment of the invention includes obtaining a geometrically shaped PAM constellation with a constellation size that is the square root of said given constellation size, where the geometrically shaped PAM constellation has a capacity greater than that of a PAM constellation that maximizes $d_{min}$, creating an orthogonalized PAM constellation using the geometrically shaped PAM constellation, and combining the geometrically shaped PAM constellation and the orthogonalized PAM constellation to produce a geometrically shaped QAM constellation.

Another further embodiment of the invention includes transmitting information over a channel using a geometrically shaped symbol constellation, and modifying the location of points within the geometrically shaped symbol constellation to change the target user data rate.

BRIEF DESCRIPTION OF DRAWINGS

FIG. 2 is a conceptual illustration of a transmitter in accordance with an embodiment of the invention.

FIG. 3 is a conceptual illustration of a receiver in accordance with an embodiment of the invention.

FIGS. 11a and 11b are design tables of PD capacity and joint capacity optimized PAM-4 constellations in accordance with embodiments of the invention.

FIGS. 13a and 13b are design tables of PD capacity and joint capacity optimized PAM-8 constellations in accordance with embodiments of the invention.

FIGS. 15a and 15b are design tables of PD capacity and joint capacity optimized PAM-16 constellations in accordance with embodiments of the invention.

FIGS. 16a-16d are locus plots showing the location of constellation points of a PAM-32 constellation optimized for PD capacity and joint capacity versus user bit rate per dimension and versus SNR.

FIGS. 17a and 17b are design tables of PD capacity and joint capacity optimized PAM-32 constellations in accordance with embodiments of the invention.

DETAILED DESCRIPTION OF THE INVENTION

Turning now to the drawings, communication systems in accordance with embodiments of the invention are described that use signal constellations, which have unequally spaced (i.e. 'geometrically' shaped) points. In several embodiments, the locations of geometrically shaped points are designed to provide a given capacity measure at a reduced signal-to-noise ratio (SNR) compared to the SNR required by a constellation that maximizes $d_{min}$. In many embodiments, the constellations are selected to provide increased capacity at a predetermined range of channel signal-to-noise ratios (SNR). Capacity measures that can be used in the selection of the location of constellation points include, but are not limited to, parallel decode (PD) capacity and joint capacity.

In many embodiments, the communication systems utilize capacity approaching codes including, but not limited to, LDPC and Turbo codes. As is discussed further below, direct optimization of the constellation points of a communication system utilizing a capacity approaching channel code, can yield different constellations depending on the SNR for which they are optimized. Therefore, the same constellation is unlikely to achieve the same coding gains applied across all code rates; that is, the same constellation will not enable the best possible performance across all rates. In many instances, a constellation at one code rate can achieve gains that cannot be achieved at another code rate. Processes for selecting capacity optimized constellations to achieve increased coding gains based upon a specific coding rate in accordance with embodiments of the invention are described below. In a number of embodiments, the communication systems can adapt location of points in a constellation in response to channel conditions, changes in code rate and/or to change the target user data rate.

Communication Systems

Figure 1:
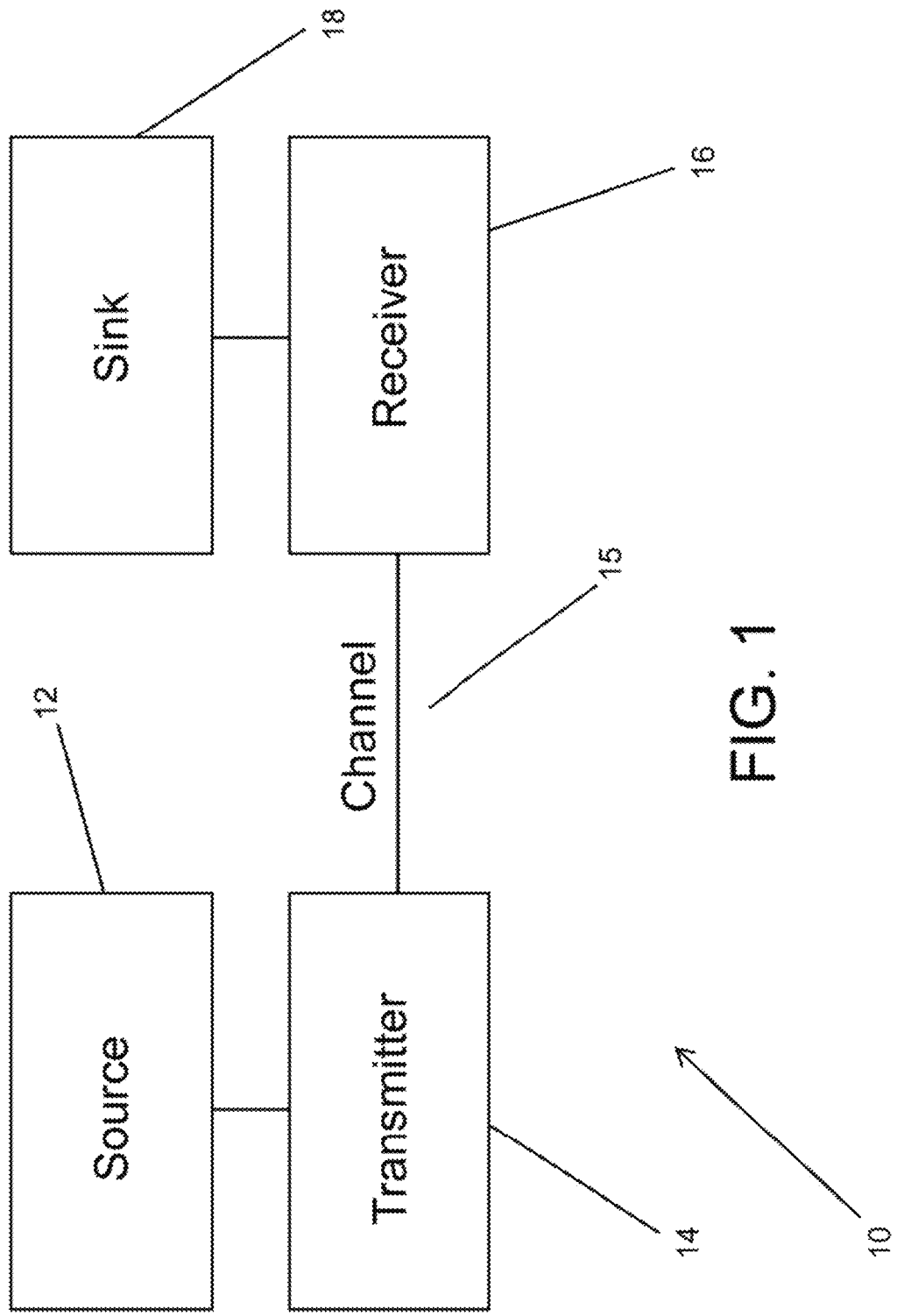
FIG. 1 is a conceptual illustration of a communication system in accordance with an embodiment of the invention.

A communication system in accordance with an embodiment of the invention is shown in FIG. 1. The communication system 10 includes a source 12 that provides user bits to a transmitter 14. The transmitter transmits symbols over a channel to a receiver 16 using a predetermined modulation scheme. The receiver uses knowledge of the modulation scheme, to decode the signal received from the transmitter. The decoded bits are provided to a sink device that is connected to the receiver.

A transmitter in accordance with an embodiment of the invention is shown in FIG. 2. The transmitter 14 includes a coder 20 that receives user bits from a source and encodes the bits in accordance with a predetermined coding scheme. In a number of embodiments, a capacity approaching code such as a turbo code or a LDPC code is used. In other embodiments, other coding schemes can be used to providing a coding gain within the communication system. A mapper 22 is connected to the coder. The mapper maps the bits output by the coder to a symbol within a geometrically distributed signal constellation stored within the mapper. The mapper provides the symbols to a modulator 24, which modulates the symbols for transmission via the channel.

A receiver in accordance with an embodiment of the invention is illustrated in FIG. 3. The receiver 16 includes a demodulator 30 that demodulates a signal received via the channel to obtain symbol or bit likelihoods. The demapper uses knowledge of the geometrically shaped symbol constellation used by the transmitter to determine these likelihoods. The demapper 32 provides the likelihoods to a decoder 34 that decodes the encoded bit stream to provide a sequence of received bits to a sink.

Geometrically Shaped Constellations

Transmitters and receivers in accordance with embodiments of the invention utilize geometrically shaped symbol constellations. In several embodiments, a geometrically shaped symbol constellation is used that optimizes the capacity of the constellation. Various geometrically shaped symbol constellations that can be used in accordance with embodiments of the invention, techniques for deriving geometrically shaped symbol constellations are described below.

Selection of a Geometrically Shaped Constellation

Selection of a geometrically shaped constellation for use in a communication system in accordance with an embodiment of the invention can depend upon a variety of factors including whether the code rate is fixed. In many embodiments, a geometrically shaped constellation is used to replace a conventional constellation (i.e. a constellation maximized for $d_{min}$) in the mapper of transmitters and the demapper of receivers within a communication system. Upgrading a communication system involves selection of a constellation and in many instances the upgrade can be achieved via a simple firmware upgrade. In other embodiments, a geometrically shaped constellation is selected in conjunction with a code rate to meet specific performance requirements, which can for example include such factors as a specified bit rate, a maximum transmit power. Processes for selecting a geometric constellation when upgrading existing communication systems and when designing new communication systems are discussed further below.

Upgrading Existing Communication Systems

A geometrically shaped constellation that provides a capacity, which is greater than the capacity of a constellation maximized for $d_{min}$, can be used in place of a conventional constellation in a communication system in accordance with embodiments of the invention. In many instances, the substitution of the geometrically shaped constellation can be achieved by a firmware or software upgrade of the transmitters and receivers within the communication system. Not all geometrically shaped constellations have greater capacity than that of a constellation maximized for $d_{min}$. One approach to selecting a geometrically shaped constellation having a greater capacity than that of a constellation maximized for $d_{min}$ is to optimize the shape of the constellation with respect to a measure of the capacity of the constellation for a given SNR. Capacity measures that can be used in the optimization process can include, but are not limited to, joint capacity or parallel decoding capacity.

Joint Capacity and Parallel Decoding Capacity

Figure 4A:
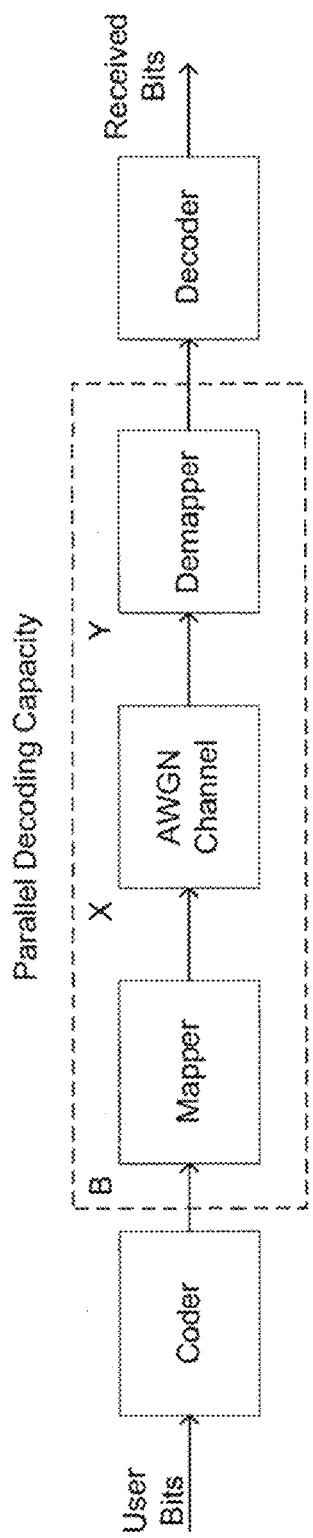
FIG. 4a is a conceptual illustration of the joint capacity of a channel.

A constellation can be parameterized by the total number of constellation points, M, and the number of real dimensions, $N_{dim}$. In systems where there are no belief propagation iterations between the decoder and the constellation demapper, the constellation demapper can be thought of as part of the channel. A diagram conceptually illustrating the portions of a communication system that can be considered part of the channel for the purpose of determining PD capacity is shown in FIG. 4a. The portions of the communication system that are considered part of the channel are indicated by the ghost line 40. The capacity of the channel defined as such is the parallel decoding (PD) capacity, given by:

$$C_{PD} = \sum_{i=0}^{l-1} I(X_i; Y)$$

where $X_i$ is the ith bit of the l-bits transmitted symbol, and Y is the received symbol, and I(A;B) denotes the mutual information between random variables A and B.

Expressed another way, the PD capacity of a channel can be viewed in terms of the mutual information between the output bits of the encoder (such as an LDPC encoder) at the transmitter and the likelihoods computed by the demapper at the receiver. The PD capacity is influenced by both the placement of points within the constellation and by the labeling assignments.

Figure 4B:
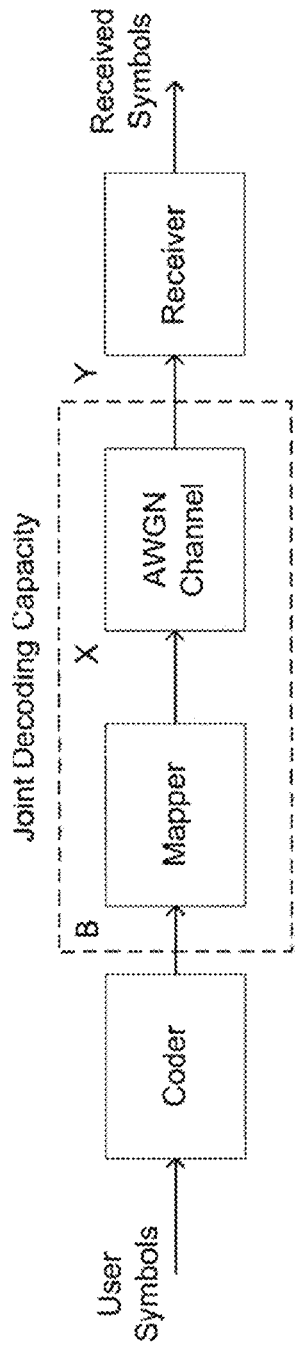
FIG. 4b is a conceptual illustration of the parallel decoding capacity of a channel.

With belief propagation iterations between the demapper and the decoder, the demapper can no longer be viewed as part of the channel, and the joint capacity of the constellation becomes the tightest known bound on the system performance. A diagram conceptually illustrating the portions of a communication system that are considered part of the channel for the purpose of determining the joint capacity of a constellation is shown in FIG. 4b. The portions of the communication system that are considered part of the channel are indicated by the ghost line 42. The joint capacity of the channel is given by:

$$C_{JOINT} = I(X;Y)$$

Joint capacity is a description of the achievable capacity between the input of the mapper on the transmit side of the link and the output of the channel (including for example AWGN and Fading channels). Practical systems must often 'demap' channel observations prior to decoding. In general, the step causes some loss of capacity. In fact it can be proven that $C_G \geq C_{JOINT} \geq C_{PD}$. That is, $C_{JOINT}$ upper bounds the capacity achievable by $C_{PD}$. The methods of the present invention are motivated by considering the fact that practical limits to a given communication system capacity are limited by $C_{JOINT}$ and $C_{PD}$. In several embodiments of the invention, geometrically shaped constellations are selected that maximize these measures.

Selecting a Constellation Having an Optimal Capacity

Figure 5:
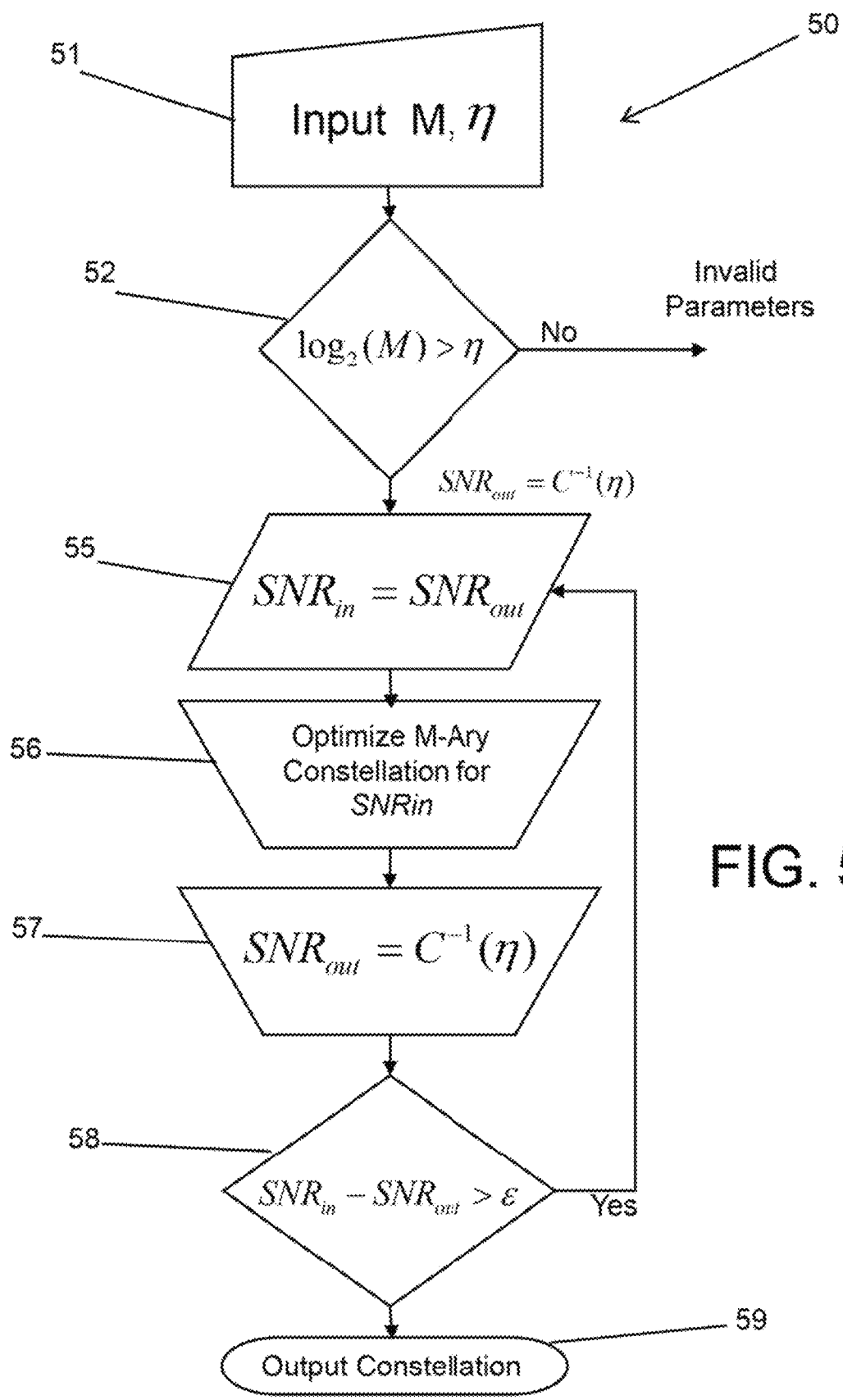
FIG. 5 is a flow chart showing a process for obtaining a constellation optimized for capacity for use in a communication system having a fixed code rate and modulation scheme in accordance with an embodiment of the invention.

Geometrically shaped constellations in accordance with embodiments of the invention can be designed to optimize capacity measures including, but not limited to PD capacity or joint capacity. A process for selecting the points, and potentially the labeling, of a geometrically shaped constellation for use in a communication system having a fixed code rate in accordance with an embodiment of the invention is shown in FIG. 5. The process 50 commences with the selection (52) of an appropriate constellation size M and a desired capacity per dimension $r_i$. In the illustrated embodiment, the process involves a check (52) to ensure that the constellation size can support the desired capacity. In the event that the constellation size could support the desired capacity, then the process iteratively optimizes the M-ary constellation for the specified capacity. Optimizing a constellation for a specified capacity often involves an iterative process, because the optimal constellation depends upon the SNR at which the communication system operates. The SNR for the optimal constellation to give a required capacity is not known a priori. Throughout the description of the present invention SNR is defined as the ratio of the average constellation energy per dimension to the average noise energy per dimension. In most cases the capacity can be set to equal the target user bit rate per symbol per dimension. In some cases adding some implementation margin on top of the target user bit rate could result in a practical system that can provide the required user rate at a lower rate. The margin is code dependent. The following procedure could be used to determine the target capacity that includes some margin on top of the user rate. First, the code (e.g. LDPC or Turbo) can be simulated in conjunction with a conventional equally spaced constellation. Second, from the simulation results the actual SNR of operation at the required error rate can be found. Third, the capacity of the conventional constellation at that SNR can be computed. Finally, a geometrically shaped constellation can be optimized for that capacity.

In the illustrated embodiment, the iterative optimization loop involves selecting an initial estimate of the SNR at which the system is likely to operate (i.e. $SNR_{in}$). In several embodiments the initial estimate is the SNR required using a conventional constellation. In other embodiments, other techniques can be used for selecting the initial SNR. An M-ary constellation is then obtained by optimizing (56) the constellation to maximize a selected capacity measure at the initial $SNR_{in}$ estimate. Various techniques for obtaining an optimized constellation for a given SNR estimate are discussed below.

The SNR at which the optimized M-ary constellation provides the desired capacity per dimension $r_i$ ($SNR_{out}$) is determined (57). A determination (58) is made as to whether the $SNR_{out}$ and $SNR_{in}$ have converged. In the illustrated embodiment convergence is indicated by $SNR_{out}$ equaling $SNR_{in}$. In a number of embodiments, convergence can be determined based upon the difference between $SNR_{out}$ and $SNR_{in}$ being less than a predetermined threshold. When $SNR_{out}$ and $SNR_{in}$ have not converged, the process performs another iteration selecting $SNR_{out}$ as the new $SNR_{in}$ (55). When $SNR_{out}$ and $SNR_{in}$ have converged, the capacity measure of the constellation has been optimized. As is explained in more detail below, capacity optimized constellation at low SNRs are geometrically shaped constellations that can achieve significantly higher performance gains (measured as reduction in minimum required SNR) than constellations that maximize $d_{min}$.

The process illustrated in FIG. 5 can maximize PD capacity or joint capacity of an M-ary constellation for a given SNR. Although the process illustrated in FIG. 5 shows selecting an M-ary constellation optimized for capacity, a similar process could be used that terminates upon generation of an M-ary constellation where the SNR gap to Gaussian capacity at a given capacity is a predetermined margin lower than the SNR gap of a conventional constellation, for example 0.5 db. Alternatively, other processes that identify M-ary constellations having capacity greater than the capacity of a conventional constellation can be used in accordance with embodiments of the invention. A geometrically shaped constellation in accordance with embodiments of the invention can achieve greater capacity than the capacity of a constellation that maximizes $d_{min}$ without having the optimal capacity for the SNR range within which the communication system operates.

We note that constellations designed to maximize joint capacity may also be particularly well suited to codes with symbols over GF(q), or with multi-stage decoding. Conversely constellations optimized for PD capacity could be better suited to the more common case of codes with symbols over GF(2)

Optimizing the Capacity of an M-Ary Constellation at a Given SNR

Processes for obtaining a capacity optimized constellation often involve determining the optimum location for the points of an M-ary constellation at a given SNR. An optimization process, such as the optimization process 56 shown in FIG. 5, typically involves unconstrained or constrained non-linear optimization. Possible objective functions to be maximized are the Joint or PD capacity functions. These functions may be targeted to channels including but not limited to Additive White Gaussian Noise (AWGN) or Rayleigh fading channels. The optimization process gives the location of each constellation point identified by its symbol labeling. In the case where the objective is joint capacity, point bit labelings are irrelevant meaning that changing the bit labelings doesn't change the joint capacity as long as the set of point locations remains unchanged.

The optimization process typically finds the constellation that gives the largest PD capacity or joint capacity at a given SNR. The optimization process itself often involves an iterative numerical process that among other things considers several constellations and selects the constellation that gives the highest capacity at a given SNR. In other embodiments, the constellation that requires the least SNR to give a required PD capacity or joint capacity can also be found. This requires running the optimization process iteratively as shown in FIG. 5.

Optimization constraints on the constellation point locations may include, but are not limited to, lower and upper bounds on point location, peak to average power of the resulting constellation, and zero mean in the resulting constellation. It can be easily shown that a globally optimal constellation will have zero mean (no DC component). Explicit inclusion of a zero mean constraint helps the optimization routine to converge more rapidly. Except for cases where exhaustive search of all combinations of point locations and labelings is possible it will not necessarily always be the case that solutions are provably globally optimal. In cases where exhaustive search is possible, the solution provided by the non-linear optimizer is in fact globally optimal.

The processes described above provide examples of the manner in which a geometrically shaped constellation having an increased capacity relative to a conventional capacity can be obtained for use in a communication system having a fixed code rate and modulation scheme. The actual gains achievable using constellations that are optimized for capacity compared to conventional constellations that maximize $d_{min}$ are considered below.

Gains Achieved by Optimized Geometrically Spaced Constellations

The ultimate theoretical capacity achievable by any communication method is thought to be the Gaussian capacity, $C_G$ which is defined as:

$$C_G = \frac{1}{2}\log_2(1+SNR)$$

Where signal-to-noise (SNR) is the ratio of expected signal power to expected noise power. The gap that remains between the capacity of a constellation and $C_G$ can be considered a measure of the quality of a given constellation design.

Figure 6A:
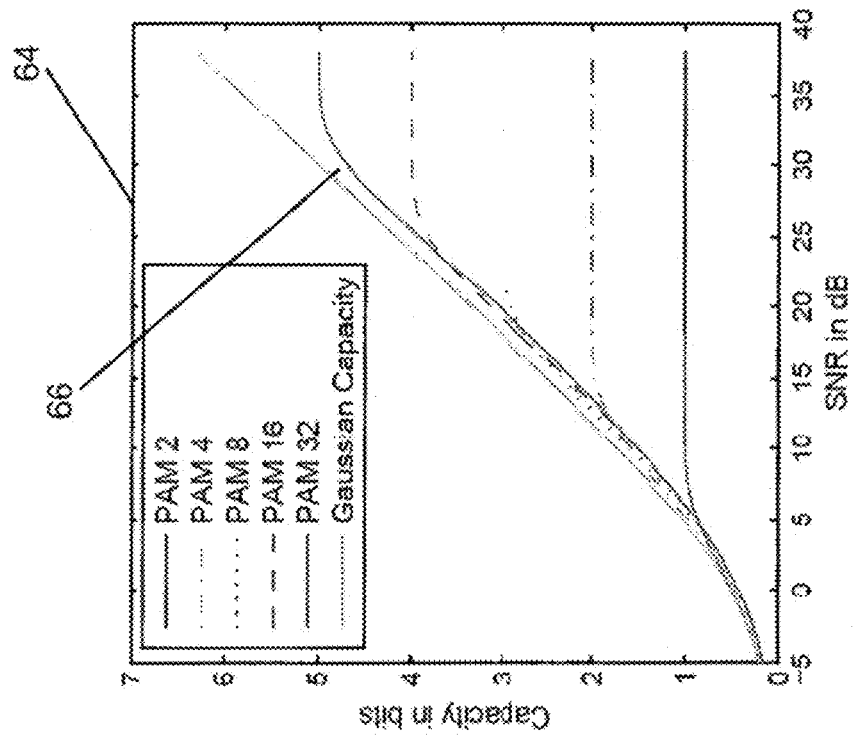
FIG. 6a is a chart showing a comparison of Gaussian capacity and PD capacity for traditional PAM-2,4,8,16,32.
Figure 6B:
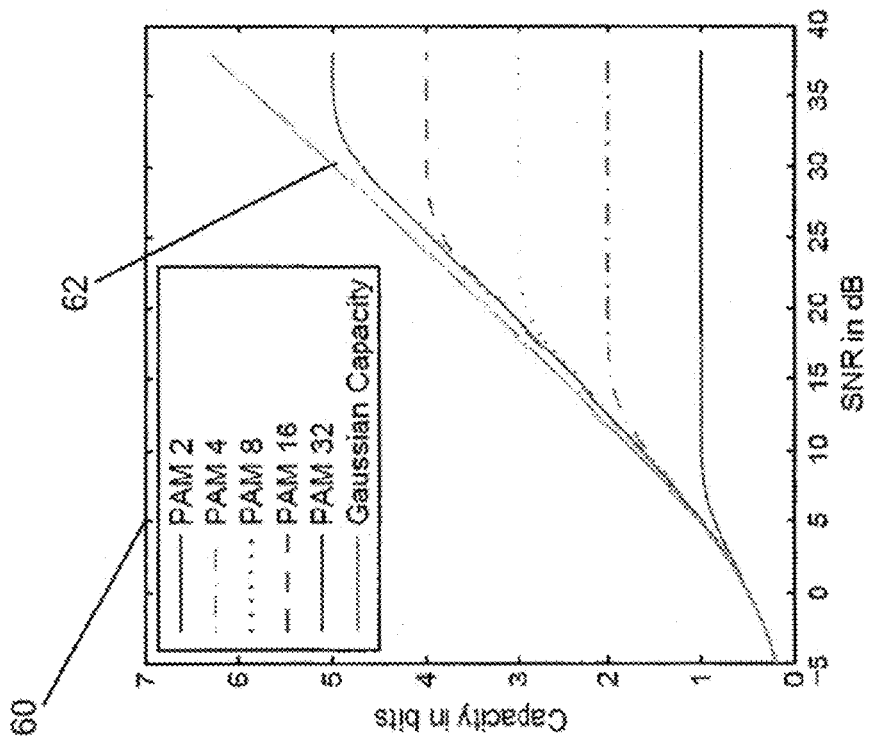
FIG. 6b is a chart showing a comparison between Gaussian capacity and joint capacity for traditional PAM-2,4,8,16,32.

The gap in capacity between a conventional modulation scheme in combination with a theoretically optimal coder can be observed with reference to FIGS. 6a and 6b. FIG. 6a includes a chart 60 showing a comparison between Gaussian capacity and the PD capacity of conventional PAM-2, 4, 8, 16, and 32 constellations that maximize $d_{min}$. Gaps 62 exist between the plot of Gaussian capacity and the PD capacity of the various PAM constellations. FIG. 6b includes a chart 64 showing a comparison between Gaussian capacity and the joint capacity of conventional PAM-2, 4, 8, 16, and 32 constellations that maximize $d_{min}$. Gaps 66 exist between the plot of Gaussian capacity and the joint capacity of the various PAM constellations. These gaps in capacity represent the extent to which conventional PAM constellations fall short of obtaining the ultimate theoretical capacity i.e. the Gaussian capacity.

Figure 7:
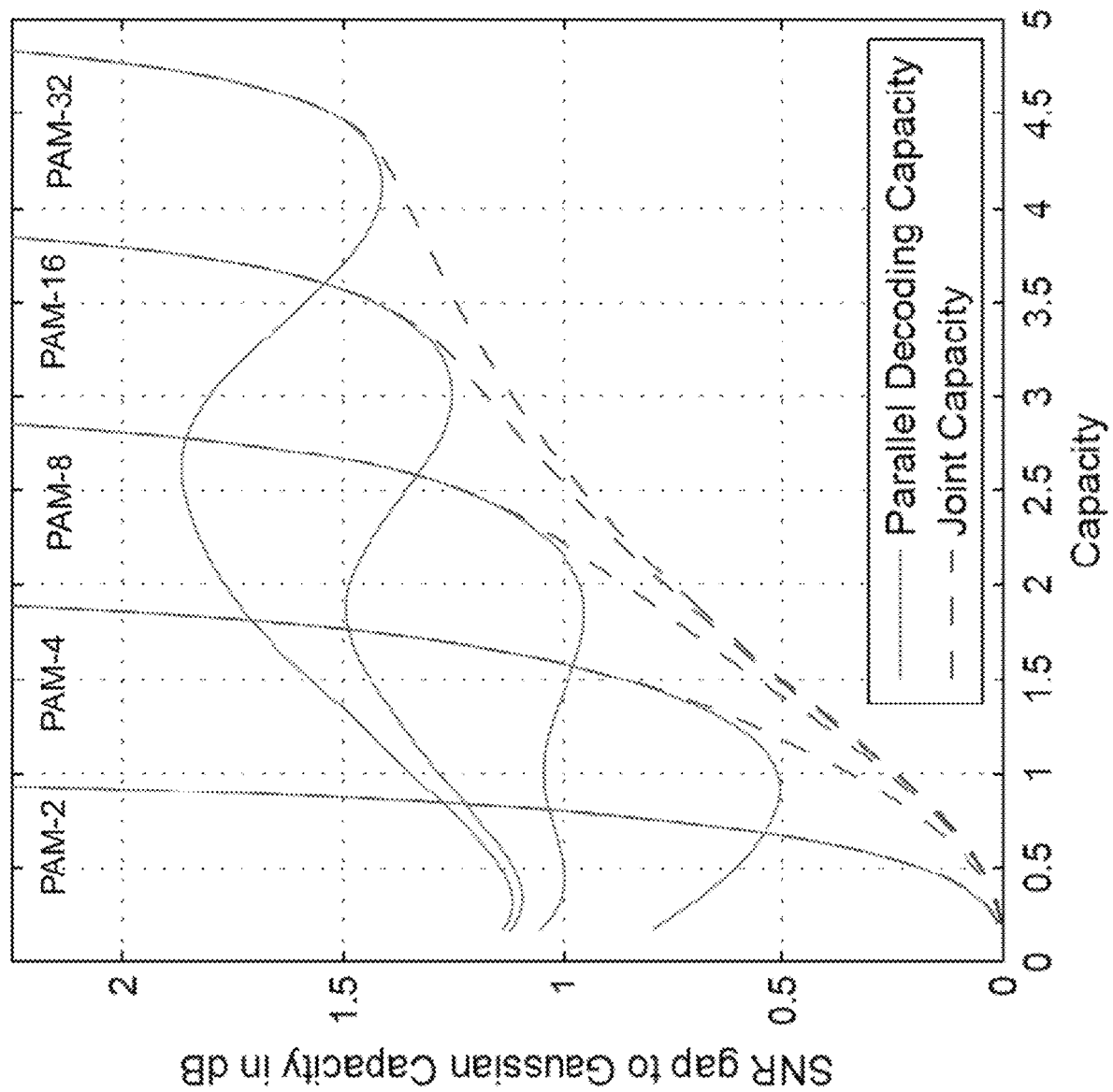
FIG. 7 is a chart showing the SNR gap to Gaussian capacity for the PD capacity and joint capacity of traditional PAM-2,4,8,16,32.

In order to gain a better view of the differences between the curves shown in FIGS. 6a and 6b at points close to the Gaussian capacity, the SNR gap to Gaussian capacity for different values of capacity for each constellation are plotted in FIG. 7. It is interesting to note from the chart 70 in FIG. 7 that (unlike the joint capacity) at the same SNR, the PD capacity does not necessarily increase with the number of constellation points. As is discussed further below, this is not the case with PAM constellations optimized for PD capacity.

Figure 8A:
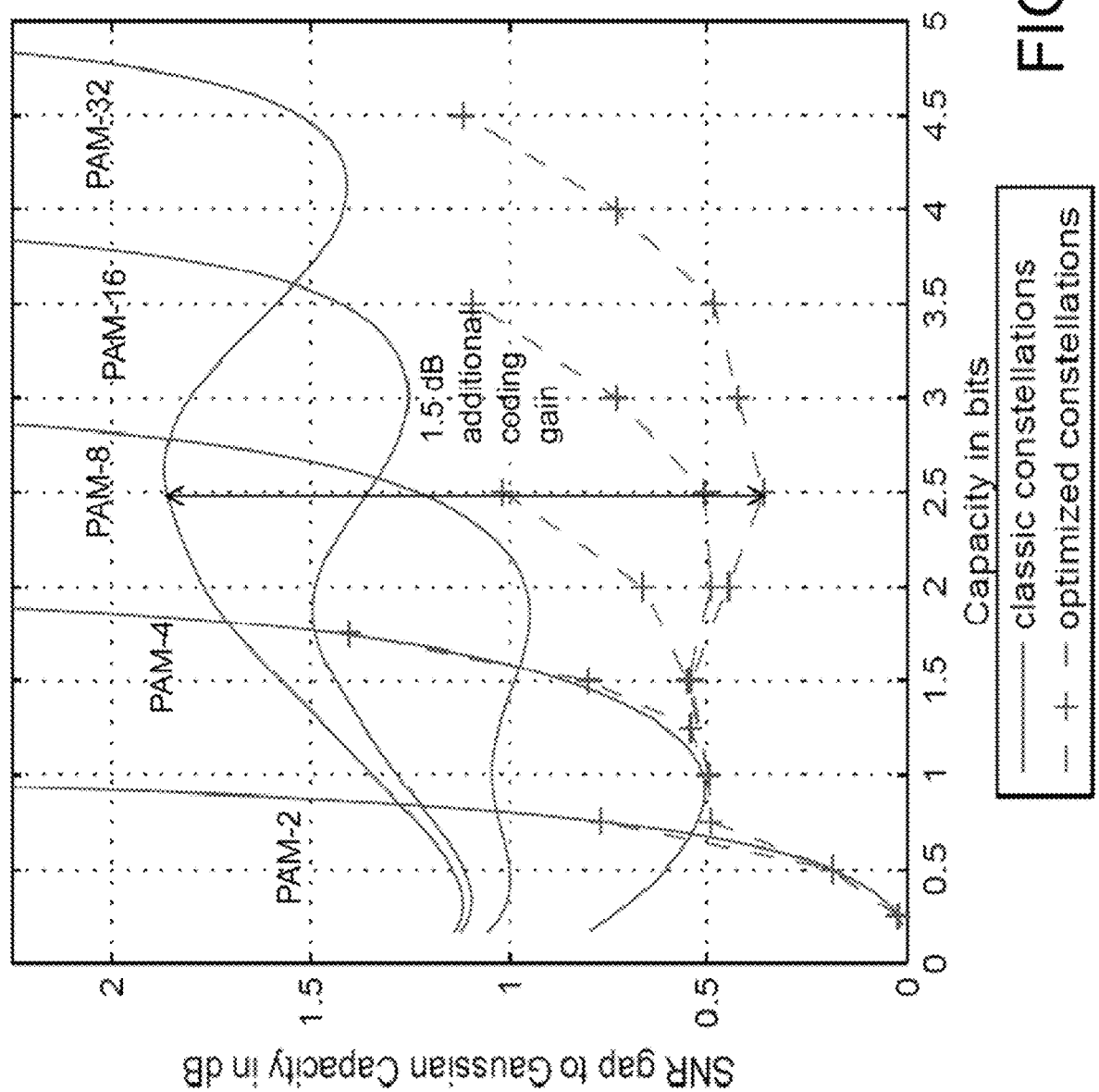
FIG. 8a is a chart comparing the SNR gap to Gaussian capacity of the PD capacity for traditional and optimized PAM-2,4,8,16,32 constellations.
Figure 8B:
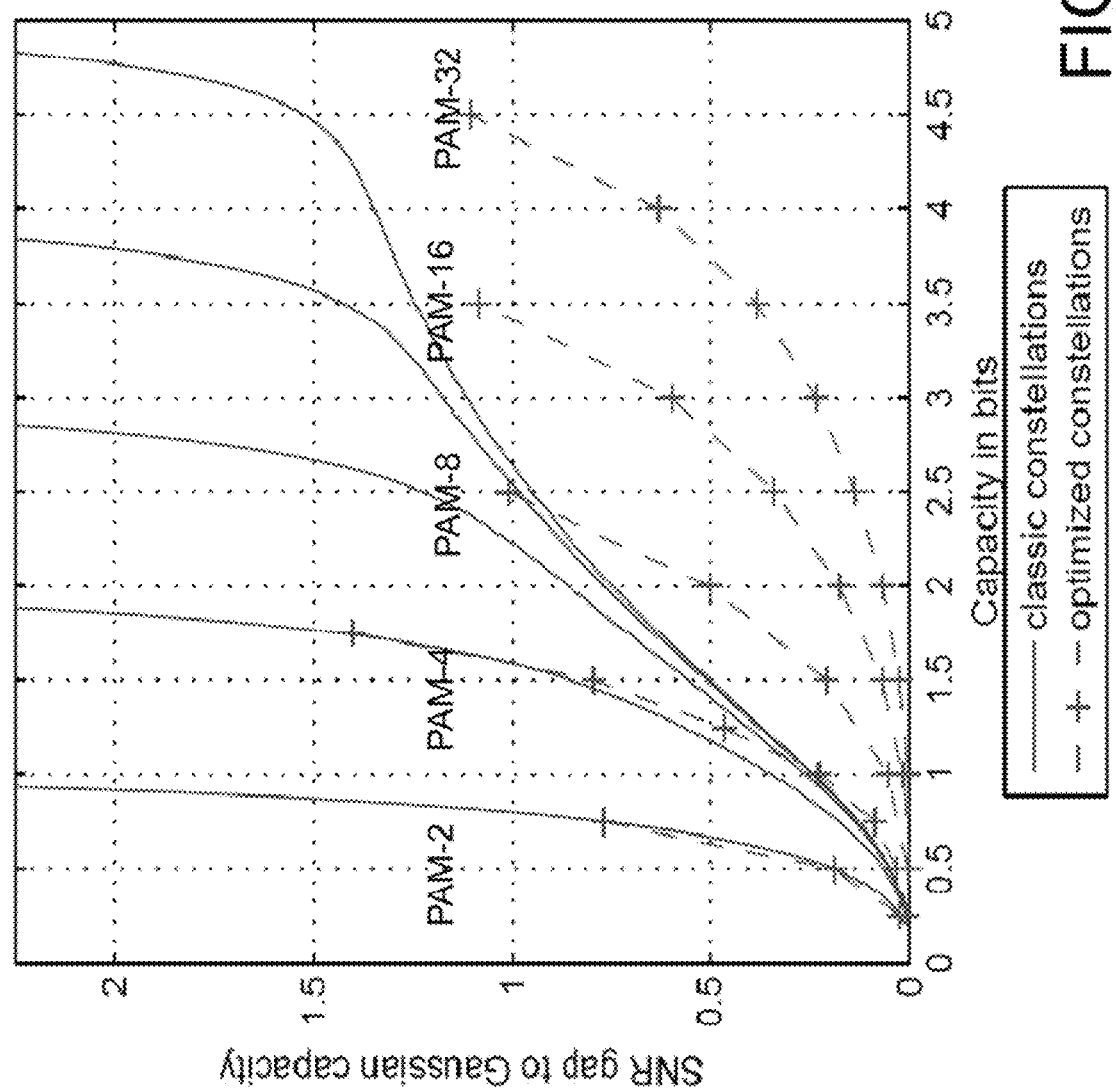
FIG. 8b is a chart comparing the SNR gap to Gaussian capacity of the joint capacity for traditional and optimized PAM-2,4,8,16,32 constellations.

FIGS. 8a and 8b summarize performance of constellations for PAM-4, 8, 16, and 32 optimized for PD capacity and joint capacity (it should be noted that BPSK is the optimal PAM-2 constellation at all code rates). The constellations are optimized for PD capacity and joint capacity for different target user bits per dimension (i.e. code rates). The optimized constellations are different depending on the target user bits per dimension, and also depending on whether they have been designed to maximize the PD capacity or the joint capacity. All the PD optimized PAM constellations are labeled using a gray labeling which is not always the binary reflective gray labeling. It should be noted that not all gray labels achieve the maximum possible PD capacity even given the freedom to place the constellation points anywhere on the real line. FIG. 8a shows the SNR gap for each constellation optimized for PD capacity. FIG. 8b shows the SNR gap to Gaussian capacity for each constellation optimized for joint capacity. Again, it should be emphasized that each '+' on the plot represents a different constellation.

Referring to FIG. 8a, the coding gain achieved using a constellation optimized for PD capacity can be appreciated by comparing the SNR gap at a user bit rate per dimension of 2.5 bits for PAM-32. A user bit rate per dimension of 2.5 bits for a system transmitting 5 bits per symbol constitutes a code rate of 1/2. At that code rate the constellation optimized for PD capacity provides an additional coding gain of approximately 1.5 dB when compared to the conventional PAM-32 constellation.

Figure 9:
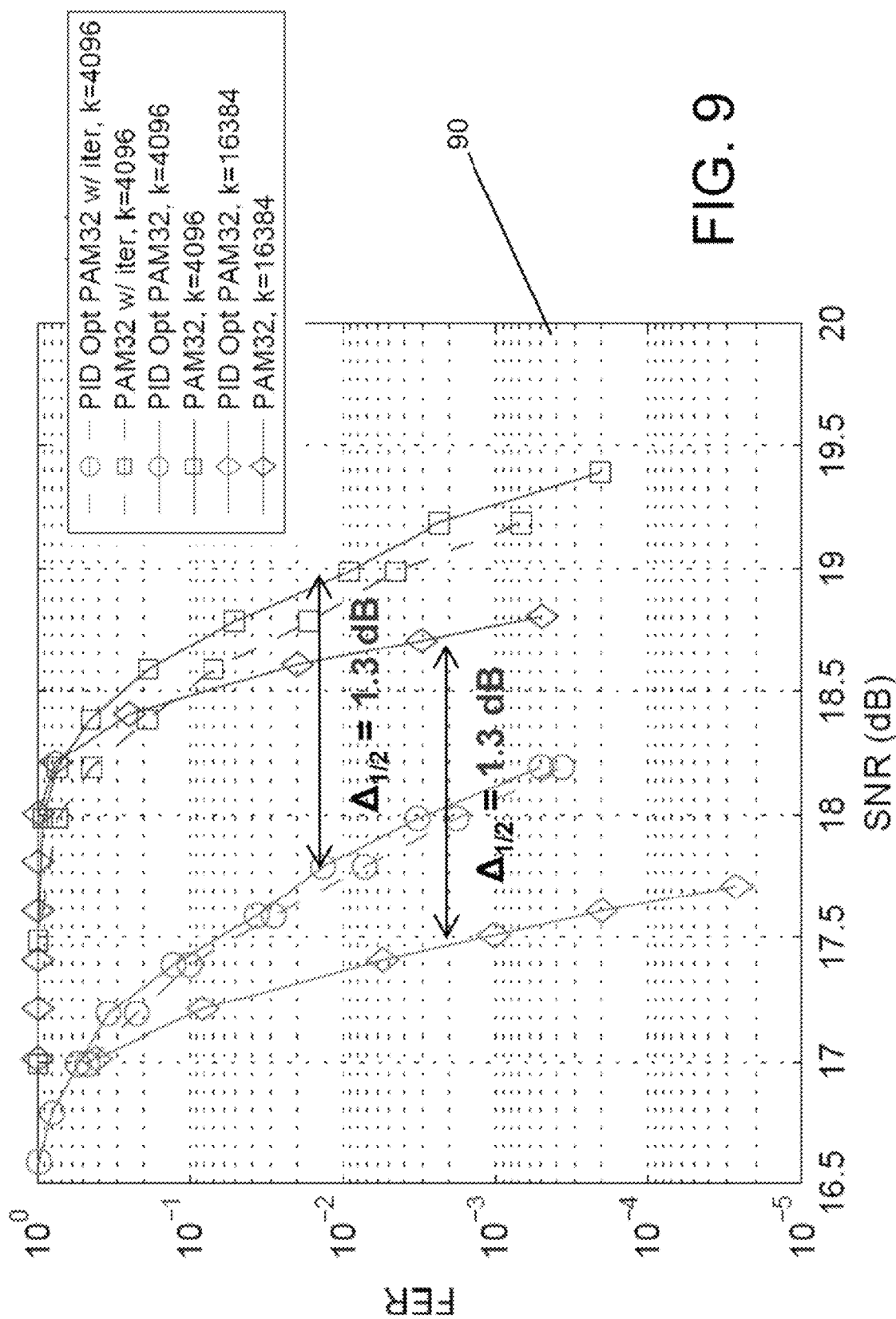
FIG. 9 is a chart showing Frame Error Rate performance of traditional and PD capacity optimized PAM-32 constellations in simulations involving several different length LDPC codes.

The SNR gains that can be achieved using constellations that are optimized for PD capacity can be verified through simulation. The results of a simulation conducted using a rate 1/2 LDPC code in conjunction with a conventional PAM-32 constellation and in conjunction with a PAM-32 constellation optimized for PD capacity are illustrated in FIG. 9. A chart 90 includes plots of Frame Error Rate performance of the different constellations with respect to SNR and using different length codes (i.e. k=4,096 and k=16,384). Irrespective of the code that is used, the constellation optimized for PD capacity achieves a gain of approximately 1.3 dB, which closely approaches the gain predicted from FIG. 8a.

Capacity Optimized Pam Constellations

Using the processes outlined above, locus plots of PAM constellations optimized for capacity can be generated that show the location of points within PAM constellations versus SNR. Locus plots of PAM-4, 8, 16, and 32 constellations optimized for PD capacity and joint capacity and corresponding design tables at various typical user bit rates per dimension are illustrated in FIGS. 10a-17b. The locus plots and design tables show PAM-4,8,16,32 constellation point locations and labelings from low to high SNR corresponding to a range of low to high spectral efficiency.

Figure 10A:
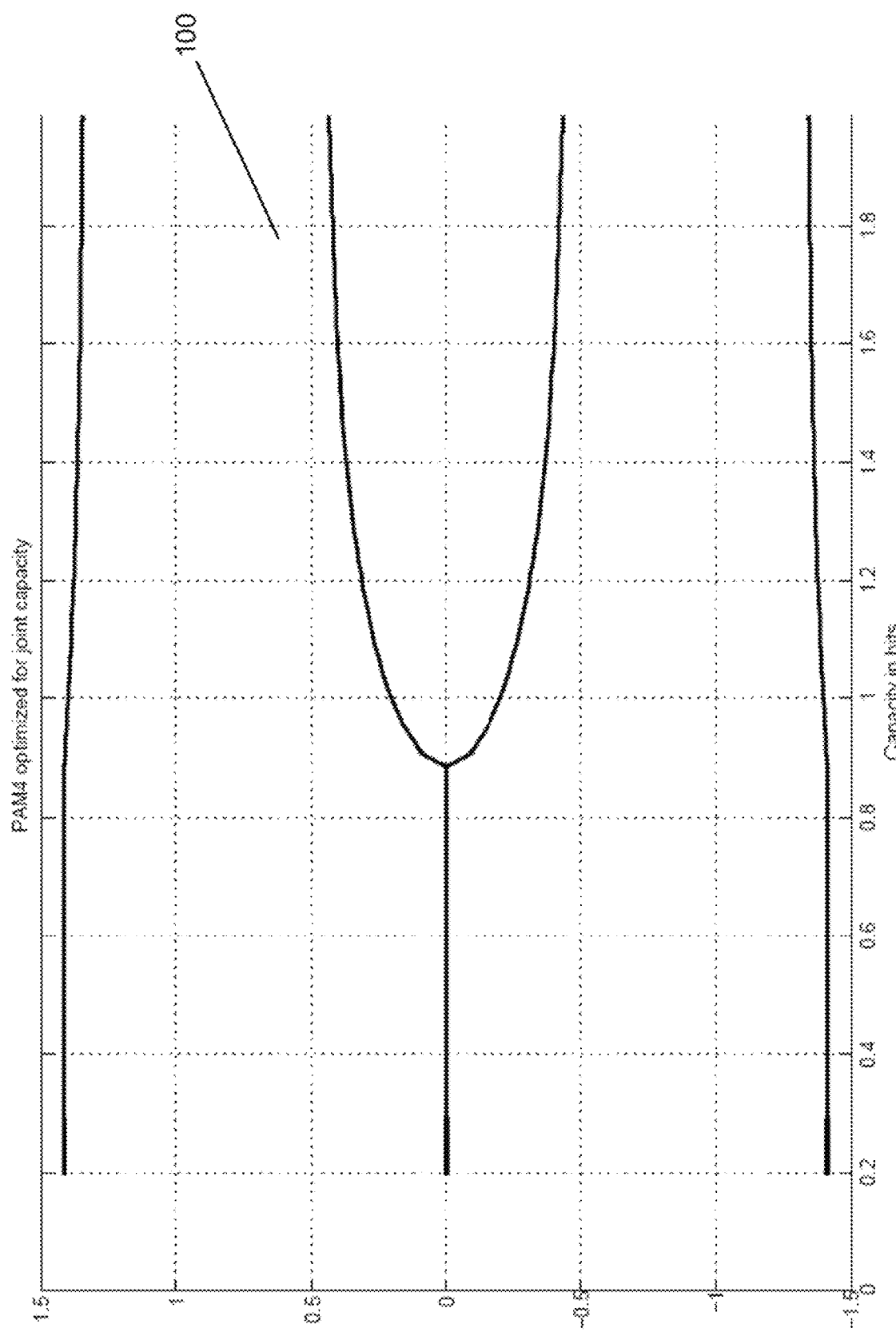
FIGS. 10a-10d are locus plots showing the location of constellation points of a PAM-4 constellation optimized for PD capacity and joint capacity versus user bit rate per dimension and versus SNR.
Figure 10B:
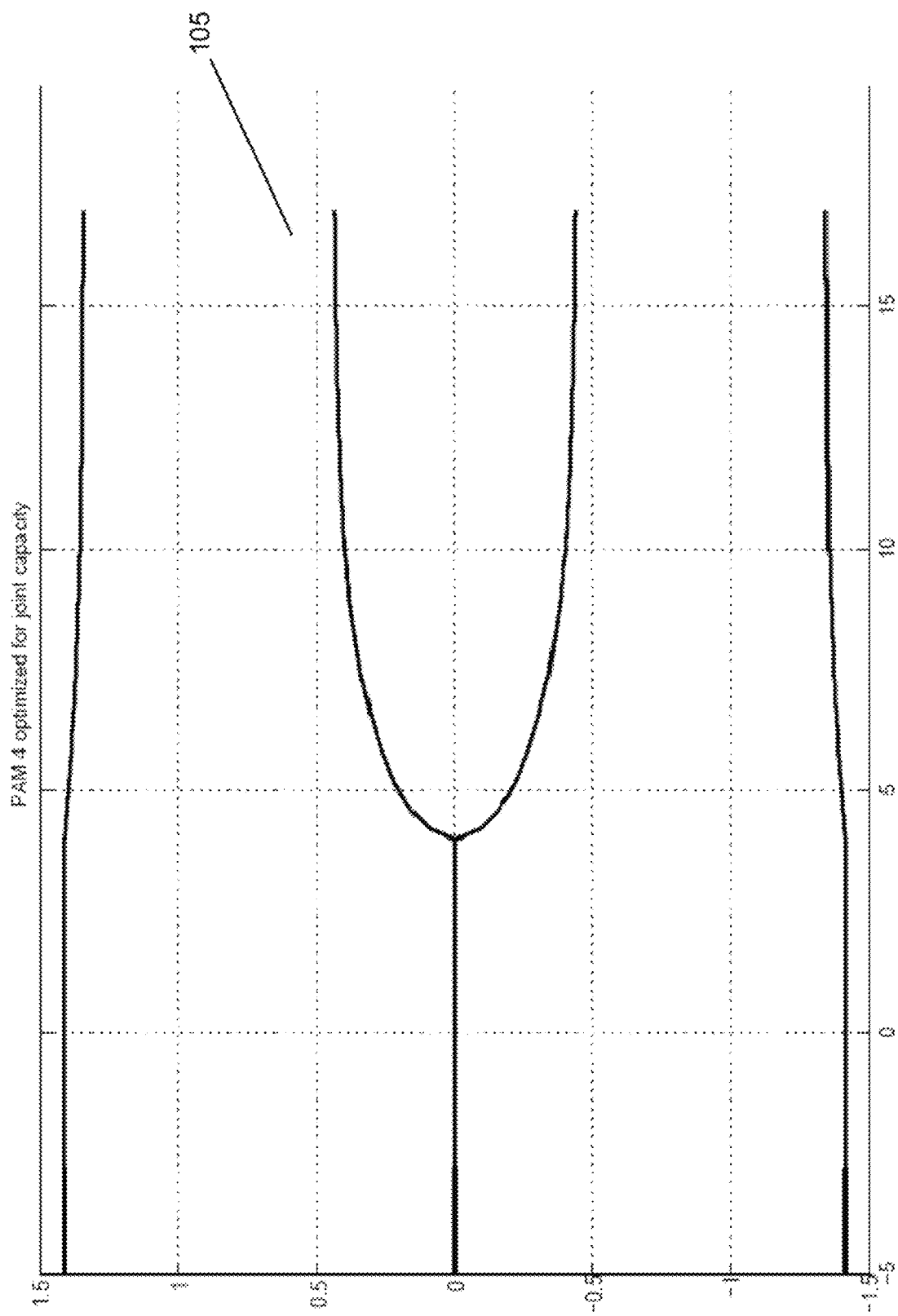
Figure 10C:
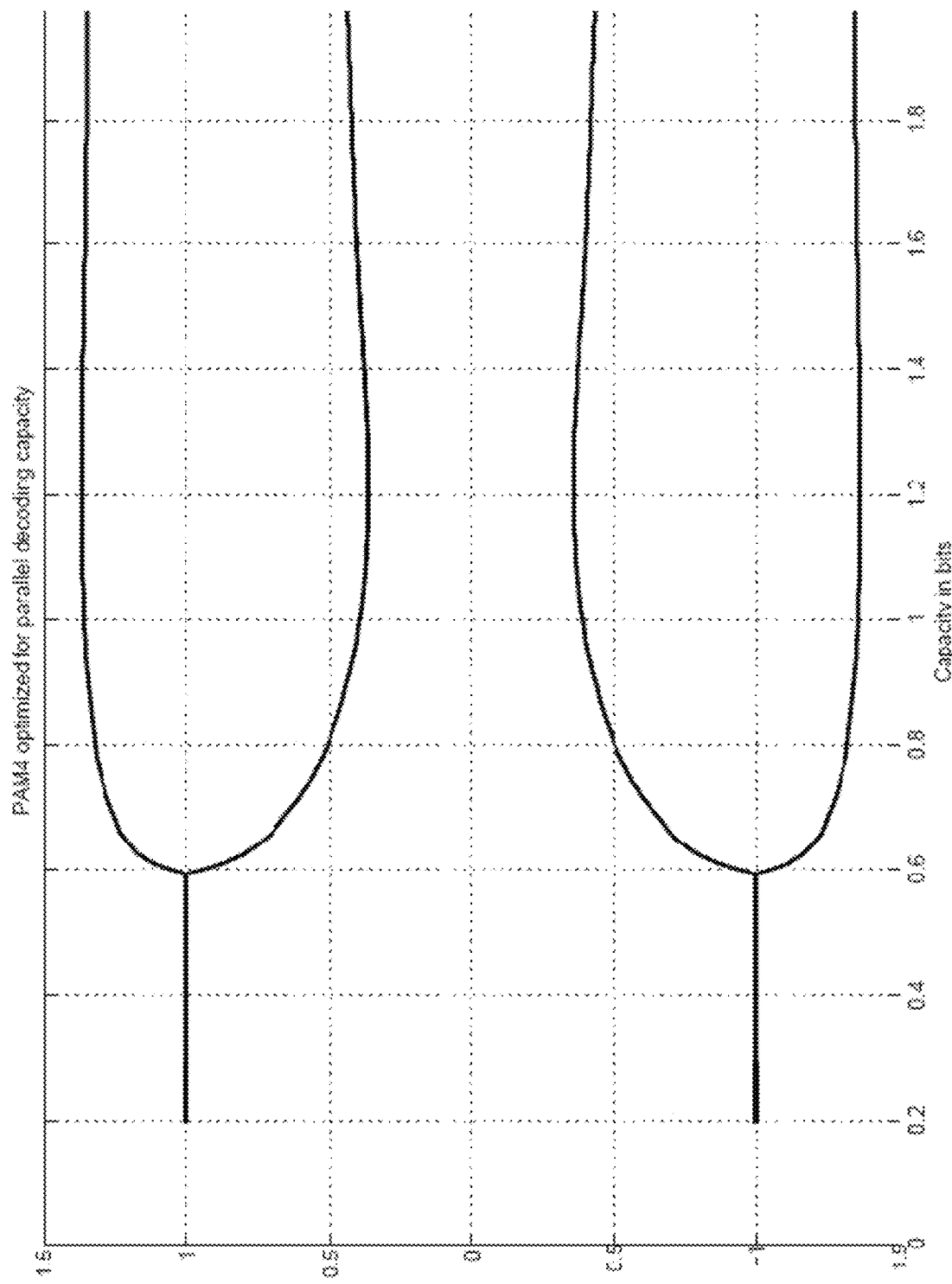
Figure 10D:
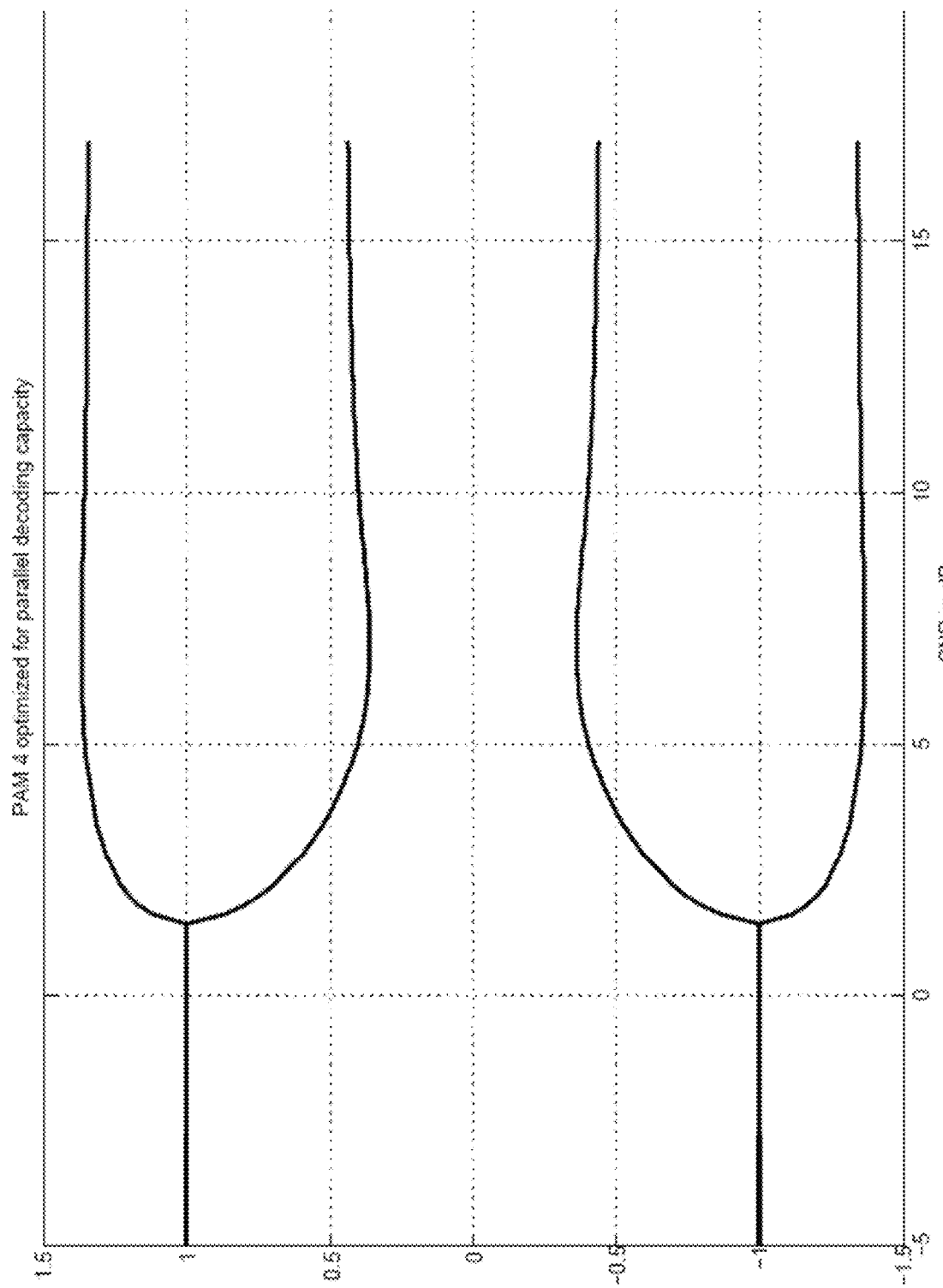

In FIG. 10a, a locus plot 100 shows the location of the points of PAM-4 constellations optimized for Joint capacity plotted against achieved capacity. A similar locus plot 105 showing the location of the points of Joint capacity optimized PAM-4 constellations plotted against SNR is included in FIG. 10b. In FIG. 10c. the location of points for PAM-4 optimized for PD capacity is plotted against achievable capacity and in FIG. 10d the location of points for PAM-4 for PD capacity is plotted against SNR. At low SNRs, the PD capacity optimized PAM-4 constellations have only 2 unique points, while the Joint optimized constellations have 3. As SNR is increased, each optimization eventually provides 4 unique points. This phenomenon is explicitly described in FIG. 11a and FIG. 11b where vertical slices of FIGS. 10ab and 10cd are captured in tables describing some PAM-4 constellations designs of interest. The SNR slices selected represent designs that achieve capacities={0.5, 0.75, 1.0, 1.25, 1.5} bits per symbol (bps). Given that PAM-4 can provide at most $\log_2(4)=2$ bps, these design points represent systems with information code rates R={1/4, 3/8, 1/2, 5/8, 3/4} respectively.

Figure 12A:
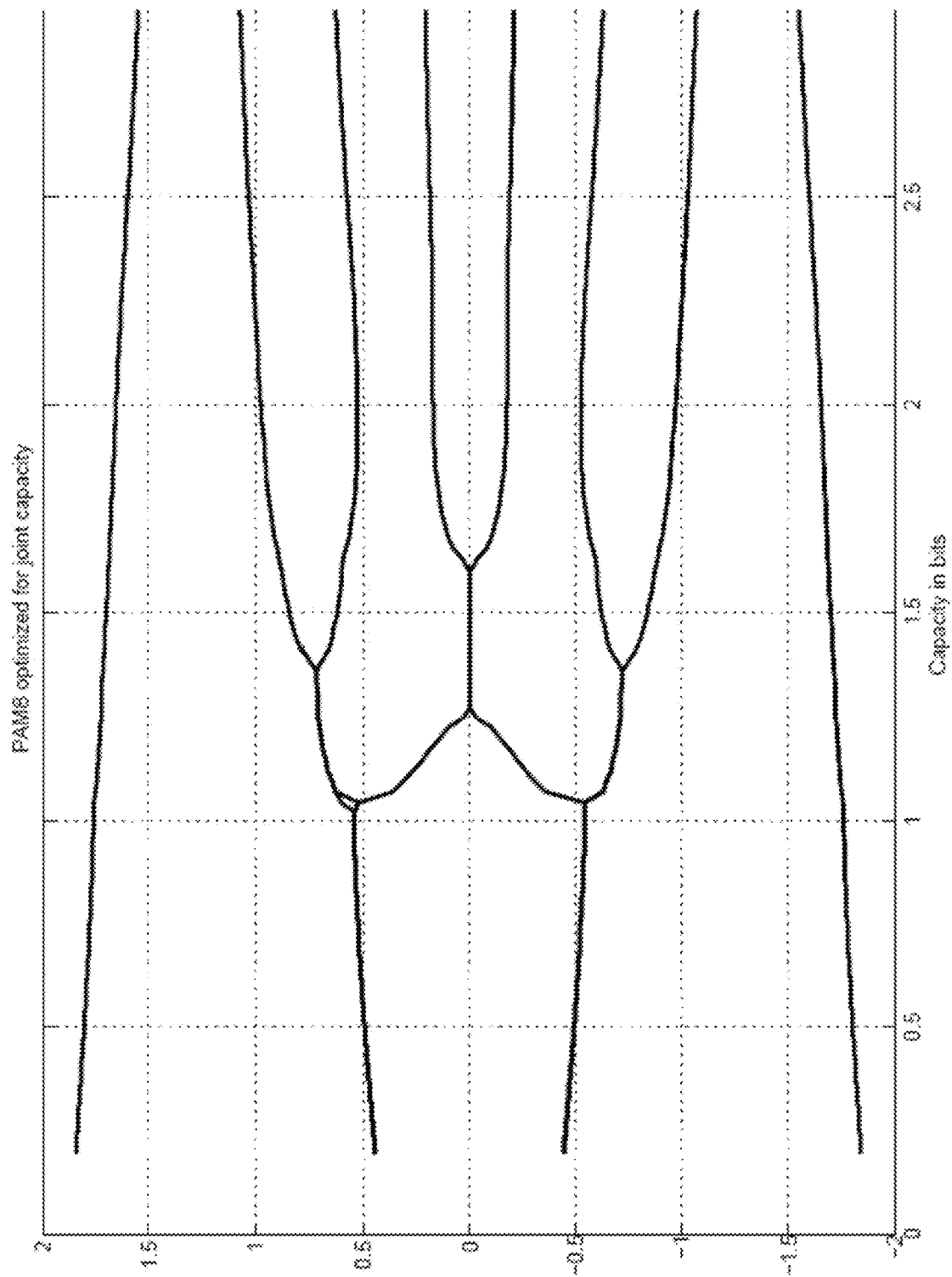
FIGS. 12a-12d are locus plots showing the location of constellation points of a PAM-8 constellation optimized for PD capacity and joint capacity versus user bit rate per dimension and versus SNR.
Figure 12B:
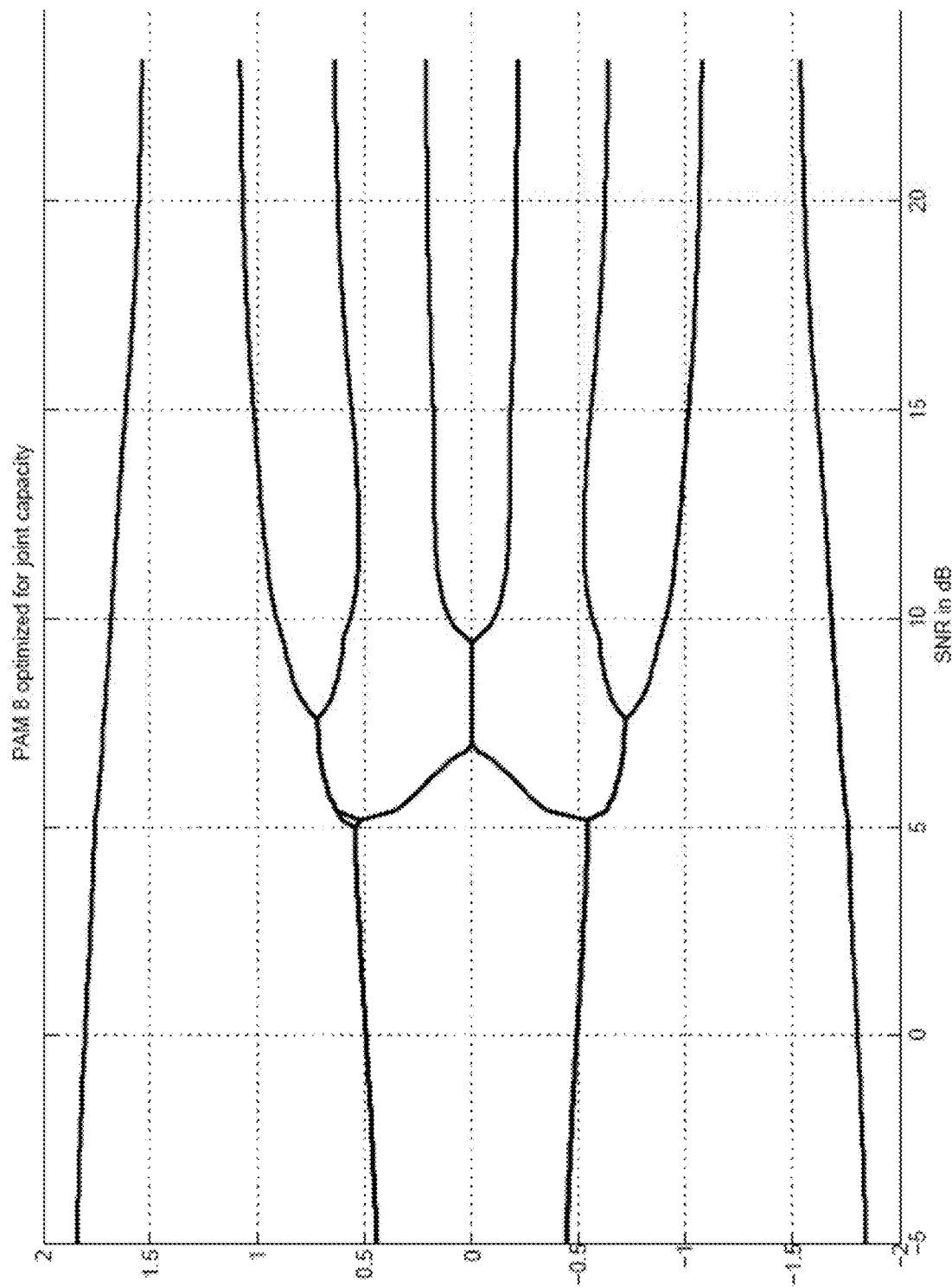
Figure 12C:
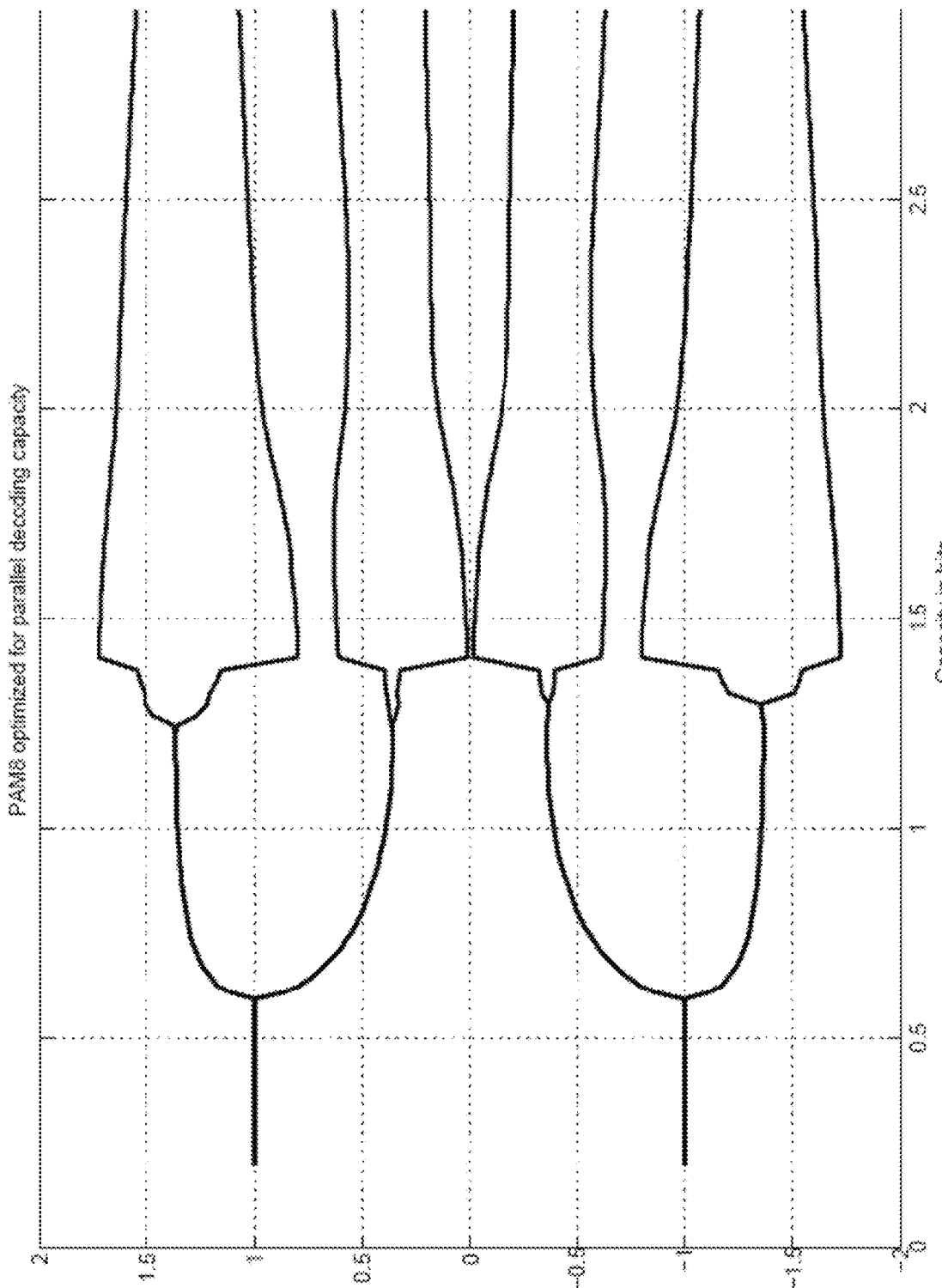
Figure 12D:
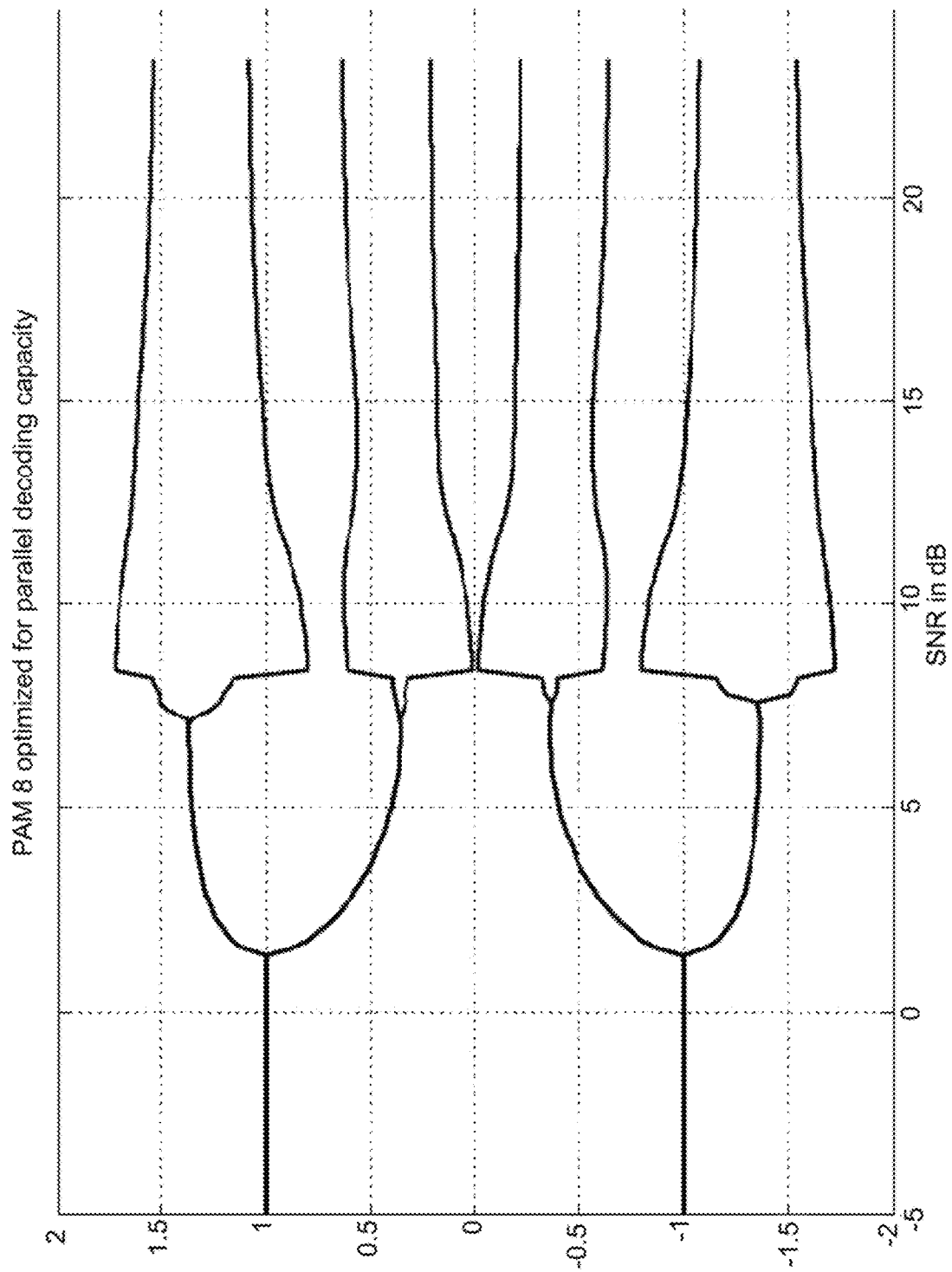

FIGS. 12ab and 12cd present locus plots of PD capacity and joint capacity optimized PAM-8 constellation points versus achievable capacity and SNR. FIGS. 13a and 13b provide slices from these plots at SNRs corresponding to achievable capacities $r_i$={0.5, 1.0, 1.5, 2.0, 2.5} bps. Each of these slices correspond to systems with code rate R=$r_i$ bps/log 2(8), resulting in R={1/6, 1/3, 1/2, 2/3, 5/6}. As an example of the relative performance of the constellations in these tables, consider FIG. 13b which shows a PD capacity optimized PAM-8 constellation optimized for SNR=9.00 dB, or 1.5 bps. We next examine the plot provided in FIG. 8a and see that the gap of the optimized constellation to the ultimate, Gaussian, capacity (CG) is approximately 0.5 dB. At the same spectral efficiency, the gap of the traditional PAM-8 constellation is approximately 1.0 dB. The advantage of the optimized constellation is 0.5 dB for the same rate (in this case R=1/2). This gain can be obtained by only changing the mapper and demapper in the communication system and leaving all other blocks the same.

Figure 14A:
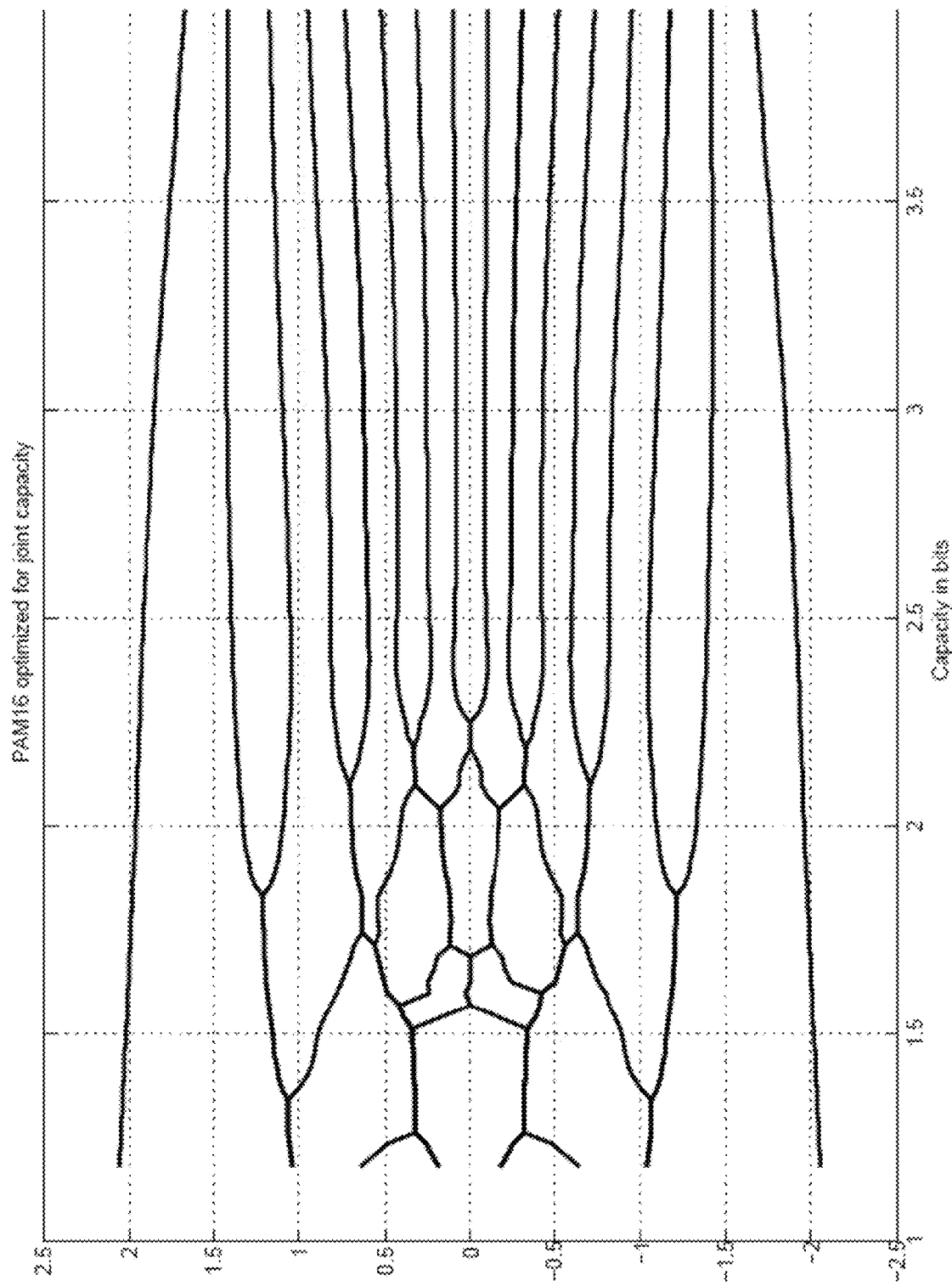
FIGS. 14a-14d are locus plots showing the location of constellation points of a PAM-16 constellation optimized for PD capacity and joint capacity versus user bit rate per dimension and versus SNR.
Figure 14B:
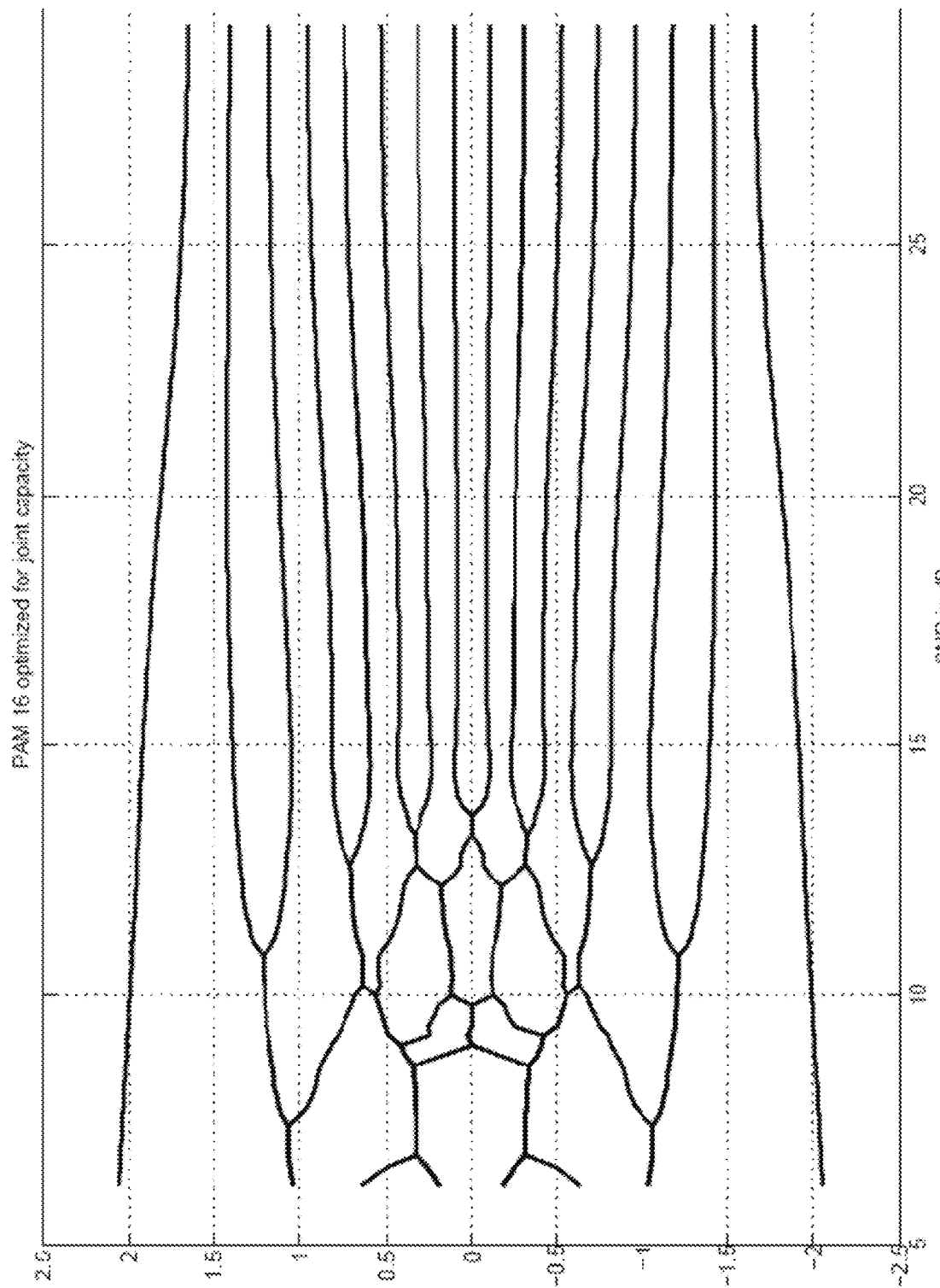
Figure 14C:
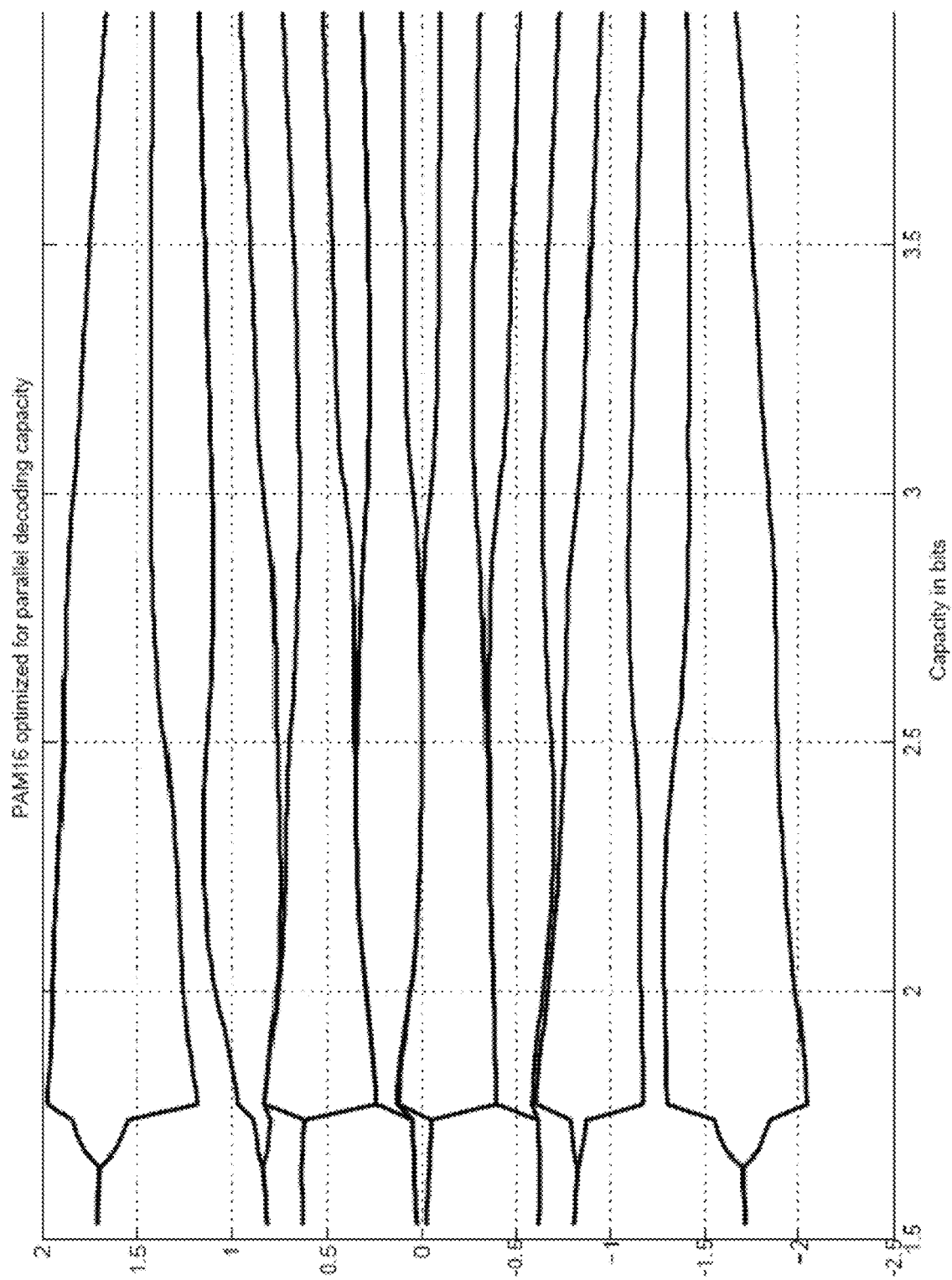
Figure 14D:
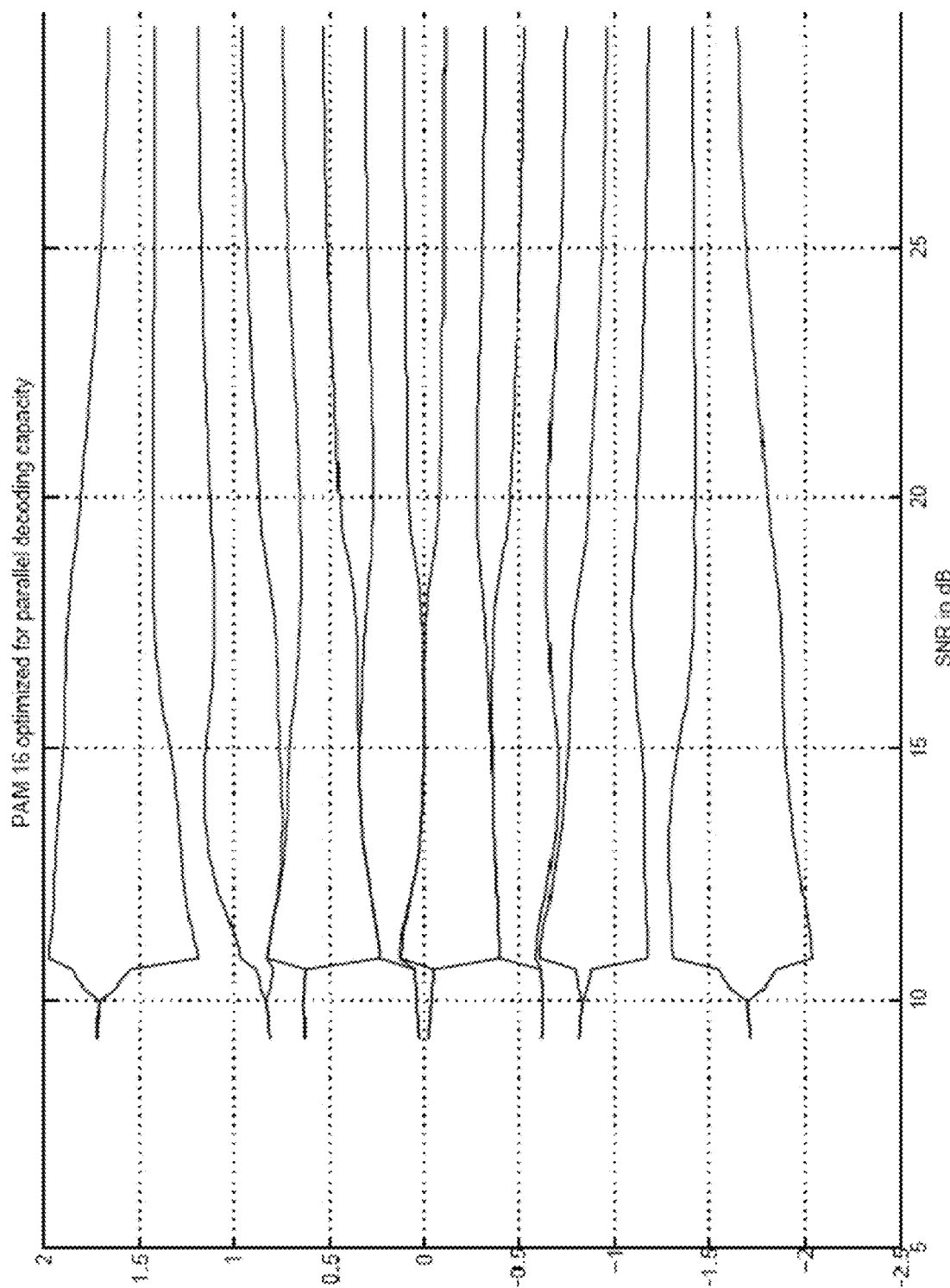
Figure 16B:
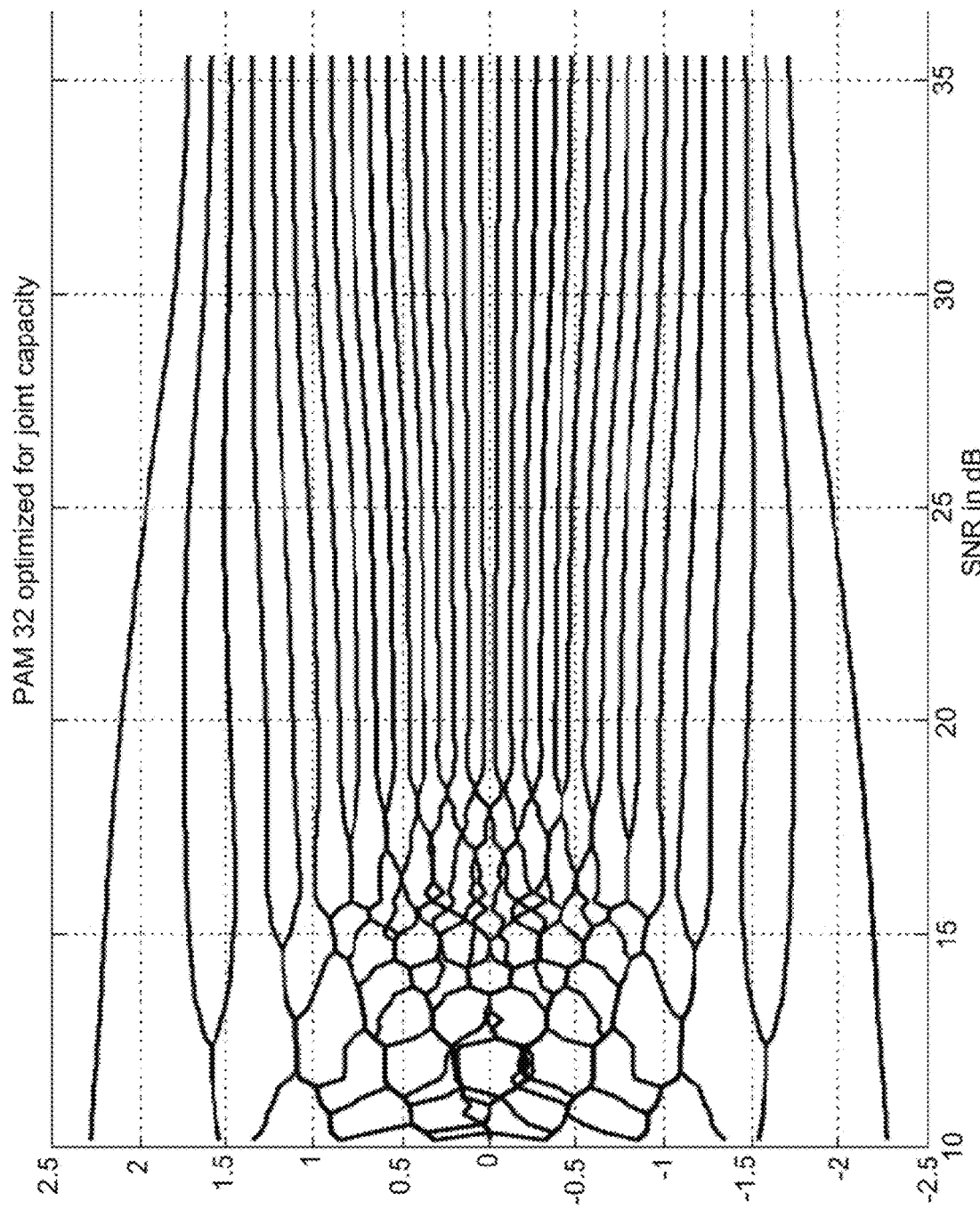
Figure 16C:
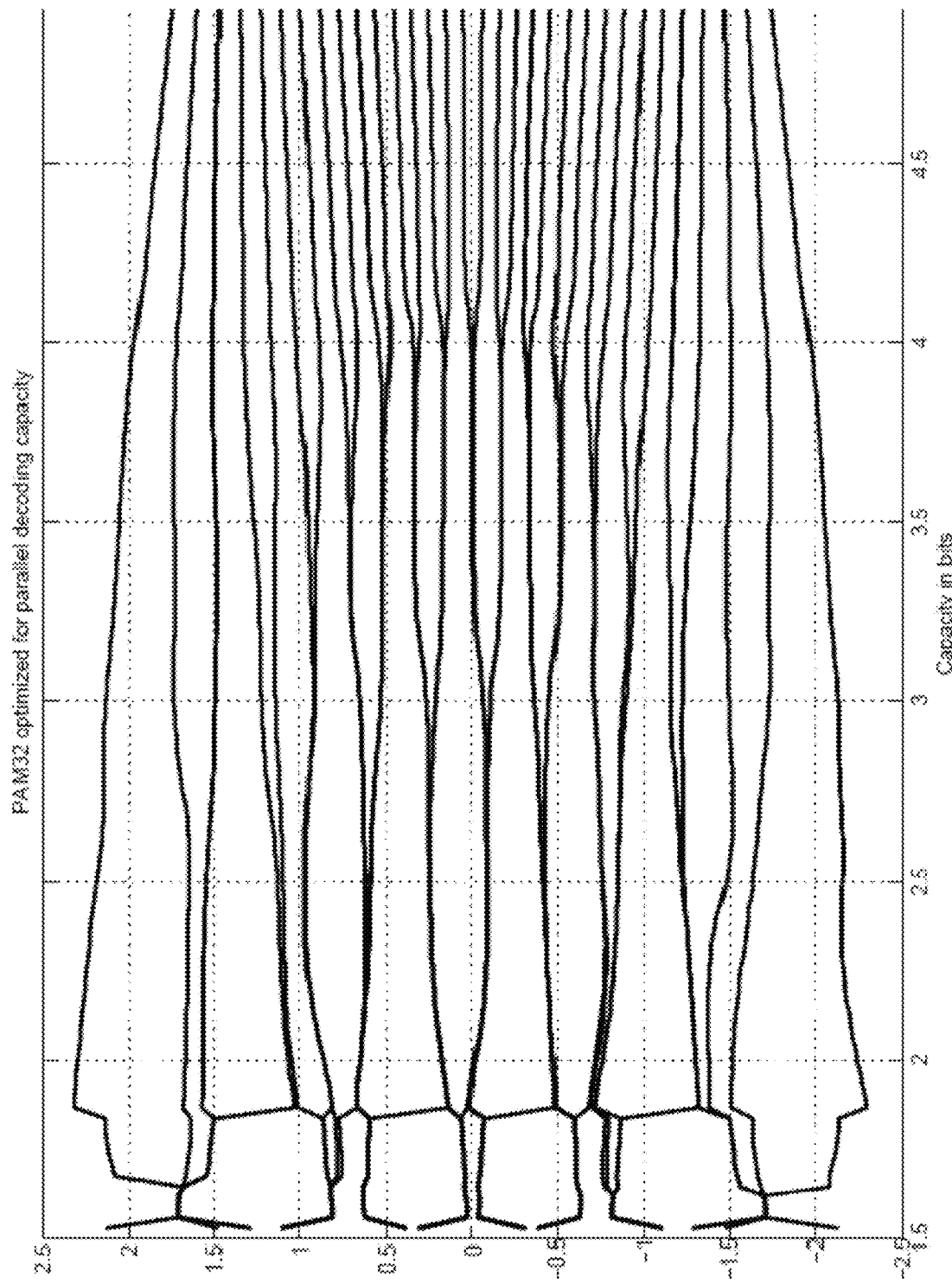
Figure 16D:
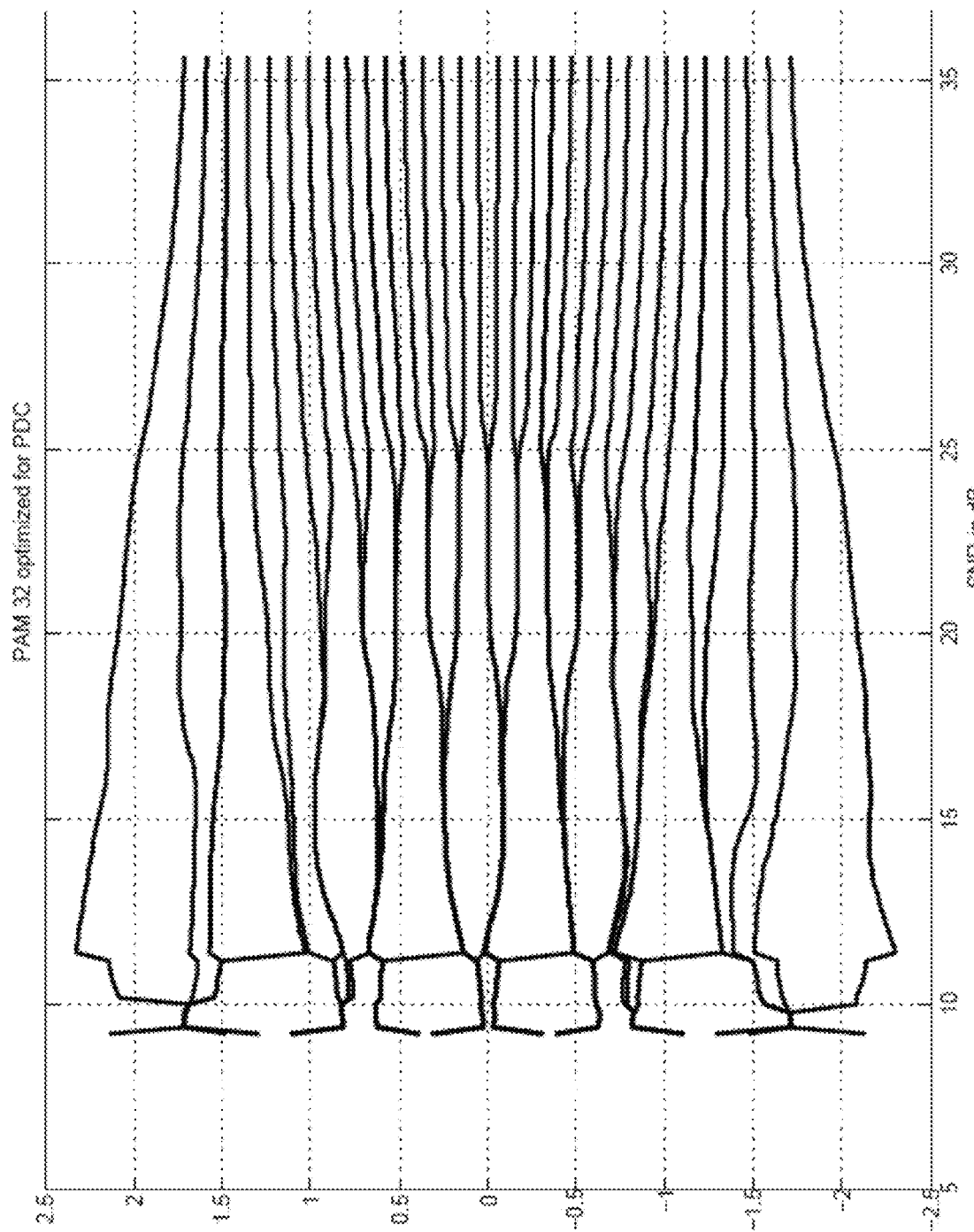

Similar information is presented in FIGS. 14abcd, and 15ab which provide loci plots and design tables for PAM-16 PD capacity and joint capacity optimized constellations. Likewise FIGS. 16abcd, 17ab provide loci plots and design tables for PAM-32 PD capacity and joint capacity optimized constellations.

Capacity Optimized PSK Constellations

Traditional phase shift keyed (PSK) constellations are already quite optimal. This can be seen in the chart 180 comparing the SNR gaps of tradition PSK with capacity optimized PSK constellations shown in FIG. 18 where the gap between PD capacity and Gaussian capacity is plotted for traditional PSK-4,8,16,32 and for PD capacity optimized PSK-4,8,16,32.

Figure 19:
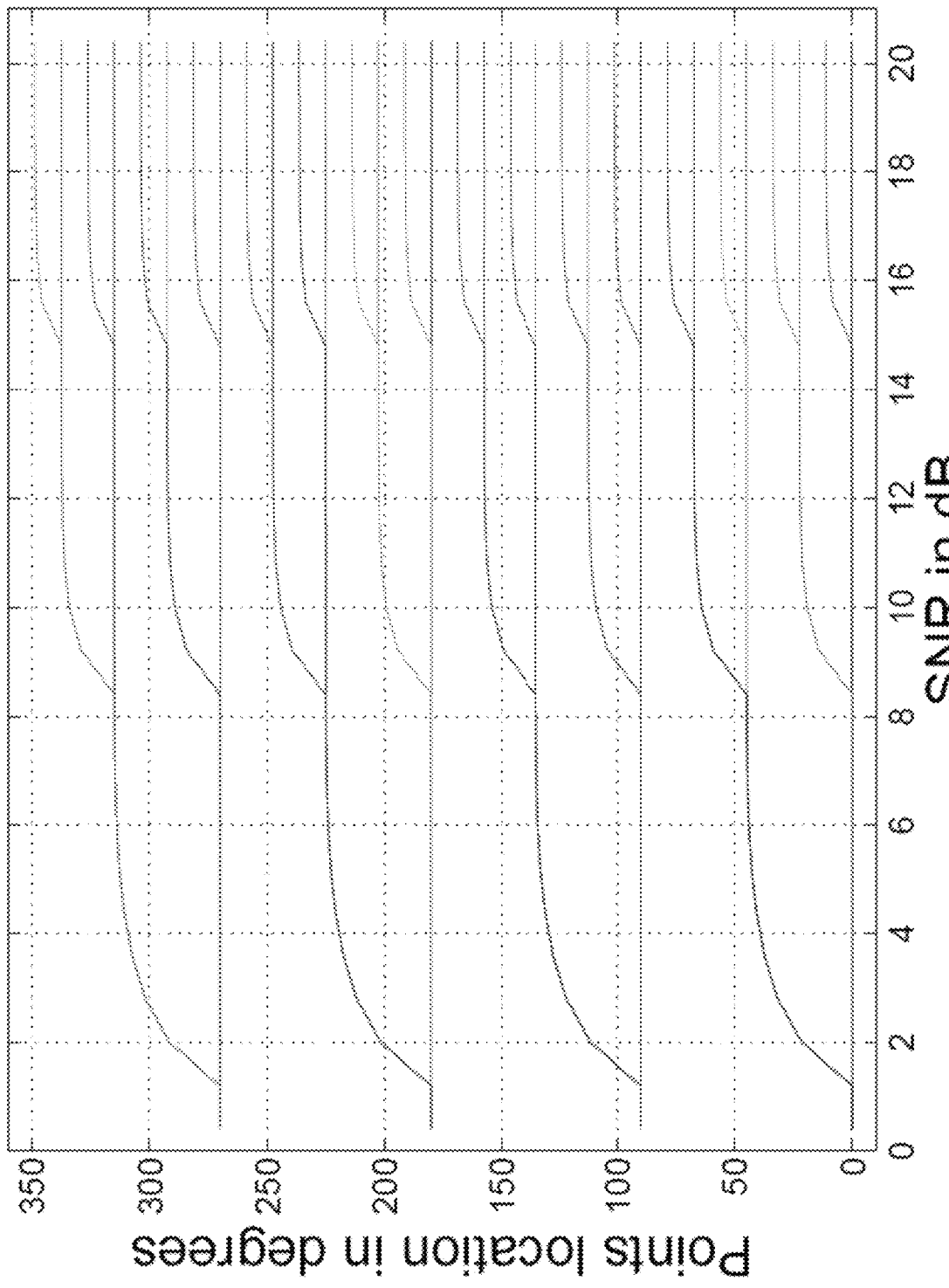
FIG. 19 is a chart showing the location of constellation points of PD capacity optimized PSK-32 constellations.
Figure 20:
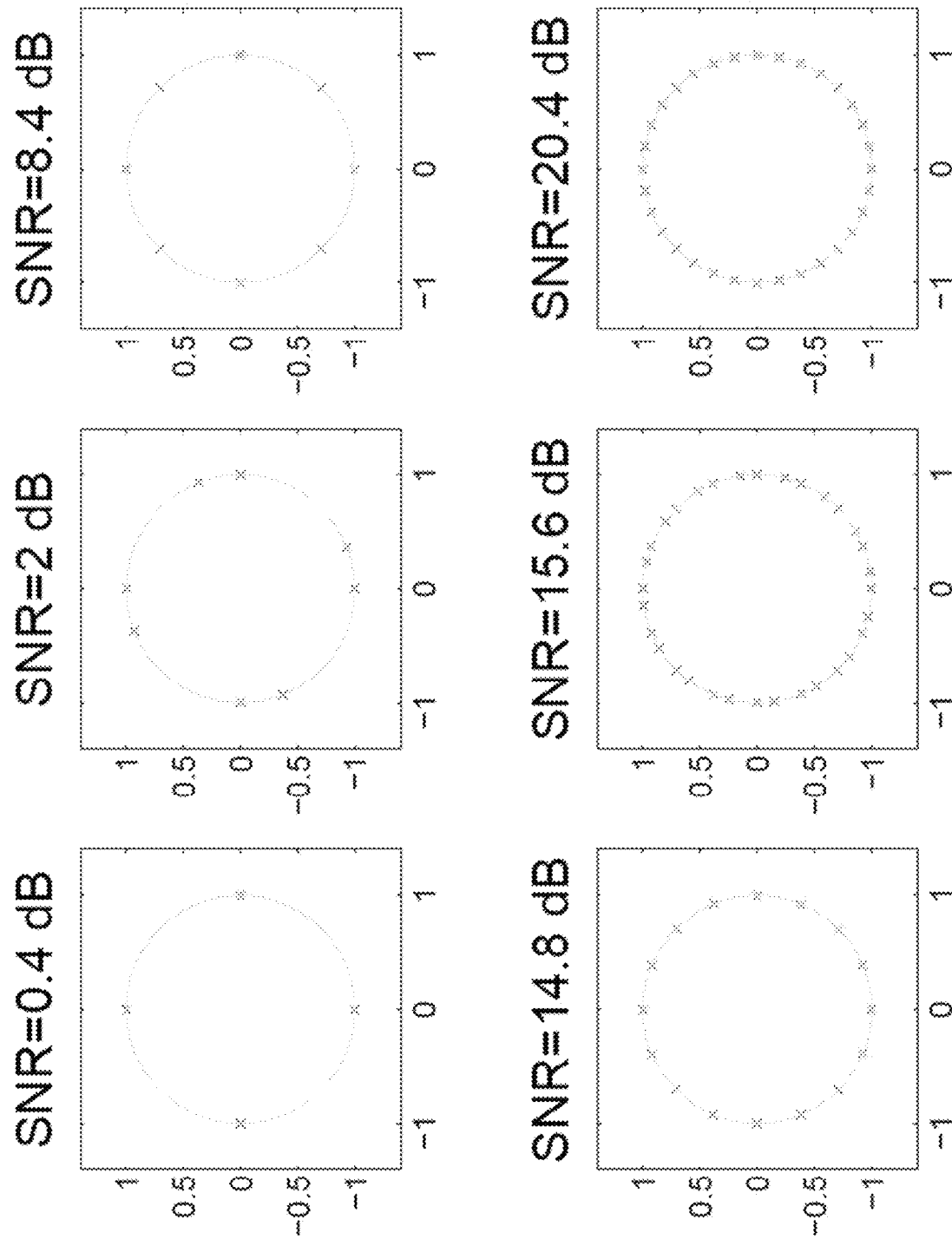
FIG. 20 is a series of PSK-32 constellations optimized for PD capacity at different SNRs in accordance with embodiments of the invention.

The locus plot of PD optimized PSK-32 points across SNR is shown in FIG. 19, which actually characterizes all PSKs with spectral efficiency 5. This can be seen in FIG. 20. Note that at low SNR (0.4 dB) the optimal PSK-32 design is the same as traditional PSK-4, at SNR=8.4 dB optimal PSK-32 is the same as traditional PSK-8, at SNR=14.8 dB optimal PSK-32 is the same as traditional PSK-16, and finally at SNRs greater than 20.4 dB optimized PSK-32 is the same as traditional PSK-32. There are SNRs between these discrete points (for instance SNR=2 and 15. dB) for which optimized PSK-32 provides superior PD capacity when compared to traditional PSK constellations.

Figure 18:
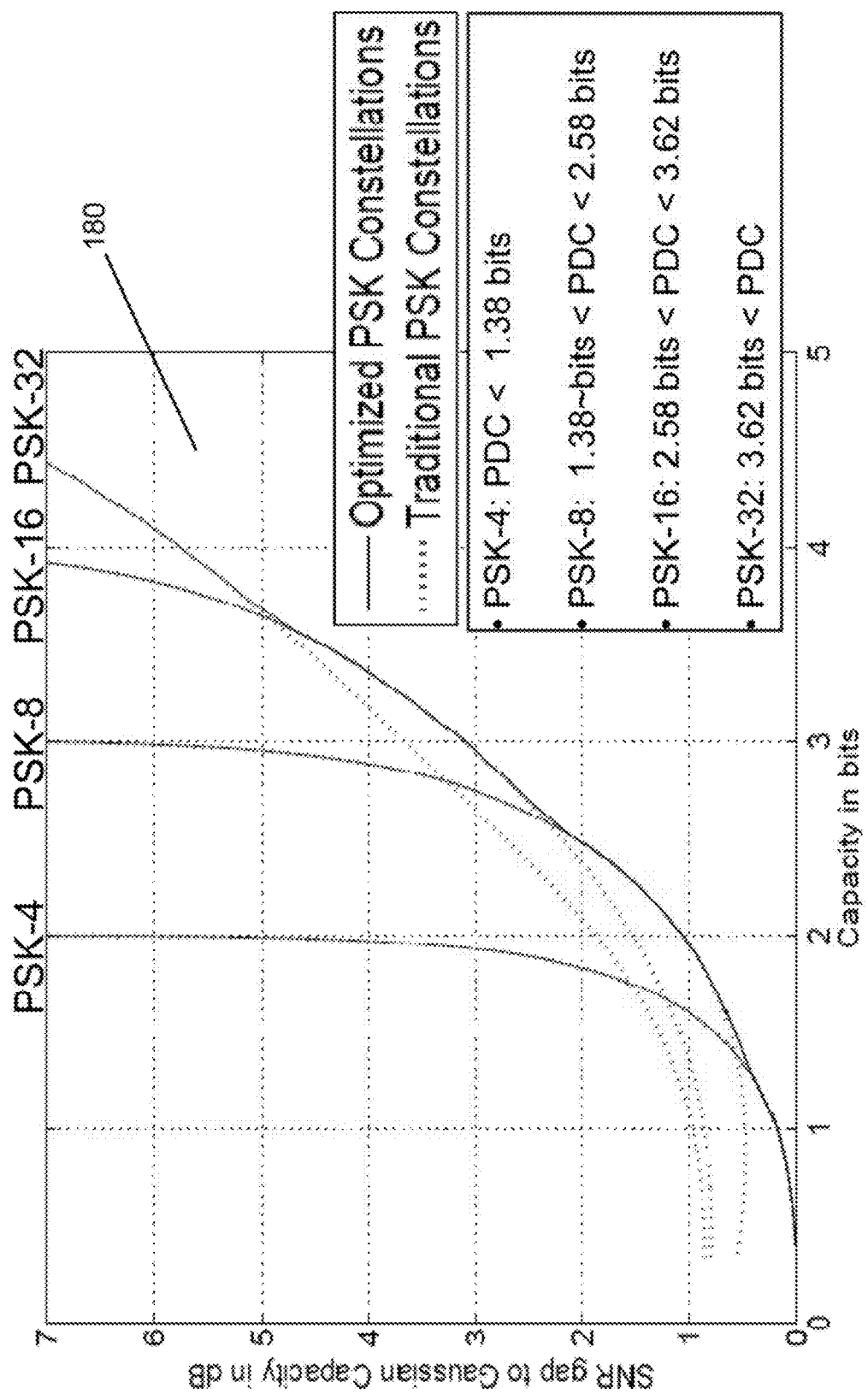
FIG. 18 is a chart showing the SNR gap to Gaussian capacity for traditional and capacity optimized PSK constellations.

We note now that the locus of points for PD optimized PSK-32 in FIG. 19 in conjunction with the gap to Gaussian capacity curve for optimized PSK-32 in FIG. 18 implies a potential design methodology. Specifically, the designer could achieve performance equivalent or better than that enabled by traditional PSK-4,8,16 by using only the optimized PSK-32 in conjunction with a single tuning parameter that controlled where the constellation points should be selected from on the locus of FIG. 19. Such an approach would couple a highly rate adaptive channel code that could vary its rate, for instance, rate 4/5 to achieve and overall (code plus optimized PSK-32 modulation) spectral efficiency of 4 bits per symbol, down to 1/5 to achieve an overall spectral efficiency of 1 bit per symbol. Such an adaptive modulation and coding system could essentially perform on the optimal continuum represented by the rightmost contour of FIG. 18.

Adaptive Rate Design

In the previous example spectrally adaptive use of PSK-32 was described. Techniques similar to this can be applied for other capacity optimized constellations across the link between a transmitter and receiver. For instance, in the case where a system implements quality of service it is possible to instruct a transmitter to increase or decrease spectral efficiency on demand. In the context of the current invention a capacity optimized constellation designed precisely for the target spectral efficiency can be loaded into the transmit mapper in conjunction with a code rate selection that meets the end user rate goal. When such a modulation/code rate change occurred a message could propagated to the receiver so that the receiver, in anticipation of the change, could select a demapper/decoder configuration in order to match the new transmit-side configuration.

Conversely, the receiver could implement a quality of performance based optimized constellation/code rate pair control mechanism. Such an approach would include some form of receiver quality measure. This could be the receiver's estimate of SNR or bit error rate. Take for example the case where bit error rate was above some acceptable threshold. In this case, via a backchannel, the receiver could request that the transmitter lower the spectral efficiency of the link by swapping to an alternate capacity optimized constellation/code rate pair in the coder and mapper modules and then signaling the receiver to swap in the complementary pairing in the demapper/decoder modules.

Geometrically Shaped QAM Constellations

Quadrature amplitude modulation (QAM) constellations can be constructed by orthogonalizing PAM constellations into QAM inphase and quadrature components. Constellations constructed in this way can be attractive in many applications because they have low-complexity demappers.

Figure 21:
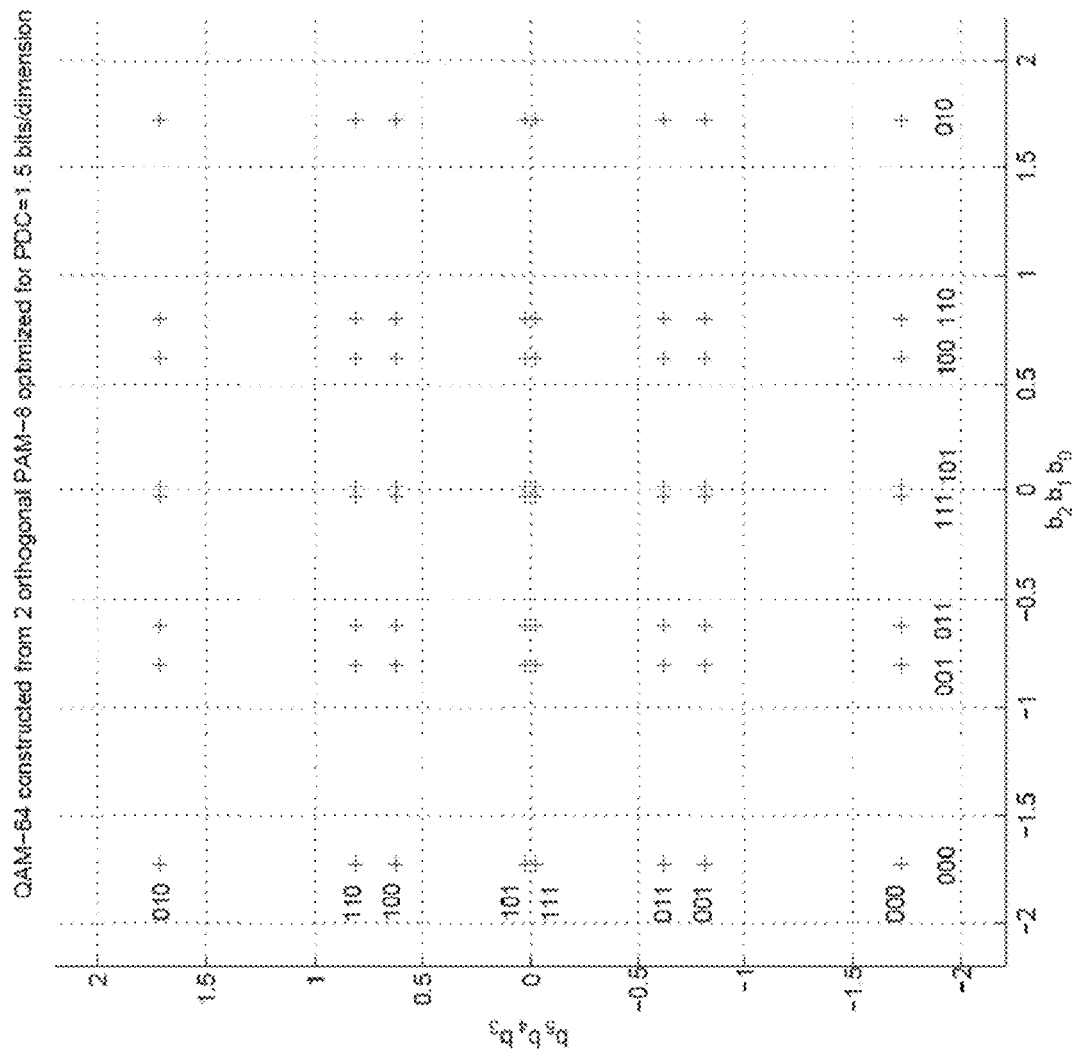
FIG. 21 illustrates a QAM-64 constructed from orthogonal Cartesian product of two PD optimized PAM-8 constellations in accordance with an embodiment of the invention.
Figure 22A:
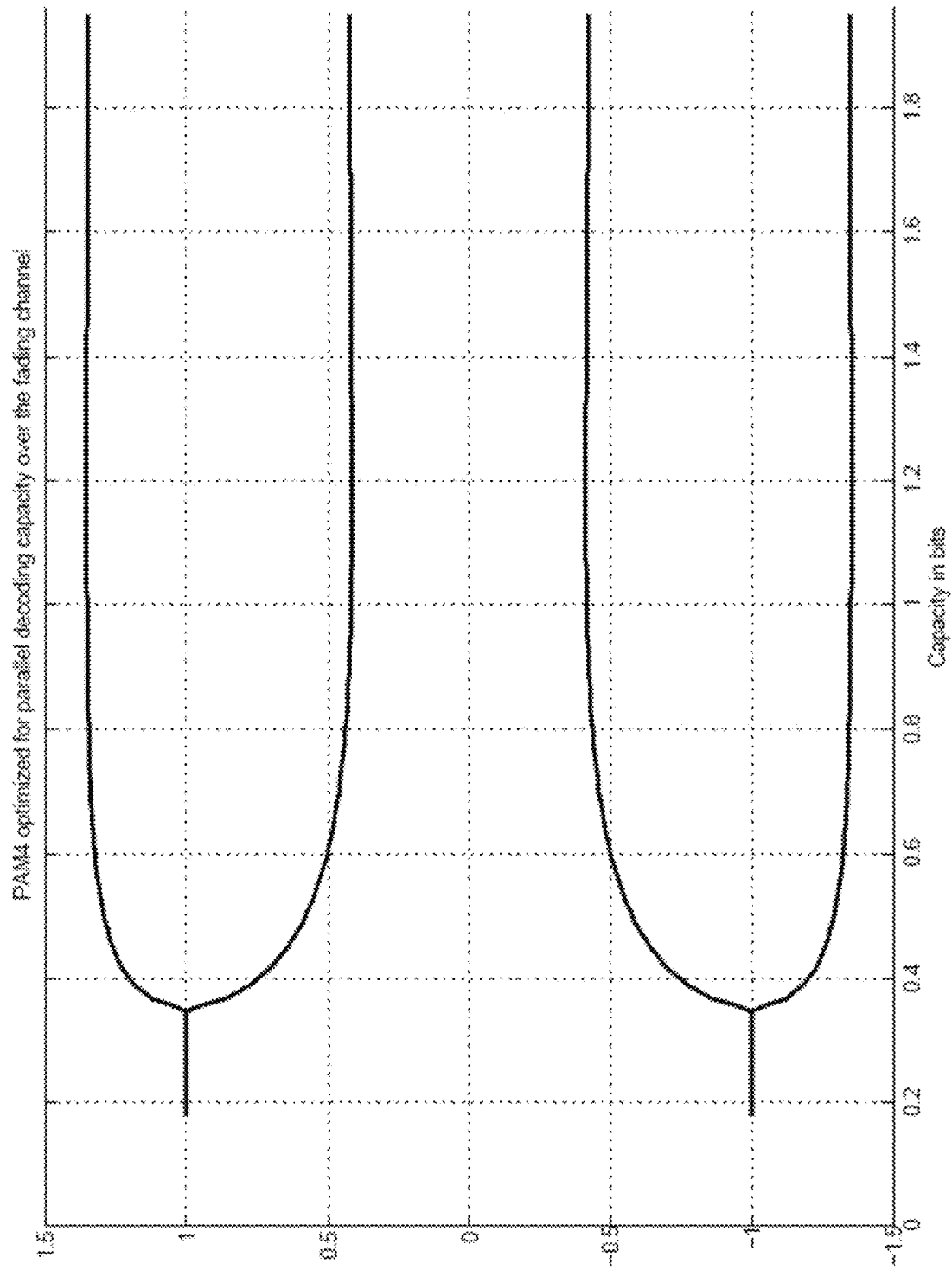
FIGS. 22a and 22b are locus plots showing the location of constellation points of a PAM-4 constellation optimized for PD capacity over a fading channel versus user bit rate per dimension and versus SNR.
Figure 22B:
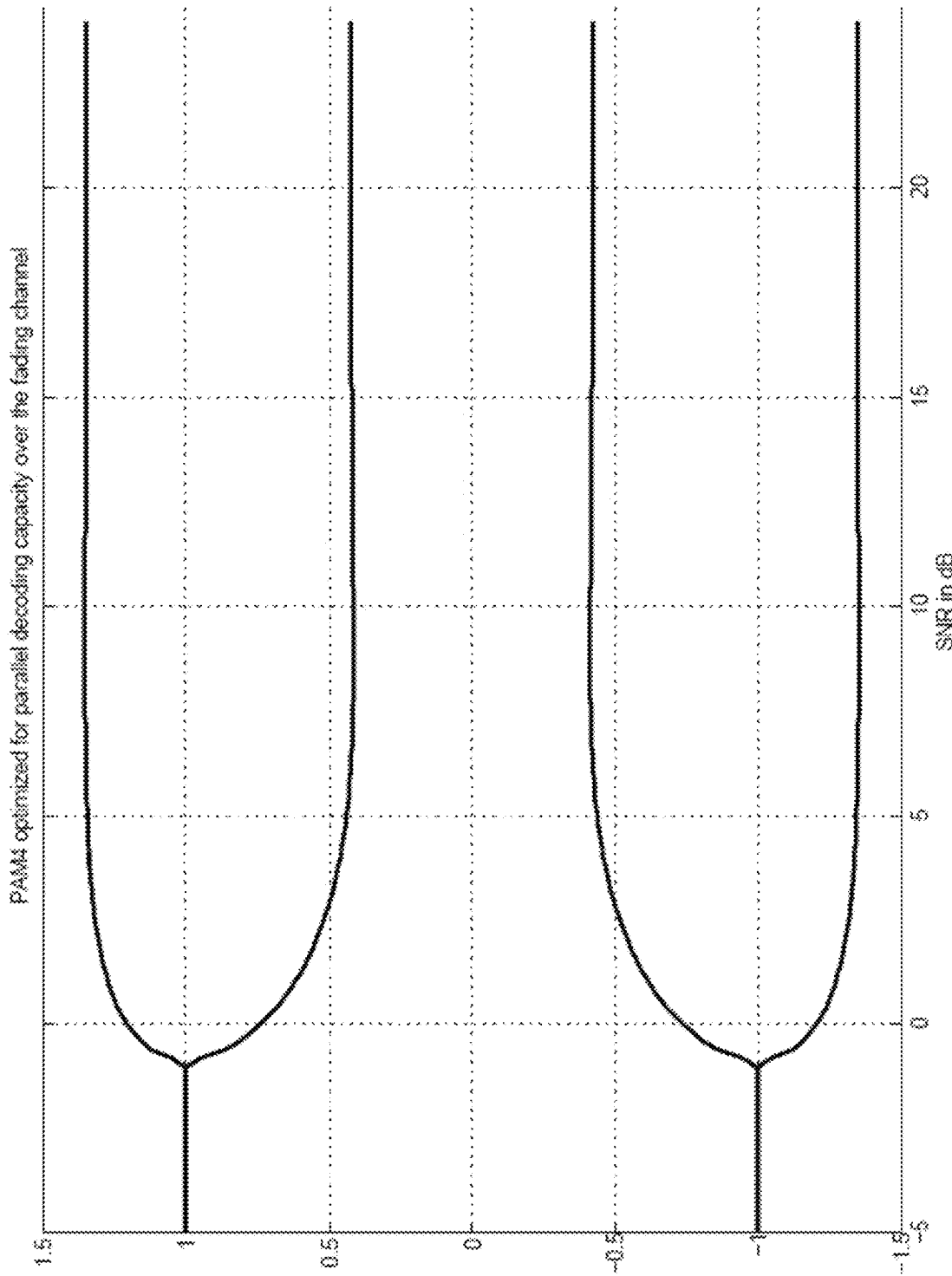
Figure 23A:
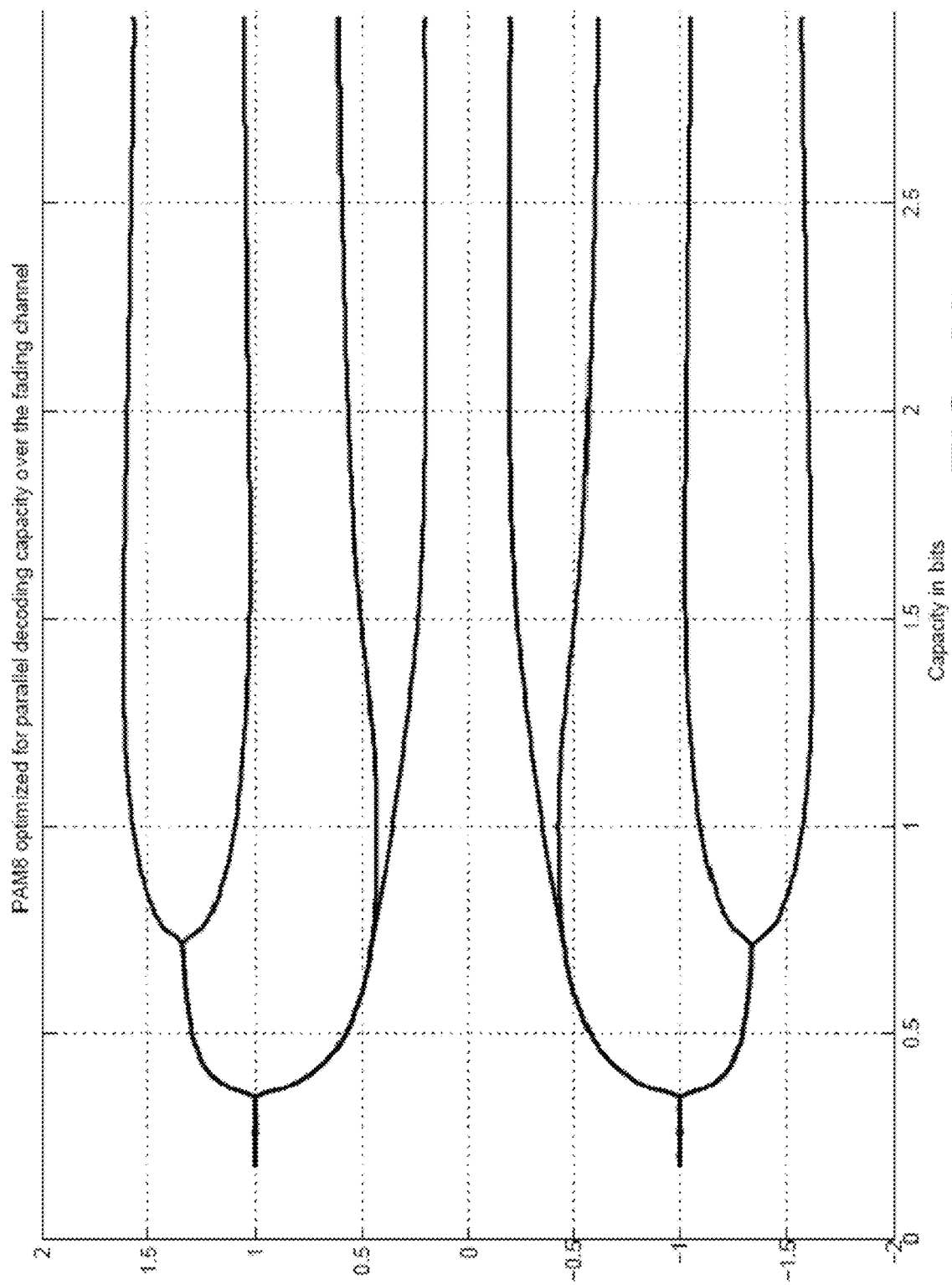
FIGS. 23a and 23b are locus plots showing the location of constellation points of a PAM-8 constellation optimized for PD capacity over a fading channel versus user bit rate per dimension and versus SNR.
Figure 23B:
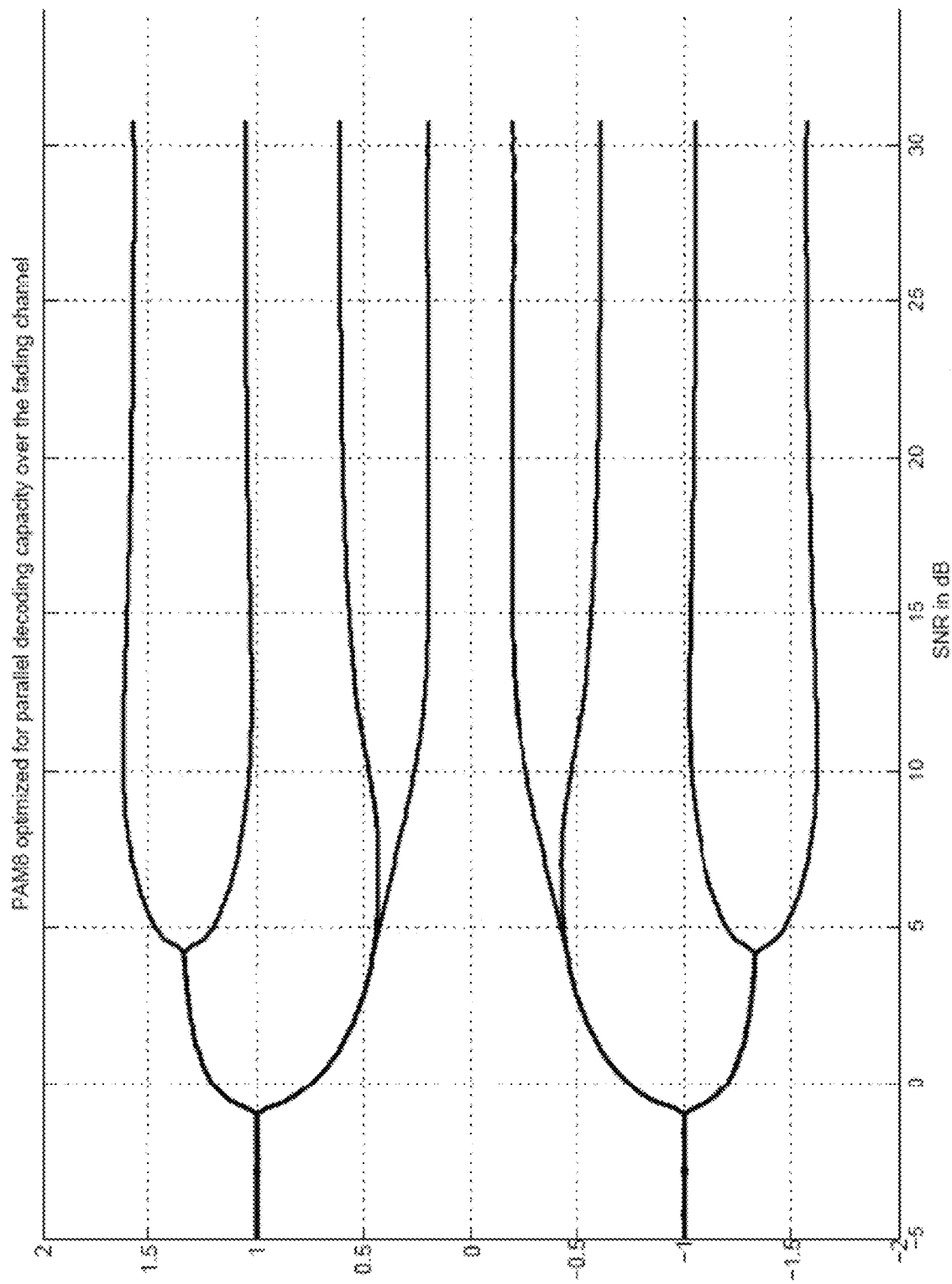
Figure 24A:
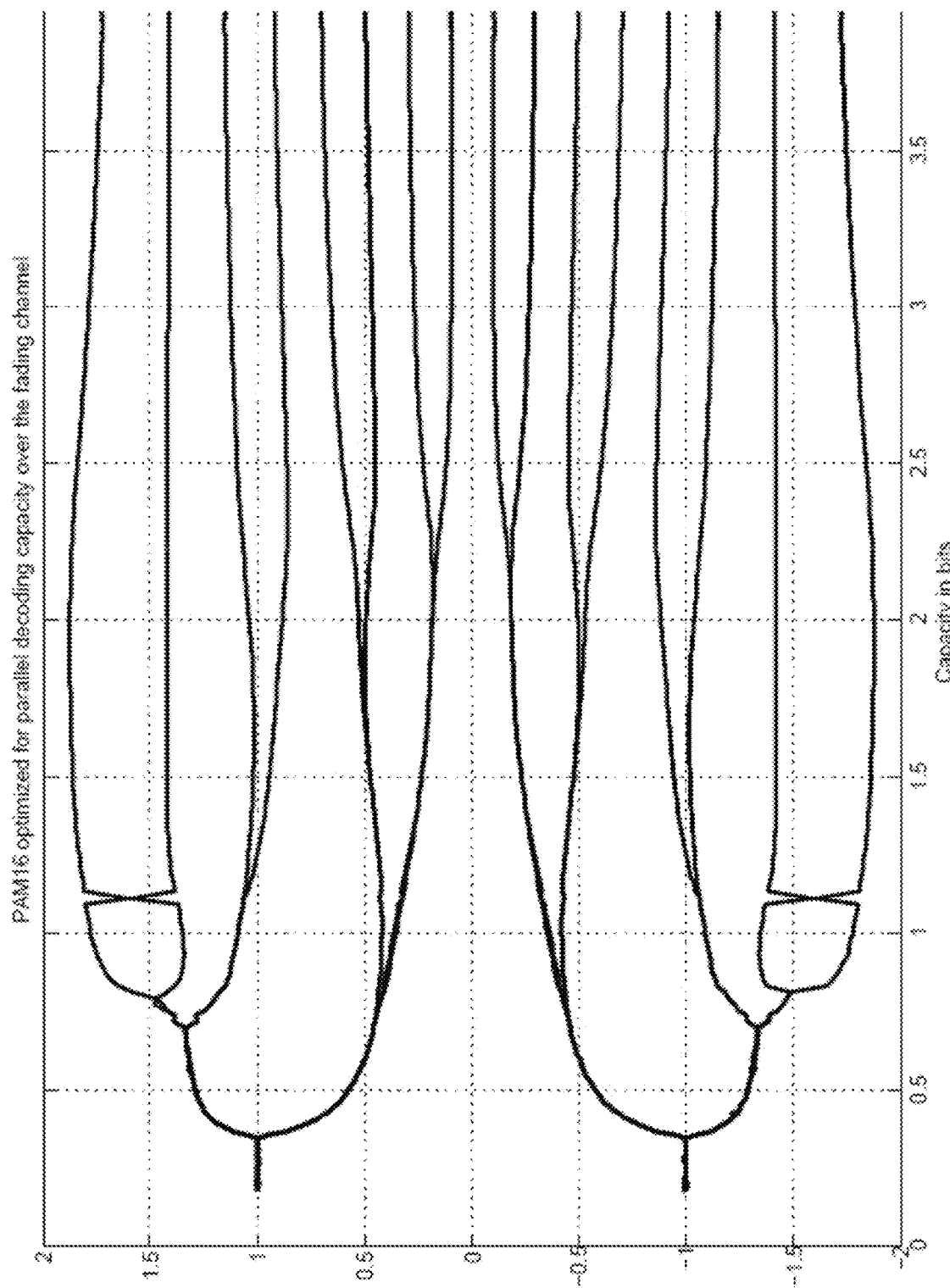
FIGS. 24a and 24b are locus plots showing the location of constellation points of a PAM-16 constellation optimized for PD capacity over a fading channel versus user bit rate per dimension and versus SNR.
Figure 24B:
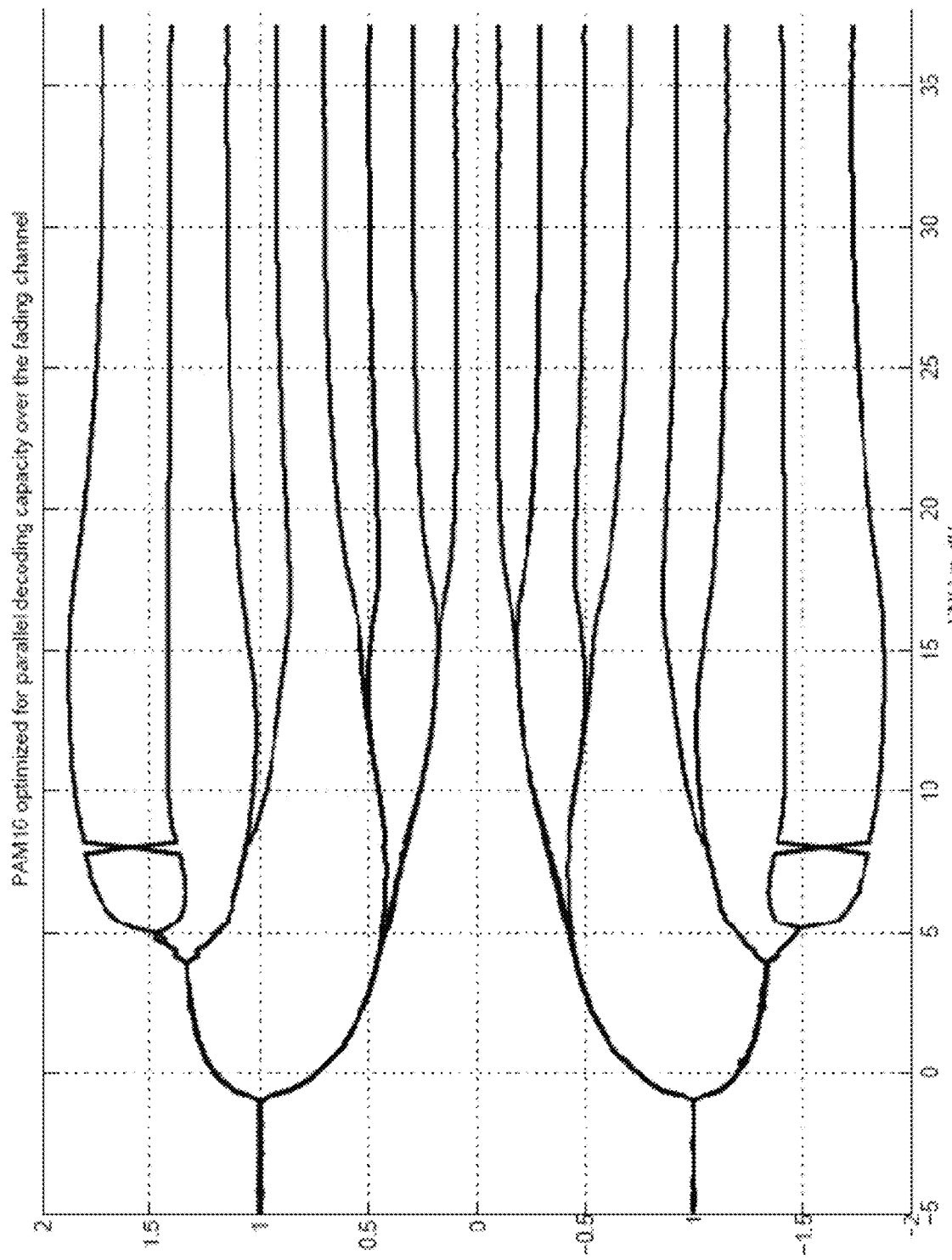

In FIG. 21 we provide an example of a Quadrature Amplitude Modulation constellation constructed from a Pulse Amplitude Modulation constellation. The illustrated embodiment was constructed using a PAM-8 constellation optimized for PD capacity at user bit rate per dimension of 1.5 bits (corresponds to an SNR of 9.0 dB) (see FIG. 13b). The label-point pairs in this PAM-8 constellation are {(000, −1.72), (001, −0.81), (010, 1.72), (011,−0.62), (100, 0.62), (101, 0.02), (110, 0.81), (111, −0.02)}. Examination of FIG. 21 shows that the QAM constellation construction is achieved by replicating a complete set of PAM-8 points in the quadrature dimension for each of the 8 PAM-8 points in the in-phase dimension. Labeling is achieved by assigning the PAM-8 labels to the LSB range on the in-phase dimension and to the MSB range on the quadrature dimension. The resulting 8×8 outer product forms a highly structured QAM-64 for which very low-complexity de-mappers can be constructed. Due to the orthogonality of the in-phase and quadrature components the capacity characteristics of the resulting QAM-64 constellation are identical to that of the PAM-8 constellation on a per-dimension basis.

N-Dimensional Constellation Optimization

Rather than designing constellations in 1-D (PAM for instance) and then extending to 2-D (QAM), it is possible to take direct advantage in the optimization step of the additional degree of freedom presented by an extra spatial dimension. In general it is possible to design N-dimensional constellations and associated labelings. The complexity of the optimization step grows exponentially in the number of dimensions as does the complexity of the resulting receiver de-mapper. Such constructions constitute embodiments of the invention and simply require more 'run-time' to produce.

Capacity Optimized Constellations for Fading Channels

Similar processes to those outlined above can be used to design capacity optimized constellations for fading channels in accordance with embodiments of the invention. The processes are essentially the same with the exception that the manner in which capacity is calculated is modified to account for the fading channel. A fading channel can be described using the following equation:

$$Y=a(t)\cdot X+N$$

where X is the transmitted signal, N is an additive white Gaussian noise signal and a(t) is the fading distribution, which is a function of time.

In the case of a fading channel, the instantaneous SNR at the receiver changes according to a fading distribution. The fading distribution is Rayleigh and has the property that the average SNR of the system remains the same as in the case of the AWGN channel, $E[X^2]/E[N^2]$. Therefore, the capacity of the fading channel can be computed by taking the expectation of AWGN capacity, at a given average SNR, over the Rayleigh fading distribution of a that drives the distribution of the instantaneous SNR.

Many fading channels follow a Rayleigh distribution. FIGS. 22a-24b are locus plots of PAM-4, 8, and 16 constellations that have been optimized for PD capacity on a Rayleigh fading channel. Locus plots versus user bit rate per dimension and versus SNR are provided. Similar processes can be used to obtain capacity optimized constellations that are optimized using other capacity measures, such as joint capacity, and/or using different modulation schemes.

What is claimed is:

1. A communication system, comprising:
   a transmitter capable of transmitting signals via a communication channel having a channel signal-to-noise ratio, wherein the transmitter comprises:
   a coder capable of receiving bits and outputting encoded bits using a Low Density Parity Check (LDPC) code having a code rate;
   a mapper, coupled to the coder, capable of mapping the encoded bits to symbols in a symbol constellation selected from a set of symbol constellations; and
   a modulator, coupled to the mapper, capable of outputting a signal for transmission via the communication channel based upon the mapped symbols;
   wherein each symbol constellation in the set of symbol constellations is utilized in combination with an associated code rate;
   wherein the set of symbol constellations comprises a group of symbol constellations, where each symbol constellation in the group of symbol constellations has the same number of constellation points that have amplitude and phase values;
   wherein the group of symbol constellations includes:
   a symbol constellation in which constellation points that share an amplitude value are evenly spaced with respect to phase; and
   a plurality of symbol constellations, where:
   each of the associated code rates utilized in combination with each of the symbol constellations in the plurality of symbol constellations is different from the associated code rate utilized by any other symbol constellation in the plurality of symbol constellations; and
   each symbol constellation in the plurality of symbol constellations comprises
   constellation points that have a shared amplitude value,
   where the constellation points that have the shared amplitude value are unevenly spaced with respect to phase; and
   wherein the transmitter is capable of receiving a request to modulate the signals transmitted via the communication channel using a specific symbol constellation from the set of symbol constellations and a specific code rate.

2. The communication system of claim 1, wherein:
   each symbol constellation in the set of symbol constellations is associated with a different SNR;
   the symbol constellations within the group of symbol constellations contain sixteen constellation points; and
   each symbol constellation in the plurality of symbol constellations that comprise constellation points that have a shared amplitude value and are unevenly spaced with respect to phase is associated with an SNR less than 14.8 dB.

3. The communication system of claim 1, wherein:
   each symbol constellation in the set of symbol constellations is associated with a different SNR;
   the symbol constellations within the group of symbol constellations are thirty-two point symbol constellations;
   each symbol constellation in the plurality of symbol constellations that comprise constellation points that have a shared amplitude value and are unevenly spaced with respect to phase is associated with an SNR less than 20.4 dB.

4. The communication system of claim 3, wherein the set of symbol constellations further comprises at least one eight point symbol constellation, where:
   the at least one eight point symbol constellation comprises constellation points that have a shared amplitude value and the constellation points that have the shared amplitude value are unevenly spaced with respect to phase; and
   the at least one eight point symbol constellation is associated with an SNR less than 8.4 dB.

5. The communication system of claim 1, wherein:
   each symbol constellation in the set of symbol constellations is associated with a different SNR; and
   at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

6. The communication system of claim 1, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

7. The communication system of claim 1, wherein each symbol constellation in the set of symbol constellations is a multi-dimensional symbol constellation having multiple degrees of freedom.

8. The communication system of claim 1, wherein the request to modulate the signals transmitted via the communication channel using the specific symbol constellation and the specific code rate is based on a measure of a quality of the communication channel by a remote receiver.

9. The communication system of claim 8, wherein the quality measure is the SNR of the communication channel.

10. The communication system of claim 8, wherein the quality measure is the bit error rate (BER).

11. The communication system of claim 1, wherein the transmitter is capable of substituting the set of symbol constellations by an upgrade to at least one of the transmitter software and firmware.

12. The communication system of claim 1, further comprising:
a receiver that is capable of receiving signals via the communication channel at a channel signal-to-noise ratio (SNR) at the receiver, wherein the receiver comprises:
a demodulator capable of demodulating a received signal into a demodulated signal;
a demapper, coupled to the demodulator, capable of determining likelihoods using the demodulated signal and the symbol constellation selected from the set of symbol constellations; and
a decoder, coupled to the demapper, capable of using the likelihoods determined by the demapper to provide a sequence of received bits based upon the LDPC code.

13. The communication system of claim 1, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

14. The communication system of claim 1, wherein:
each symbol constellation in the set of symbol constellations is associated with a different SNR;
the symbol constellations within the group of symbol constellations are eight point symbol constellations; and
each symbol constellation in the plurality of constellations that comprise constellation points that have a shared amplitude value and are unevenly spaced with respect to phase is associated with an SNR less than 8.4 dB.

15. The communication system of claim 1, wherein the likelihoods determined by the demapper are bit likelihoods.

16. The communication system of claim 1, wherein the likelihoods determined by the demapper are symbol likelihoods.

17. A communication system, comprising:
a transmitter that transmits signals via a communication channel having a channel signal-to-noise ratio, wherein the transmitter comprises:
a coder that receives bits and outputs encoded bits using a Low Density Parity Check (LDPC) code having a code rate;
a mapper that maps the encoded bits to symbols in a symbol constellation selected from a set of symbol constellations; and
a modulator that outputs a signal for transmission via the communication channel based upon the mapped symbols;
wherein the mapper is interposed between the modulator and the coder and the mapper receives information from the coder and provides information to the modulator;
wherein each symbol constellation in the set of symbol constellations is utilized in combination with an associated code rate;
wherein the set of symbol constellations comprises a group of symbol constellations, where each symbol constellation in the group of symbol constellations has the same number of constellation points that have amplitude and phase values;
wherein the group of symbol constellations includes:
a symbol constellation in which constellation points that share an amplitude value are evenly spaced with respect to phase; and
a plurality of symbol constellations, where:
each of the associated code rates utilized in combination with each of the symbol constellations in the plurality of symbol constellations is different from the associated code rate utilized by any other symbol constellation in the plurality of symbol constellations; and
each symbol constellation in the plurality of symbol constellations comprises
constellation points that have a shared amplitude value,
where the constellation points that have the shared amplitude value are unevenly spaced with respect to phase; and
wherein the transmitter receives a request to modulate the signals transmitted via the communication channel using a specific symbol constellation from the set of symbol constellations and a specific code rate.

18. The communication system of claim 17, wherein:
each symbol constellation in the set of symbol constellations is associated with a different SNR;
the symbol constellations within the group of symbol constellations contain sixteen constellation points; and
each symbol constellation in the plurality of symbol constellations that comprise constellation points that have a shared amplitude value and are unevenly spaced with respect to phase is associated with an SNR less than 14.8 dB.

19. The communication system of claim 17, wherein:
each symbol constellation in the set of symbol constellations is associated with a different SNR;
the symbol constellations within the group of symbol constellations are thirty-two point symbol constellations;
each symbol constellation in the plurality of symbol constellations that comprise constellation points that have a shared amplitude value and are unevenly spaced with respect to phase is associated with an SNR less than 20.4 dB.

20. The communication system of claim 19, wherein the set of symbol constellations further comprises at least one eight point symbol constellation, where:
the at least one eight point symbol constellation comprises constellation points that have a shared amplitude value and the constellation points that have the shared amplitude value are unevenly spaced with respect to phase; and the at least one eight point symbol constellation is associated with an SNR less than 8.4 dB.

21. The communication system of claim 17, wherein:
each symbol constellation in the set of symbol constellations is associated with a different SNR; and
at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

22. The communication system of claim 17, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

23. The communication system of claim 17, wherein each symbol constellation in the set of symbol constellations is a multi-dimensional symbol constellation having multiple degrees of freedom.

24. The communication system of claim 17, wherein the request to modulate the signals transmitted via the communication channel using the specific symbol constellation and the specific code rate is based on a measure of a quality of the communication channel by a remote receiver.

25. The communication system of claim 24, wherein the quality measure is the SNR of the communication channel.

26. The communication system of claim 24, wherein the quality measure is the bit error rate (BER).

27. The communication system of claim 17, wherein the transmitter can substitute the set of symbol constellations by an upgrade to at least one of the transmitter software and firmware.

28. The communication system of claim 17, further comprising:
a receiver that receives signals via the communication channel at a channel signal-to-noise ratio (SNR) at the receiver, wherein the receiver comprises:
a demodulator that demodulates a received signal into a demodulated signal;
a demapper that determines likelihoods using the demodulated signal and the symbol constellation selected from the set of symbol constellations; and
a decoder that uses the likelihoods determined by the demapper to provide a sequence of received bits based upon the LDPC code;
wherein the demapper is interposed between the demodulator and the decoder and the demapper receives information from the demodulator and provides information to the decoder.

29. The communication system of claim 17, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

30. The communication system of claim 17, wherein:
each symbol constellation in the set of symbol constellations is associated with a different SNR;
the symbol constellations within the group of symbol constellations are eight point symbol constellations; and
each symbol constellation in the plurality of constellations that comprise constellation points that have a shared amplitude value and are unevenly spaced with respect to phase is associated with an SNR less than 8.4 dB.

31. The communication system of claim 17, wherein the likelihoods determined by the demapper are bit likelihoods.

32. The communication system of claim 17, wherein the likelihoods determined by the demapper are symbol likelihoods.

33. A communication system, comprising:
a transmitter that transmits signals via a communication channel having a channel signal-to-noise ratio, wherein the transmitter uses a symbol constellation selected from a set of symbol constellations to transform bits encoded using a low density parity check (LDPC) code having a code rate into the transmitted signals;
wherein each symbol constellation in the set of symbol constellations is utilized in combination with an associated code rate;
wherein the set of symbol constellations comprises a group of symbol constellations, where each symbol constellation in the group of symbol constellations has the same number of constellation points that have amplitude and phase values;
wherein the group of symbol constellations includes:
a symbol constellation in which constellation points that share an amplitude value are evenly spaced with respect to phase; and
a plurality of symbol constellations, where:
each of the associated code rates utilized in combination with each of the symbol constellations in the plurality of symbol constellations is different from the associated code rate utilized by any other symbol constellation in the plurality of symbol constellations; and
each symbol constellation in the plurality of symbol constellations comprises
constellation points that have a shared amplitude value,
where the constellation points that have the shared amplitude value are unevenly spaced with respect to phase; and
wherein the transmitter receives a request to modulate the signals transmitted via the communication channel using a specific symbol constellation from the set of symbol constellations and a specific code rate.

34. The communication system of claim 33, wherein:
each symbol constellation in the set of symbol constellations is associated with a different SNR;
the symbol constellations within the group of symbol constellations contain sixteen constellation points; and
each symbol constellation in the plurality of symbol constellations that comprise constellation points that have a shared amplitude value and are unevenly spaced with respect to phase is associated with an SNR less than 14.8 dB.

35. The communication system of claim 33, wherein:
- each symbol constellation in the set of symbol constellations is associated with a different SNR;
- the symbol constellations within the group of symbol constellations are thirty-two point symbol constellations;
- each symbol constellation in the plurality of symbol constellations that comprise constellation points that have a shared amplitude value and are unevenly spaced with respect to phase is associated with an SNR less than 20.4 dB.

36. The communication system of claim 35, wherein the set of symbol constellations further comprises at least one eight point symbol constellation, where:
- the at least one eight point symbol constellation comprises constellation points that have a shared amplitude value and the constellation points that have the shared amplitude value are unevenly spaced with respect to phase; and
- the at least one eight point symbol constellation is associated with an SNR less than 8.4 dB.

37. The communication system of claim 33, wherein:
- each symbol constellation in the set of symbol constellations is associated with a different SNR; and
- at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

38. The communication system of claim 33, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

39. The communication system of claim 33, wherein each symbol constellation in the set of symbol constellations is a multi-dimensional symbol constellation having multiple degrees of freedom.

40. The communication system of claim 33, wherein the request to modulate the signals transmitted via the communication channel using the specific symbol constellation and the specific code rate is based on a measure of a quality of the communication channel by a remote receiver.

41. The communication system of claim 40, wherein the quality measure is the SNR of the communication channel.

42. The communication system of claim 40,, wherein the quality measure is the bit error rate (BER).

43. The communication system of claim 33, wherein the transmitter can substitute the set of symbol constellations by an upgrade to at least one of the transmitter software and firmware.

44. The communication system of claim 33, further comprising a receiver that receives signals via the communication channel at a channel signal-to-noise ratio (SNR) at the receiver, wherein the receiver uses the symbol constellation selected from the set of symbol constellations to transform the received signals into received bits.

45. The communication system of claim 33, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

46. The communication system of claim 33, wherein:
- each symbol constellation in the set of symbol constellations is associated with a different SNR;
- the symbol constellations within the group of symbol constellations are eight point symbol constellations; and
- each symbol constellation in the plurality of constellations that comprise constellation points that have a shared amplitude value and are unevenly spaced with respect to phase is associated with an SNR less than 8.4 dB.

47. A communication system, comprising:
- a transmitter capable of transmitting signals via a communication channel, wherein the transmitter comprises:
  - a coder capable of receiving bits and outputting encoded bits using a Low Density Parity Check (LDPC) code having a code rate;
  - a mapper, coupled to the coder, capable of mapping the encoded bits to symbols in a symbol constellation selected from a set of symbol constellations; and
  - a modulator, coupled to the mapper, capable of outputting a signal for transmission via the communication channel based upon the mapped symbols;
- a receiver that is capable of receiving the signal transmitted by the transmitter via the communication channel at a channel signal-to-noise ratio (SNR) at the receiver, wherein the receiver comprises:
  - a demodulator capable of demodulating the received signal into a demodulated signal;
  - a demapper, coupled to the demodulator, capable of determining likelihoods using the demodulated signal and the symbol constellation selected from the set of symbol constellations; and
  - a decoder, coupled to the demapper, capable of using the likelihoods determined by the demapper to provide a sequence of received bits based upon the LDPC code;
- wherein each symbol constellation in the set of symbol constellations is utilized in combination with an associated code rate;
- wherein the set of symbol constellations comprises a group of symbol constellations, where each symbol constellation in the group of symbol constellations has the same number of constellation points that have amplitude and phase values;
- wherein the group of symbol constellations includes:
  - a symbol constellation in which constellation points that share an amplitude value are evenly spaced with respect to phase; and
  - a plurality of symbol constellations, where:
    - each of the associated code rates utilized in combination with each of the symbol constellations in the plurality of symbol constellations is different from the associated code rate utilized by any other symbol constellation in the plurality of symbol constellations; and
    - each symbol constellation in the plurality of symbol constellations comprises constellation points that have a shared amplitude value, where the constellation points that have the shared amplitude value are unevenly spaced with respect to phase;
- wherein the receiver is capable of sending a request to modulate signals transmitted by the transmitter via the communication channel using a specific symbol constellation from the set of symbol constellations and a specific code rate; and wherein the transmitter is capable of receiving the request from the receiver to modulate signals transmitted via the communication channel using the specific symbol constellation from the set of symbol constellations and the specific code rate.

48. The communication system of claim 47, wherein:
each symbol constellation in the set of symbol constellations is associated with a different SNR;
the symbol constellations within the group of symbol constellations contain sixteen constellation points; and
each symbol constellation in the plurality of symbol constellations that comprise constellation points that have a shared amplitude value and are unevenly spaced with respect to phase is associated with an SNR less than 14.8 dB.

49. The communication system of claim 47, wherein:
each symbol constellation in the set of symbol constellations is associated with a different SNR;
the symbol constellations within the group of symbol constellations are thirty-two point symbol constellations;
each symbol constellation in the plurality of symbol constellations that comprise constellation points that have a shared amplitude value and are unevenly spaced with respect to phase is associated with an SNR less than 20.4 dB.

50. The communication system of claim 49, wherein the set of symbol constellations further comprises at least one eight point symbol constellation, where
the at least one eight point symbol constellation comprises constellation points that have a shared amplitude value and the constellation points that have the shared amplitude value are unevenly spaced with respect to phase; and
the at least one eight point symbol constellation is associated with an SNR less than 8.4 dB.

51. The communication system of claim 47, wherein:
each symbol constellation in the set of symbol constellations is associated with a different SNR;
the symbol constellations within the group of symbol constellations are eight point symbol constellations; and
each symbol constellation in the plurality of constellations that comprise constellation points that have a shared amplitude value and are unevenly spaced with respect to phase is associated with an SNR less than 8.4 dB.

52. The communication system of claim 47, wherein:
each symbol constellation in the set of symbol constellations is associated with a different SNR; and
at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

53. The communication system of claim 47, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

54. The communication system of claim 47, wherein each symbol constellation in the set of symbol constellations is a multi-dimensional symbol constellation having multiple degrees of freedom.

55. The communication system of claim 47, wherein the specific symbol constellation and the specific code rate are determined by the receiver based on a measure of a quality of the communication channel made by the receiver.

56. The communication system of claim 55, wherein the quality measure is the SNR of the communication channel.

57. The communication system of claim 55, wherein the quality measure is the bit error rate (BER).

58. The communication system of claim 47, wherein the transmitter is capable of substituting the set of symbol constellations by an upgrade to at least one of the transmitter software and firmware.

59. The communication system of claim 47, wherein the receiver is capable of substituting the set of symbol constellations by an upgrade to at least one of the receiver software and firmware.

60. The communication system of claim 47, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

61. The communication system of claim 47, wherein the likelihoods determined by the demapper are bit likelihoods.

62. The communication system of claim 47, wherein the likelihoods determined by the demapper are symbol likelihoods.

63. A communication system, comprising:
a transmitter that transmits signals via a communication channel, wherein the transmitter comprises:
a coder that receives bits and outputs encoded bits using a Low Density Parity Check (LDPC) code having a code rate;
a mapper that maps the encoded bits to symbols in a symbol constellation selected from a set of symbol constellations; and
a modulator that outputs a signal for transmission via the communication channel based upon the mapped symbols;
wherein the mapper is interposed between the modulator and the coder and the mapper receives information from the coder and provides information to the modulator; and
a receiver that receives the signal transmitted by the transmitter via the communication channel at a channel signal-to-noise ratio (SNR) at the receiver, wherein the receiver comprises:
a demodulator that demodulates the received signal into a demodulated signal;
a demapper that determines likelihoods using the demodulated signal and the symbol constellation selected from the set of symbol constellations; and
a decoder that uses the likelihoods determined by the demapper to provide a sequence of received bits based upon the LDPC code;
wherein the demapper is interposed between the demodulator and the decoder and the demapper receives information from the demodulator and provides information to the decoder;

wherein each symbol constellation in the set of symbol constellations is utilized in combination with an associated code rate;

wherein the set of symbol constellations comprises a group of symbol constellations, where each symbol constellation in the group of symbol constellations has the same number of constellation points that have amplitude and phase values;

wherein the group of symbol constellations includes:
  a symbol constellation in which constellation points that share an amplitude value are evenly spaced with respect to phase; and
  a plurality of symbol constellations, where:
    each of the associated code rates utilized in combination with each of the symbol constellations in the plurality of symbol constellations is different from the associated code rate utilized by any other symbol constellation in the plurality of symbol constellations; and
    each symbol constellation in the plurality of symbol constellations comprises constellation points that have a shared amplitude value, where the constellation points that have the shared amplitude value are unevenly spaced with respect to phase;

wherein the receiver is capable of sending a request to modulate signals transmitted by the transmitter via the communication channel using a specific symbol constellation from the set of symbol constellations and a specific code rate; and wherein the transmitter is capable of receiving the request from the receiver to modulate signals transmitted via the communication channel using the specific symbol constellation from the set of symbol constellations and the specific code rate.

64. The communication system of claim 63, wherein:
each symbol constellation in the set of symbol constellations is associated with a different SNR;
the symbol constellations within the group of symbol constellations contain sixteen constellation points; and
each symbol constellation in the plurality of symbol constellations that comprise constellation points that have a shared amplitude value and are unevenly spaced with respect to phase is associated with an SNR less than 14.8 dB.

65. The communication system of claim 63, wherein:
each symbol constellation in the set of symbol constellations is associated with a different SNR;
the symbol constellations within the group of symbol constellations are thirty-two point symbol constellations;
each symbol constellation in the plurality of symbol constellations that comprise constellation points that have a shared amplitude value and are unevenly spaced with respect to phase is associated with an SNR less than 20.4 dB.

66. The communication system of claim 65, wherein the set of symbol constellations further comprises at least one eight point symbol constellation, where
the at least one eight point symbol constellation comprises constellation points that have a shared amplitude value and the constellation points that have the shared amplitude value are unevenly spaced with respect to phase; and
the at least one eight point symbol constellation is associated with an SNR less than 8.4 dB.

67. The communication system of claim 63, wherein:
each symbol constellation in the set of symbol constellations is associated with a different SNR;
the symbol constellations within the group of symbol constellations are eight point symbol constellations; and
each symbol constellation in the plurality of constellations that comprise constellation points that have a shared amplitude value and are unevenly spaced with respect to phase is associated with an SNR less than 8.4 dB.

68. The communication system of claim 63, wherein:
each symbol constellation in the set of symbol constellations is associated with a different SNR; and
at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

69. The communication system of claim 63, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

70. The communication system of claim 63, wherein each symbol constellation in the set of symbol constellations is a multi-dimensional symbol constellation having multiple degrees of freedom.

71. The communication system of claim 63, wherein the specific symbol constellation and the specific code rate are determined by the receiver based on a measure of a quality of the communication channel made by the receiver.

72. The communication system of claim 71, wherein the quality measure is the SNR of the communication channel.

73. The communication system of claim 71, wherein the quality measure is the bit error rate (BER).

74. The communication system of claim 63, wherein the transmitter is capable of substituting the set of symbol constellations by an upgrade to at least one of the transmitter software and firmware.

75. The communication system of claim 63, wherein the receiver is capable of substituting the set of symbol constellations by an upgrade to at least one of the receiver software and firmware.

76. The communication system of claim 63, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

77. The communication system of claim 63, wherein the likelihoods determined by the demapper are bit likelihoods.

78. The communication system of claim 63, wherein the likelihoods determined by the demapper are symbol likelihoods.

79. A communication system, comprising:
a transmitter that transmits signals via a communication channel, wherein the transmitter uses a symbol constellation selected from a set of symbol constellations to transform bits encoded using a low density parity check (LDPC) code having a code rate into the transmitted signals;
a receiver that receives signals via the communication channel at a channel signal-to-noise ratio (SNR) at the receiver, wherein the receiver uses the symbol constellation selected from the set of symbol constellations and the LDPC code to transform the received signals into received bits;
wherein each symbol constellation in the set of symbol constellations is utilized in combination with an associated code rate;
wherein the set of symbol constellations comprises a group of symbol constellations, where each symbol constellation in the group of symbol constellations has the same number of constellation points that have amplitude and phase values;
wherein the group of symbol constellations includes:
a symbol constellation in which constellation points that share an amplitude value are evenly spaced with respect to phase; and
a plurality of symbol constellations, where:
each of the associated code rates utilized in combination with each of the symbol constellations in the plurality of symbol constellations is different from the associated code rate utilized by any other symbol constellation in the plurality of symbol constellations; and
each symbol constellation in the plurality of symbol constellations comprises constellation points that have a shared amplitude value, where the constellation points that have the shared amplitude value are unevenly spaced with respect to phase;
wherein the receiver is capable of sending a request to modulate signals transmitted by the transmitter via the communication channel using a specific symbol constellation from the set of symbol constellations and a specific code rate; and
wherein the transmitter is capable of receiving the request from the receiver to modulate signals transmitted via the communication channel using the specific symbol constellation from the set of symbol constellations and the specific code rate.

80. The communication system of claim 79, wherein:
each symbol constellation in the set of symbol constellations is associated with a different SNR;
the symbol constellations within the group of symbol constellations contain sixteen constellation points; and
each symbol constellation in the plurality of symbol constellations that comprise constellation points that have a shared amplitude value and are unevenly spaced with respect to phase is associated with an SNR less than 14.8 dB.

81. The communication system of claim 79, wherein:
each symbol constellation in the set of symbol constellations is associated with a different SNR;
the symbol constellations within the group of symbol constellations are thirty-two point symbol constellations; and
each symbol constellation in the plurality of symbol constellations that comprise constellation points that have a shared amplitude value and are unevenly spaced with respect to phase is associated with an SNR less than 20.4 dB.

82. The communication system of claim 81, wherein the set of symbol constellations further comprises at least one eight point symbol constellation, where:
the at least one eight point symbol constellation comprises constellation points that have a shared amplitude value and the constellation points that have the shared amplitude value are unevenly spaced with respect to phase; and
the at least one eight point symbol constellation is associated with an SNR less than 8.4 dB.

83. The communication system of claim 79, wherein:
each symbol constellation in the set of symbol constellations is associated with a different SNR;
the symbol constellations within the group of symbol constellations are eight point symbol constellations; and
each symbol constellation in the plurality of constellations that comprise constellation points that have a shared amplitude value and are unevenly spaced with respect to phase is associated with an SNR less than 8.4 dB.

84. The communication system of claim 79, wherein:
each symbol constellation in the set of symbol constellations is associated with a different SNR; and
at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

85. The communication system of claim 79, wherein at least one symbol constellation in the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

86. The communication system of claim 79, wherein each symbol constellation in the set of symbol constellations is a multi-dimensional symbol constellation having multiple degrees of freedom.

87. The communication system of claim 79, wherein the specific symbol constellation and the specific code rate are determined by the receiver based on a measure of a quality of the communication channel made by the receiver.

88. The communication system of claim 87, wherein the quality measure is the SNR of the communication channel.

89. The communication system of claim 87, wherein the quality measure is the bit error rate (BER).

90. The communication system of claim 79, wherein the transmitter is capable of substituting the set of symbol constellations by an upgrade to at least one of the transmitter software and firmware.

91. The communication system of claim 79, wherein the receiver is capable of substituting the set of symbol constellations by an upgrade to at least one of the receiver software and firmware.

92. The communication system of claim 79, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

93. A communication system, comprising:
a receiver capable of receiving signals via a communication channel having a channel signal-to-noise ratio (SNR), wherein the receiver comprises:
a demodulator capable of demodulating a received signal into a demodulated signal;
a demapper, coupled to the demodulator, capable of determining likelihoods using the demodulated signal and a symbol constellation selected from a set of symbol constellations; and
a decoder, coupled to the demapper, capable of using the likelihoods determined by the demapper to provide a sequence of received bits based upon a low density parity check (LDPC) code having a code rate;
wherein each symbol constellation in the set of symbol constellations is utilized in combination with an associated code rate;
wherein the set of symbol constellations comprises a group of symbol constellations, where each symbol constellation in the group of symbol constellations has the same number of constellation points that have amplitude and phase values;
wherein the group of symbol constellations includes:
a symbol constellation in which constellation points that share an amplitude value are evenly spaced with respect to phase; and
a plurality of symbol constellations, where:
each of the associated code rates utilized in combination with each of the symbol constellations in the plurality of symbol constellations is different from the associated code rate utilized by any other symbol constellation in the plurality of symbol constellations; and
each symbol constellation in the plurality of symbol constellations comprises constellation points that have a shared amplitude value, where the constellation points that have the shared amplitude value are unevenly spaced with respect to phase; and
wherein the receiver is capable of sending a request to modulate the signals received via the communication channel using a specific symbol constellation from the set of symbol constellations and a specific code rate, where the specific symbol constellation and the specific code rate are determined by the receiver based on a measure of a quality of the communication channel made by the receiver.

94. The communication system of claim 93, wherein:
each symbol constellation in the set of symbol constellations is associated with a different SNR;
the symbol constellations within the group of symbol constellations contain sixteen constellation points; and
each symbol constellation in the plurality of symbol constellations that comprise constellation points that have a shared amplitude value and are unevenly spaced with respect to phase is associated with an SNR less than 14.8 dB.

95. The communication system of claim 93, wherein:
each of the set of symbol constellations is associated with a different SNR;
the symbol constellations within the group of symbol constellations are thirty-two point symbol constellations;

each symbol constellation in the plurality of symbol constellations that comprise constellation points that have a shared amplitude value and are unevenly spaced with respect to phase is associated with an SNR less than 20.4 dB.

96. The communication system of claim 95, wherein the set of symbol constellations further comprises at least one eight point symbol constellation, where:
the at least one eight point symbol constellation comprises constellation points that have a shared amplitude value and the constellation points that have the shared amplitude value are unevenly spaced with respect to phase; and
the at least one eight point symbol constellation is associated with an SNR less than 8.4 dB.

97. The communication system of claim 93, wherein:
each symbol constellation in the set of symbol constellations is associated with a different SNR;
the symbol constellations within the group of symbol constellations are eight point symbol constellations; and
each symbol constellation in the plurality of constellations that comprise constellation points that have a shared amplitude value and are unevenly spaced with respect to phase is associated with an SNR less than 8.4 dB.

98. The communication system of claim 93, wherein:
each symbol constellation in the set of symbol constellations is associated with a different SNR; and
at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

99. The communication system of claim 93, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

100. The communication system of claim 93, wherein each symbol constellation in the set of symbol constellations is a multi-dimensional symbol constellation having multiple degrees of freedom.

101. The communication system of claim 93, wherein:
the receiver is capable of determining the specific symbol constellation and the specific code rate from a plurality of predetermined LDPC code rate and symbol constellation pairs based at least in part on the quality measure;
each symbol constellation in the plurality of symbol constellations that comprise constellation points that have a shared amplitude value and are unevenly spaced with respect to phase is only included in one of the plurality of predetermined LDPC code rate and symbol constellation pairs; and
the receiver is capable of sending a request to a remote transmitter to use a selected LDPC code rate and symbol constellation pair.

102. The communication system of claim 93, wherein the receiver is capable of substituting the set of symbol constellations by an upgrade to at least one of the receiver software and firmware.

103. The communication system of claim 93, further comprising a transmitter capable of transmitting signals via the communication channel, where the transmitter comprises:
 a coder capable of receiving bits and outputting encoded bits using a Low Density Parity Check (LDPC) code;
 a mapper, coupled to the coder, capable of mapping the encoded bits to symbols in the selected symbol constellation; and
 a modulator, coupled to the mapper, capable of outputting a signal for transmission via the communication channel based upon symbols selected by the mapper.

104. The communication system of claim 93, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

105. The communication system of claim 93, wherein the likelihoods determined by the demapper are bit likelihoods.

106. The communication system of claim 93, wherein the likelihoods determined by the demapper are symbol likelihoods.

107. A communication system, comprising:
 a receiver that receives signals via a communication channel having a channel signal-to-noise ratio (SNR), wherein the receiver comprises:
  a demodulator that demodulates a received signal into a demodulated signal;
  a demapper that determines likelihoods using the demodulated signal and a symbol constellation selected from a set of symbol constellations; and
  a decoder that uses the likelihoods determined by the demapper to provide a sequence of received bits based upon a low density parity check (LDPC) code having a code rate;
 wherein each symbol constellation in the set of symbol constellations is utilized in combination with an associated code rate;
 wherein the set of symbol constellations comprises a group of symbol constellations, where each symbol constellation in the group of symbol constellations has the same number of constellation points that have amplitude and phase values;
 wherein the group of symbol constellations includes:
  a symbol constellation in which constellation points that share an amplitude value are evenly spaced with respect to phase; and
  a plurality of symbol constellations, where:
   each of the associated code rates utilized in combination with each of the symbol constellations in the plurality of symbol constellations is different from the associated code rate utilized by any other symbol constellation in the plurality of symbol constellations; and
   each symbol comprises in the plurality of symbol constellations comprises constellation points that have a shared amplitude value, where the constellation points that have the shared amplitude value are unevenly spaced with respect to phase; and
 wherein the receiver sends a request to modulate the signals received via the communication channel using a specific symbol constellation from the set of symbol constellations and a specific code rate, where the specific symbol constellation and the specific code rate are determined by the receiver based on a measure of quality of the communication channel made by the receiver.

108. The communication system of claim 107, wherein:
 each symbol constellation in the set of symbol constellations is associated with a different SNR;
 the symbol constellations within the group of symbol constellations contain sixteen constellation points; and
 each symbol constellation in the plurality of symbol constellations that comprise constellation points that have a shared amplitude value and are unevenly spaced with respect to phase is associated with an SNR less than 14.8 dB.

109. The communication system of claim 107, wherein:
 each symbol constellation in the set of symbol constellations is associated with a different SNR;
 the symbol constellations within the group of symbol constellations are thirty-two point symbol constellations; and
 each symbol constellation in the plurality of symbol constellations that comprise constellation points that have a shared amplitude value and are unevenly spaced with respect to phase is associated with an SNR less than 20.4 dB.

110. The communication system of claim 109, wherein the set of symbol constellations further comprises at least one eight point symbol constellation, where:
 the at least one eight point symbol constellation comprises constellation points that have a shared amplitude value and the constellation points that have the shared amplitude value are unevenly spaced with respect to phase; and
 the at least one eight point symbol constellation is associated with an SNR less than 8.4 dB.

111. The communication system of claim 107, wherein:
 each symbol constellation in the set of symbol constellations is associated with a different SNR;
 the symbol constellations within the group of symbol constellations are eight point symbol constellations; and
 each symbol constellation in the plurality of constellations that comprise constellation points that have a shared amplitude value and are unevenly spaced with respect to phase is associated with an SNR less than 8.4 dB.

112. The communication system of claim 107, wherein:
 each symbol constellation in the set of symbol constellations is associated with a different SNR; and
 at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

113. The communication system of claim 107, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

114. The communication system of claim 107, wherein each symbol constellation in the set of symbol constellations is a multi-dimensional symbol constellation having multiple degrees of freedom.

115. The communication system of claim 107, wherein:
the receiver determines the specific symbol and the specific code rate from a plurality of predetermined LDPC code rate and symbol constellation pairs based at least in part on the quality measure;
each symbol constellation in the plurality of symbol constellations that comprise constellation points that have a shared amplitude value and are unevenly spaced with respect to phase is only included in one of the plurality of predetermined LDPC code rate and symbol constellation pairs; and
the receiver sends a request to a remote transmitter to use a selected LDPC code rate and symbol constellation pair.

116. The communication system of claim 107, wherein the receiver can substitute the set of symbol constellations by an upgrade to at least one of the receiver software and firmware.

117. The communication system of claim 107, further comprising a transmitter that transmits signals via the communication channel, where the transmitter comprises:
a coder that receives bits and outputs encoded bits using a Low Density Parity Check (LDPC) code;
a mapper that maps the encoded bits to symbols in the selected symbol constellation; and
a modulator that outputs a signal for transmission via the communication channel based upon symbols selected by the mapper;
wherein the mapper is interposed between the modulator and the coder and the mapper receives information from the coder and provides information to the modulator.

118. The communication system of claim 107, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

119. The communication system of claim 107, wherein the likelihoods determined by the demapper are bit likelihoods.

120. The communication system of claim 107, wherein the likelihoods determined by the demapper are symbol likelihoods.

121. A communication system, comprising:
a receiver that receives signals via a communication channel having a channel signal-to-noise ratio (SNR), wherein the receiver uses a symbol constellation selected from a set of symbol constellations to transform the received signals into received bits based upon a low density parity check (LDPC) code having a code rate;
wherein each symbol constellation in the set of symbol constellations is utilized in combination with an associated code rate;
wherein the set of symbol constellations comprises a group of symbol constellations, where each symbol constellation in the group of symbol constellations has the same number of constellation points that have amplitude and phase values;
wherein the group of symbol constellations includes:
a symbol constellation in which constellation points that share an amplitude value are evenly spaced with respect to phase; and
a plurality of symbol constellations, where:
each of the associated code rates utilized in combination with each of the symbol constellations in the plurality of symbol constellations is different from the associated code rate utilized by any other symbol constellation in the plurality of symbol constellations; and
each symbol constellation in the plurality of symbol constellations comprises constellation points that have a shared amplitude value, where the constellation points that have the shared amplitude value are unevenly spaced with respect to phase; and
wherein the receiver is capable of sending a request to modulate the signals received via the communication channel using a specific symbol constellation from the set of symbol constellations and a specific code rate, where the specific symbol constellation and the specific code rate are determined by the receiver based on a measure of a quality of the communication channel made by the receiver.

122. The communication system of claim 121, wherein:
each symbol constellation in the set of symbol constellations is associated with a different SNR;
the symbol constellations within the group of symbol constellations contain sixteen constellation points; and
each symbol constellation in the plurality of symbol constellations that comprise constellation points that have a shared amplitude value and are unevenly spaced with respect to phase is associated with an SNR less than 14.8 dB.

123. The communication system of claim 121, wherein:
each symbol constellation in the set of symbol constellations is associated with a different SNR;
the symbol constellations within the group of symbol constellations are thirty-two point symbol constellations;
each symbol constellation in the plurality of symbol constellations that comprise constellation points that have a shared amplitude value and are unevenly spaced with respect to phase is associated with an SNR less than 20.4 dB.

124. The communication system of claim 123, wherein the set of symbol constellations further comprises at least one eight point symbol constellation, where
the at least one eight point symbol constellation comprises constellation points that have a shared amplitude value and the constellation points that have
the shared amplitude value are unevenly spaced with respect to phase; and the at least one eight point symbol constellation is associated with an SNR less than 8.4 dB.

125. The communication system of claim 121, wherein:
each symbol constellation in the set of symbol constellations is associated with a different SNR;
the symbol constellations within the group of symbol constellations are eight point symbol constellations; and
each symbol constellation in the plurality of constellations that comprise constellation points that have a shared amplitude value and are unevenly spaced with respect to phase is associated with an SNR less than 8.4 dB.

126. The communication system of claim 121, wherein:
each symbol constellation in the set of symbol constellations is associated with a different SNR; and
at least one symbol constellation from the plurality of symbol constellations that comprise constellation points that have a shared amplitude value and are unevenly spaced with respect to phase is characterized by the assignment of labels and spacing of constellation points such that the at least one symbol constellation is capable of providing greater parallel decoding capacity when operated at its associated SNR than any of the other symbol constellations in the plurality of symbol constellations when operated at the same SNR.

127. The communication system of claim 121, wherein at least one symbol constellation from the plurality of symbol constellations that comprise constellation points that have a shared amplitude value and are unevenly spaced with respect to phase is characterized by the assignment of labels and spacing of constellation points so as to maximize parallel decoding capacity at a specific SNR subject to at least one constraint.

128. The communication system of claim 121, wherein each symbol constellation in the set of symbol constellations is a multi-dimensional symbol constellation having multiple degrees of freedom.

129. The communication system of claim 121, wherein:
the receiver determines the specific symbol constellation and the specific code rate from a plurality of predetermined LDPC code rate and symbol constellation pairs based at least in part on the quality measure;
each symbol constellation in the plurality of symbol constellations that comprise constellation points that have a shared amplitude value and are unevenly spaced with respect to phase is only included in one of the plurality of predetermined LDPC code rate and symbol constellation pairs; and
the receiver sends a request to a remote transmitter to use a selected LDPC code rate and symbol constellation pair.

130. The communication system of claim 121, wherein the receiver can substitute the set of symbol constellations by an upgrade to at least one of the receiver software and firmware.

131. The communication system of claim 121, further comprising a transmitter that transmits signals via the communication channel, where the transmitter uses the selected symbol constellation to transform encoded bits into the transmitted signals.

132. The communication system of claim 121, wherein the plurality of symbol constellations that each comprise constellation points that have a shared amplitude value and are unevenly spaced with respect to phase are symbol constellations having constellation points that are non-uniformly spaced in each degree of freedom available to the symbol constellation.

133. The communication system of claim 121, wherein the likelihoods determined by the demapper are bit likelihoods.

134. The communication system of claim 121, wherein the likelihoods determined by the demapper are symbol likelihoods.

* * * * *